United States Patent [19]
Hieda et al.

[11] Patent Number: 5,508,541
[45] Date of Patent: Apr. 16, 1996

[54] RANDOM ACCESS MEMORY DEVICE WITH TRENCH-TYPE ONE-TRANSISTOR MEMORY CELL STRUCTURE

[75] Inventors: Katsuhiko Hieda, Wappingers Falls, N.Y.; Masami Aoki, Yokohama; Takeshi Hamamoto, Kanagawa, both of Japan

[73] Assignee: Kabushiki Kaisha Toshiba, Kawasaki, Japan

[21] Appl. No.: 124,300

[22] Filed: Sep. 20, 1993

[30] Foreign Application Priority Data

| Sep. 22, 1992 | [JP] | Japan | 4-278110 |
| Sep. 30, 1992 | [JP] | Japan | 4-286684 |
| Jan. 13, 1993 | [JP] | Japan | 5-003931 |
| Aug. 13, 1993 | [JP] | Japan | 5-201554 |

[51] Int. Cl.[6] .................................. H01L 27/108
[52] U.S. Cl. .................. 257/301; 257/304; 257/332; 257/402
[58] Field of Search .................. 257/304, 301, 257/402, 332, 303

[56] References Cited

U.S. PATENT DOCUMENTS

| 4,649,625 | 3/1987 | Lu | 257/301 |
| 4,688,063 | 8/1987 | Lu et al. | 257/304 |
| 4,786,954 | 11/1988 | Morie et al. | 257/304 |
| 4,803,535 | 2/1989 | Taguchi | 257/301 |
| 4,855,953 | 8/1989 | Tsukamoto et al. | 365/149 |
| 5,065,273 | 11/1991 | Rajeevakumar | 257/301 |
| 5,118,633 | 6/1992 | Sagara et al. | 437/31 |
| 5,264,716 | 11/1993 | Kenney | 257/304 |

FOREIGN PATENT DOCUMENTS

| 54-146584 | 11/1979 | Japan | 257/332 |
| 56-83973 | 7/1981 | Japan | 257/402 |
| 62-35668 | 2/1987 | Japan | 257/301 |
| 1-243588 | 9/1989 | Japan | 257/301 |
| 3-69092 | 3/1991 | Japan . | |

OTHER PUBLICATIONS

"Method of Fabricating a New Merged Stacked Trench Capacitor Memory Cell Structure," Dec. 1991, IBM Technical Disclosure Bulletin vol. 34 No. 7B, pp. 472–476.
"Defect–Free Isolation Process for Substrate Plate Trench Dynamic Random Access Memory Cells," Dec. 1992, IBM Technical Disclosure Bulletin vol. 35, No. 7, pp. 454–456.
IEDM 85, Buried Storage Electrode (BSE) Cell for Megabit Drams, pp. 710–713 M. Sakamoto, et al.
ISSCC 91, A Block–Oriented RAM with Half–Sized DRAM Cell and Quasi–Folded Date–Line Architecture, pp. 106–107 and 297, Katsutaka Kimura, et al.
IEDM 87, Double Stacked Capacitor with Self–Aligned Poly Source/Drain Transistor (DSP) Cell for Megabit Dram, K. Tsukamoto, et al., Dec. 1987.
IEDM 88, A Buried–Trench DRAM Cell Using A Self––Aligned Epitaxy Over Trench Technology, N. C. C. Lu, et al., Dec. 1988.

*Primary Examiner*—Sara W. Crane
*Assistant Examiner*—Courtney A. Bowers
*Attorney, Agent, or Firm*—Limbach & Limbach

[57] ABSTRACT

A MOS random access memory device includes a semiconductor substrate having a trench formed therein, and an array of memory cells on the substrate. Each of the memory cells includes a 1-bit data-storage capacitor and a transfer-gate MOS transistor. The capacitor includes an insulated layer buried in the trench, which serves as a storage node. An island-shaped semiconductor layer covers the storage-node layer at least partially on the substrate, and is coupled thereto. The transistor has a source and a drain defining a channel region therebetween in the substrate, and an insulated gate overlying the channel region. One of the source and drain is directly coupled to the island-shaped layer, while the other of them is contacted with a corresponding data-transfer line (bit line) associated therewith.

24 Claims, 37 Drawing Sheets

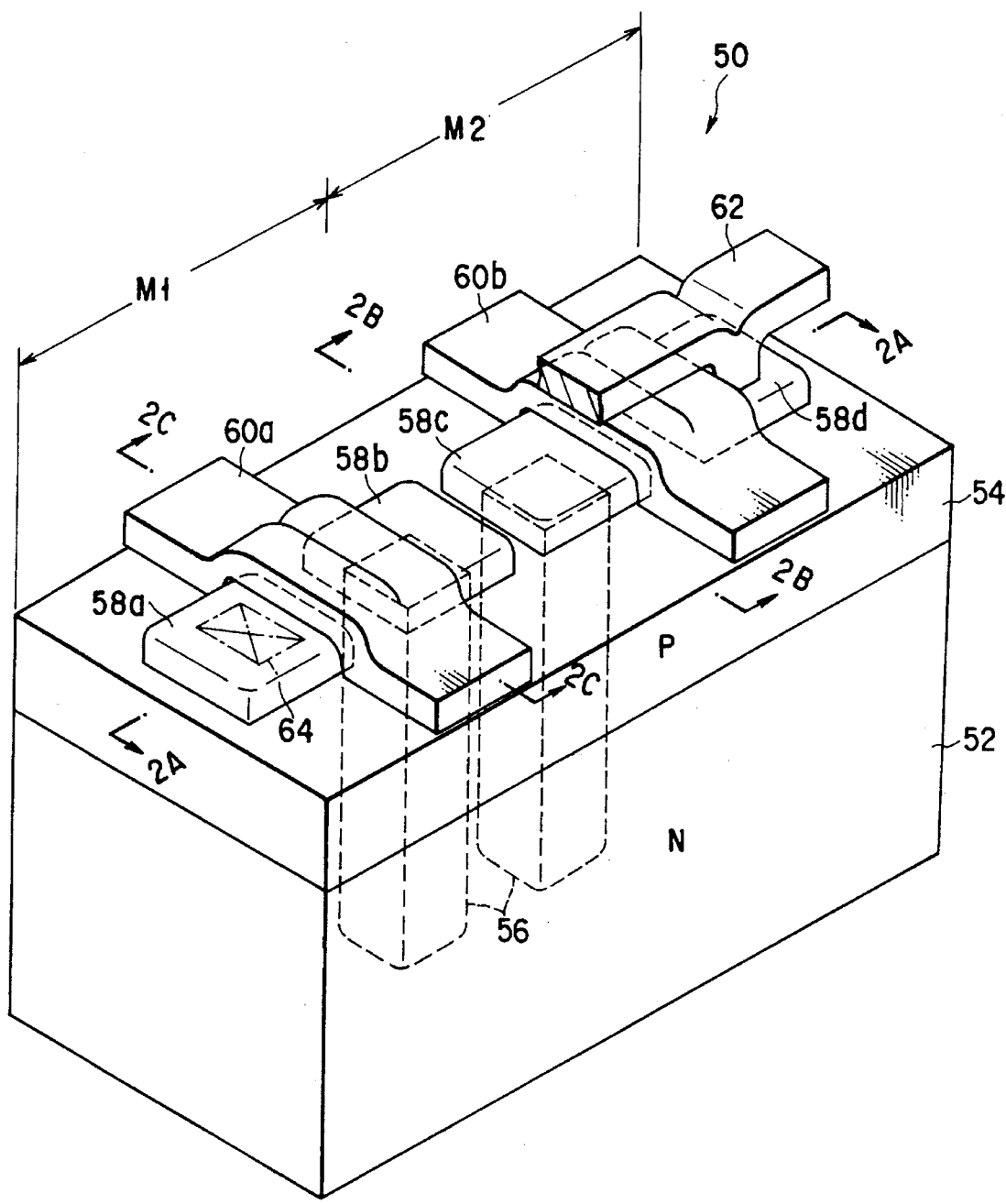
F I G. 1

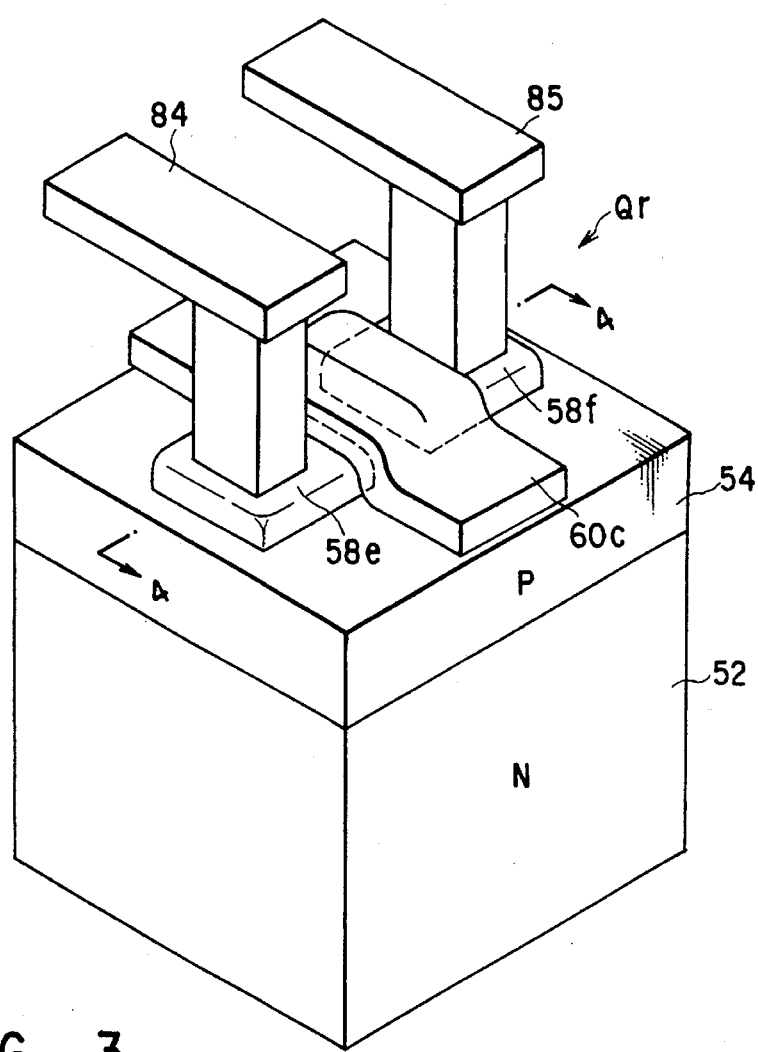
F I G. 3
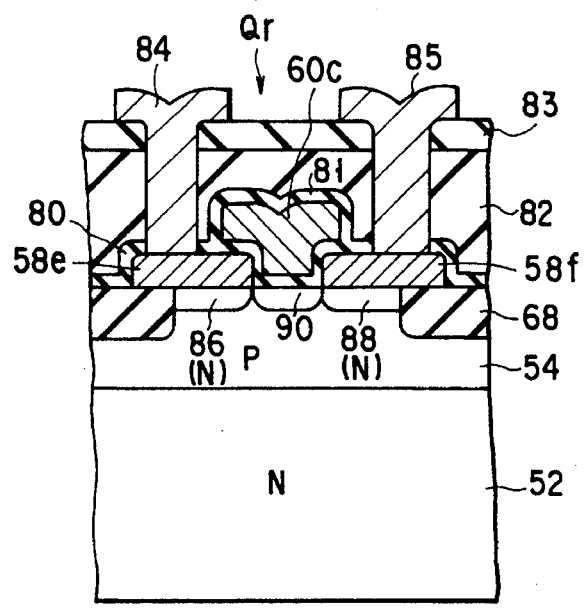
F I G. 4

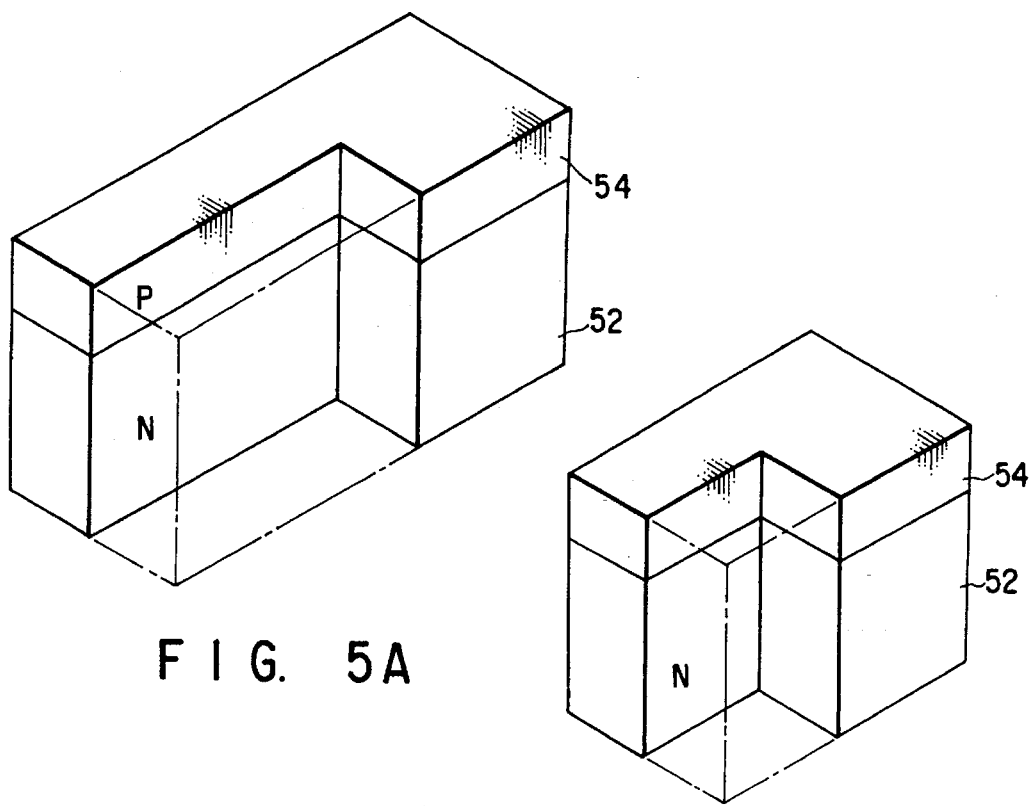
FIG. 5A
FIG. 6A
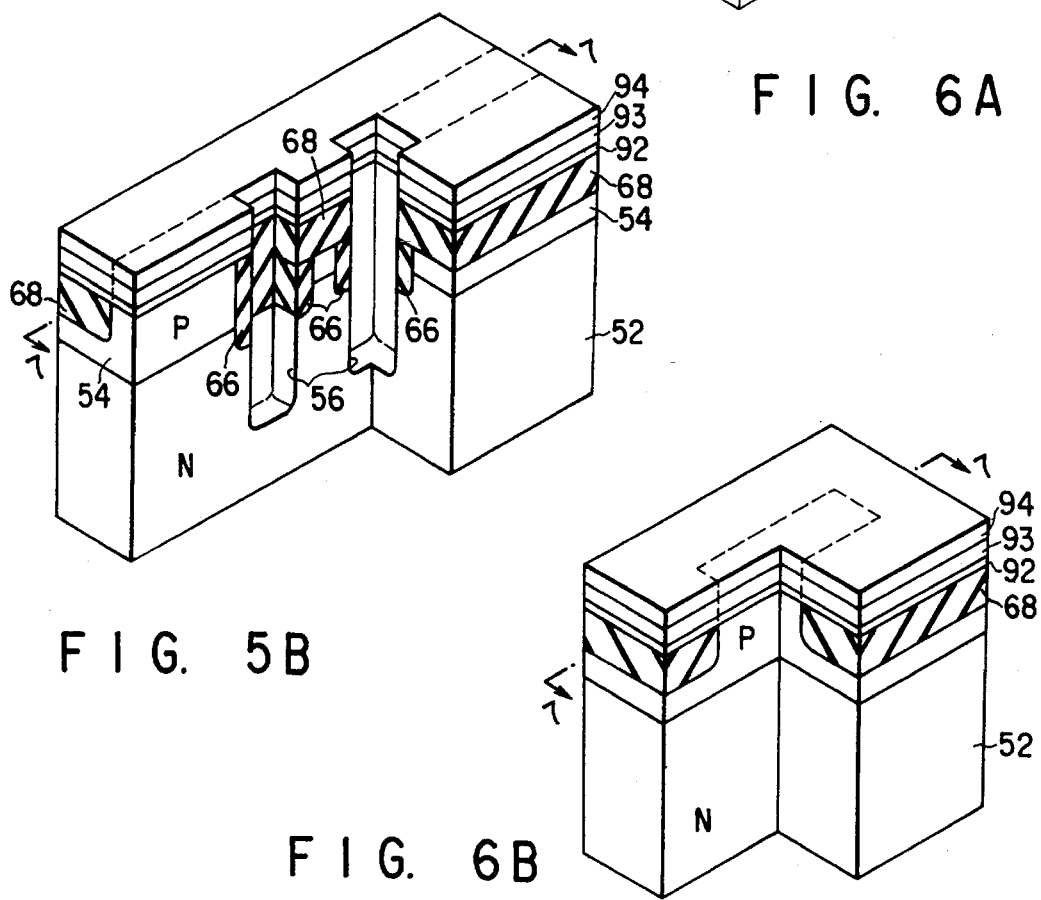
FIG. 5B
FIG. 6B

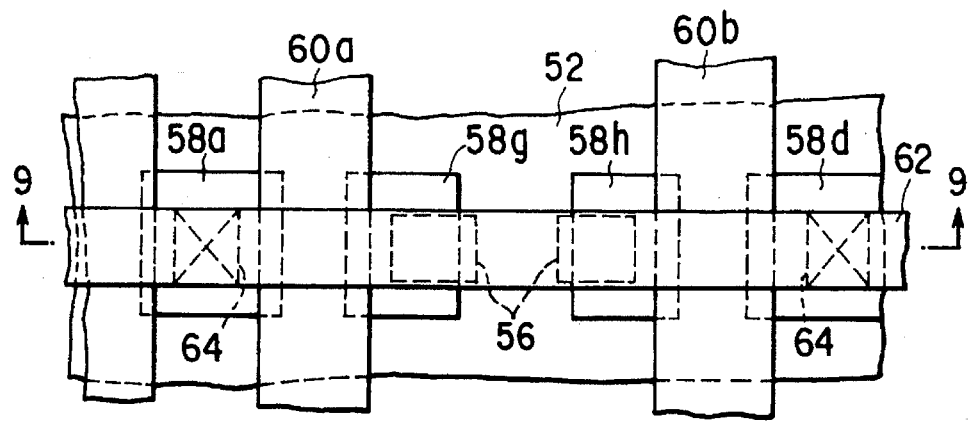
F I G. 8
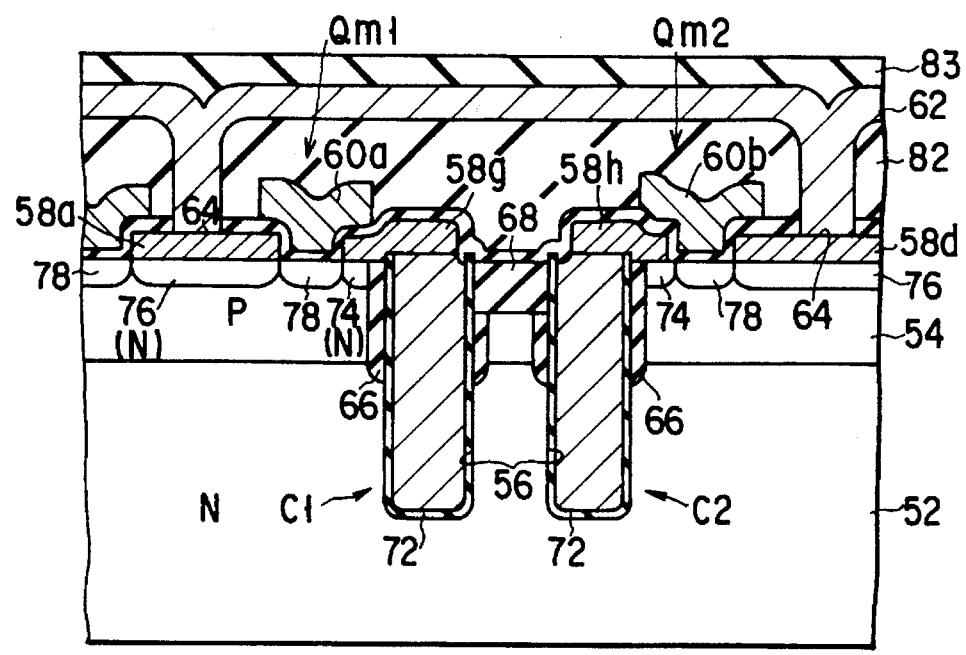
F I G. 9

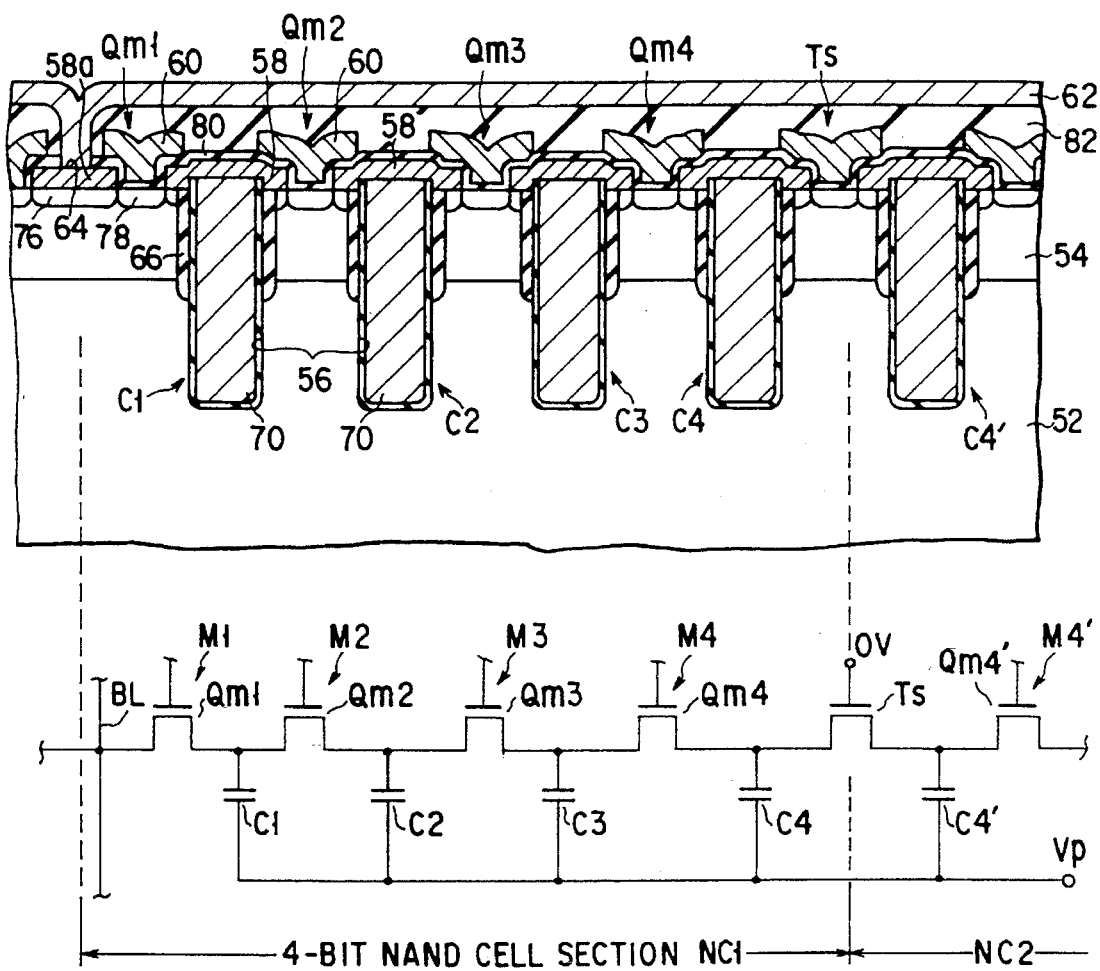
F I G. 21

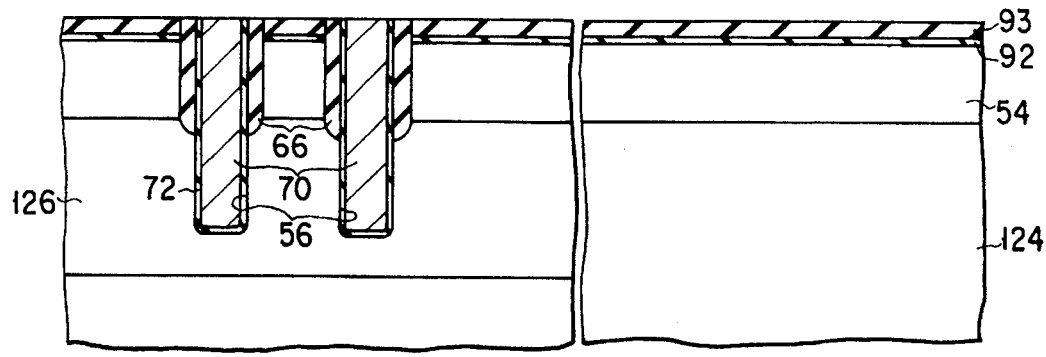
F I G. 28B
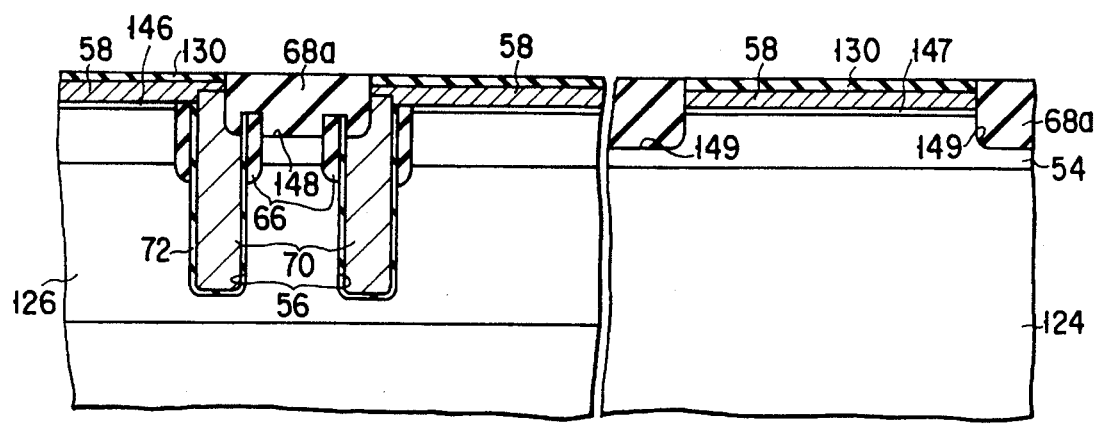
F I G. 28C
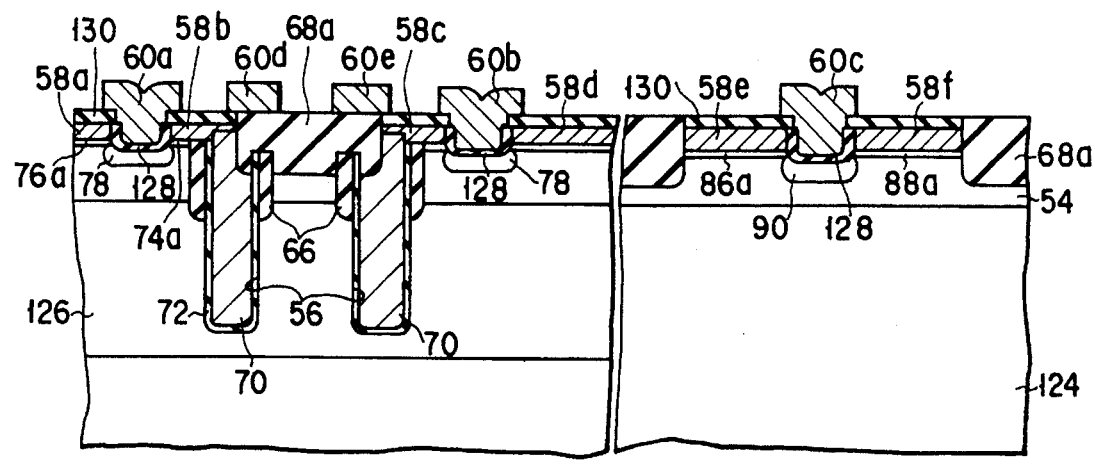
F I G. 28D

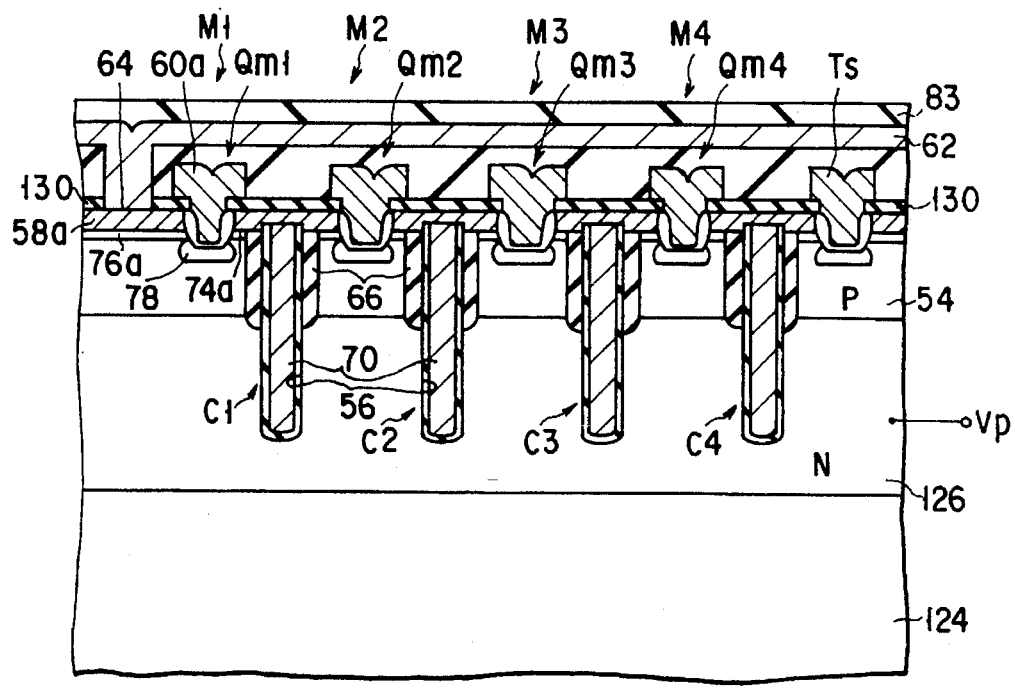
F I G. 29
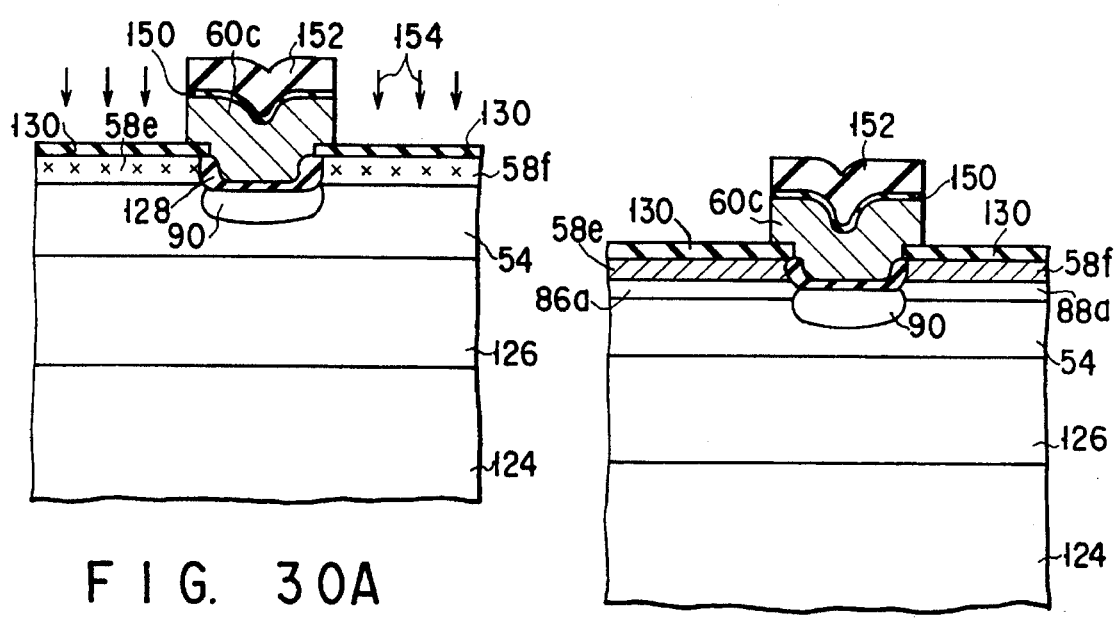
F I G. 30A
F I G. 30B

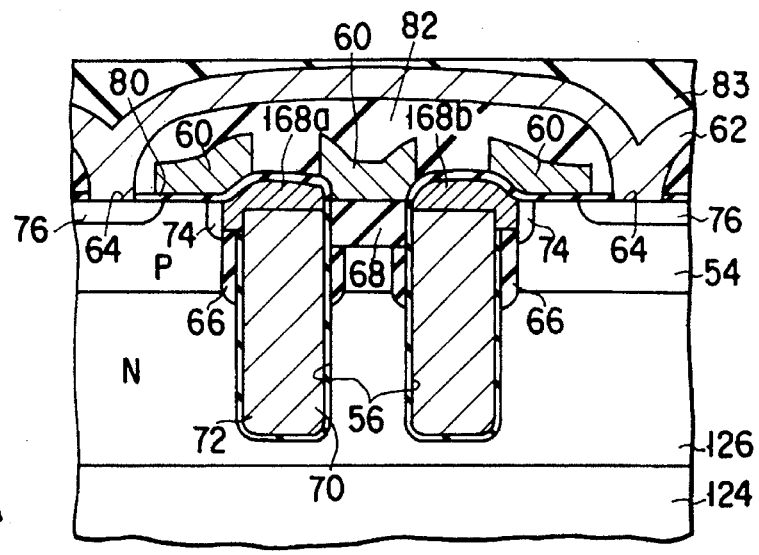
F I G. 34A
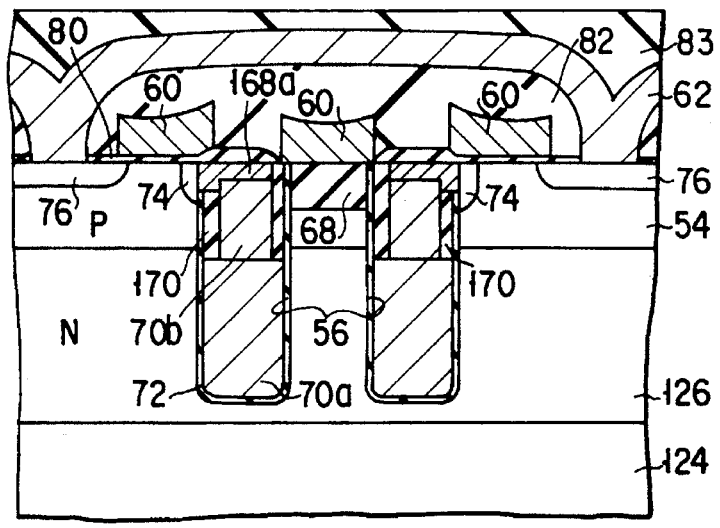
F I G. 34B
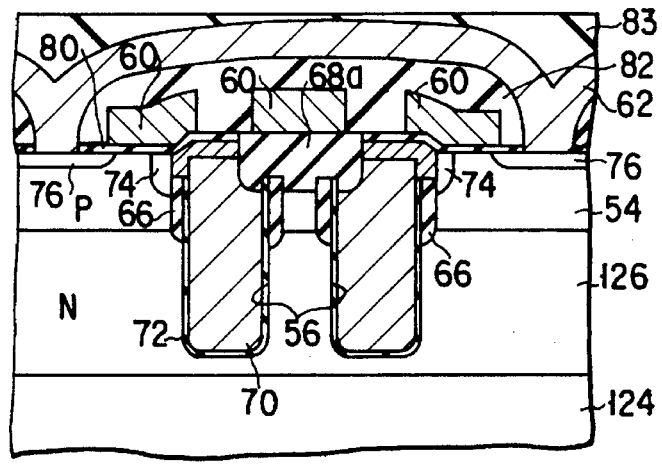
F I G. 34C

RANDOM ACCESS MEMORY DEVICE WITH TRENCH-TYPE ONE-TRANSISTOR MEMORY CELL STRUCTURE

BACKGROUND OF THE INVENTION

1. Field of the Invention

The present invention relates generally to semiconductor memory devices, and more particularly to dynamic random access memory (DRAM) devices of the type employing one-transistor memory cells. The invention also relates to NAND type DRAM devices including in each cell section a plurality of series-connected one-transistor memory cells associate with a corresponding bit line.

2. Description of the Related Art

Dynamic random access memory (DRAM) devices become more widely used in the manufacture of digital equipments, such as small-size computers, as the speed and cost advantages of the devices are further enhanced. The cost for each bit using DRAMs has gone down as the number of bits or memory cells per package goes up. As the number of bits increases, the cell size decreases, the magnitude of the storage capacitor in each cell of necessity decreases. This factor may reduce the reliability of data storage in each of DRAM devices, which are strongly demanded to attain a higher packing density on a chip substrate of limited size.

In recent years, in order to satisfy the "higher integration-density" requirements, what is called the "trench-type" DRAM devices have been proposed by some leading semiconductor manufacturers. One of the highly advanced trench-type DRAM devices typically includes a plurality of rectangular prism-shaped grooves (called "trenches") that are formed in the top surface of a semiconductor substrate. Each of the trenches permits the formation of a capacitive element (capacitor) for data storage included in one of a plurality of rows and columns of memory cells in such a manner that an individual capacitor electrode of each element is insulatively buried in a corresponding one of the trenches while it faces the inner wall of the trench to provide a preset storage capacitance Cs. The capacitor electrode is referred to as a "storage node" in the art of semiconductor memory devices. The substrate is coupled to a plate voltage Vp and functions as the other capacitor electrode that is commonly used for all of the capacitors, that is, a common electrode.

With such a "trench-type cell" structure, it may be possible to attain a maximally increased storage capacitance Cs within a narrow one-cell area on the substrate. However, when an attempt is made to cope with a further improved integration density in recent years, even such a trench-cell structure suffers from the following problems: the difficulty in formation of the trench, and the degradation in the charge-storage reliability of metal oxide semiconductor (MOS) transistors.

Regarding the difficulty in formation of the trench, the trench must be formed more deeply to attain a desired storage capacitance Cs if the trench cell is further miniaturized in size (particularly, opening area) with the further improvement of the integration density of DRAM devices. As the trench is formed more narrowly and deeply, the manufacturing process for the trench becomes more difficult, thereby lowering the yield of production.

Regarding the degradation of reliability, as the memory size decreases, a MOS transistor contained in each cell and acting as a data-transfer gate is miniaturized, thus causing the channel region to decrease in length. The channel length reduction gives bad influences such as generation of punch-through in the MOS transistor and reduction in the threshold voltage Vth. Such phenomenon is known as the "short channel" effect in the semiconductor memory art. As a result, the cut-off characteristic of the MOS transistor is extremely deteriorated. Also, the operating reliability of DRAM devices is lowered.

Further, stress tends to occur in the semiconductor substrate. Occurrence of the stress makes it easier to generate a junction leak, which makes it difficult to hold charges on the cell capacitor for a long period of time. This is also a serious bar to the maintenance of an improved operation reliability of highly integrated DRAM devices.

SUMMARY OF THE INVENTION

It is therefore a principal object of this invention to provide a new and improved memory cell structure for semiconductor memory devices.

It is another object of the invention to provide a new and improved DRAM device which is of high reliability as well as high integration density.

In accordance with the above objects, the invention is drawn to a dynamic random access memory device having a specific memory cell structure. The device includes a semiconductor substrate having a trench formed therein. A capacitor is provided which includes a conductive storage node layer insulatively buried in the trench. An island-shaped semiconductor layer is lied on the substrate to at least partially cover the storage node layer and to be coupled thereto. A transistor is provided which has a source and a drain defining a channel region therebetween in the substrate, and an insulated gate overlying the channel region. One of the source and drain is adjacent to the trench, and is coupled to the island-shaped layer; the other of them is in contact with a corresponding data-transfer line (bit line) associated therewith. The one-transistor trench-type memory cell structure may also be used for a NAND type DRAM device, which includes a plurality of series-connected memory cells associated with a corresponding bit line.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a perspective view of the main part of a memory cell array section of a DRAM device in accordance with one preferred embodiment of the invention.

FIG. 3 is a perspective view of one of the transistors constituting a peripheral circuit arranged on the same substrate of the DRAM device shown in FIG. 1.

FIG. 4 is a cross-sectional view of the transistor of FIG. 3 along line 4—4 of the transistor of FIG. 3.

FIGS. 5A and 5B are perspective views with partly cut-away portion showing an intermediate product obtained in the manufacturing step of the DRAM of FIG. 1; and FIGS. 6A and 6B are perspective views with partly cut-away portion showing an intermediate product obtained in a corresponding manufacturing step of the peripheral transistor structure of FIGS. 3 and 4.

FIG. 8 is a plan view of the main part of a DRAM device in accordance with another embodiment of the invention, and FIG. 9 shows the cross-sectional structure cut along line 9—9 of FIG. 8.

FIGS. 21–23 show the cross-sectional views of NAND type DRAM devices in accordance with the invention together with their equivalent circuit configurations.

FIGS. 28A–28D illustrate, in schematic cross-section, some of major steps in the manufacturing process of the DRAM shown in FIGS. 24–27.

FIG. 29 shows a NAND-cell type DRAM device employing the trench-cell structure of FIGS. 25A–25C with respect to each of a plurality of series-connected memory cells constituting a NAND cell section.

FIGS. 30A and 30B illustrate, in schematic cross-section, two of major steps in the DRAM-manufacturing process in accordance with another embodiment of the invention.

FIGS. 31 and 32A, 32B and 32C show a NAND type DRAM device also embodying this invention, wherein FIG. 31 is a partial plan view of the DRAM, and FIGS. 32A–32C are three different cross-sectional views of the DRAM along lines 32A—32A, 32B—32B and 32C—32C, respectively.

FIGS. 34A–34C each shows in cross-section DRAM devices as modifications of the NAND DRAM device.

DETAILED DESCRIPTION OF THE PREFERRED EMBODIMENTS

Figure 2A:
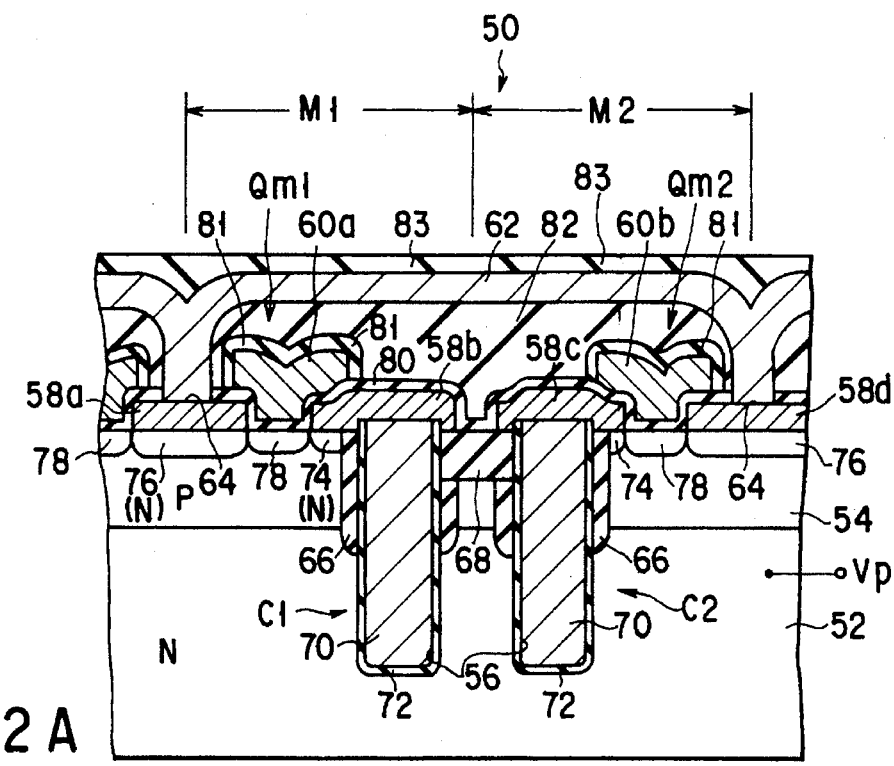
FIGS. 2A, 2B and 2C are fragmentary cross-sectional views of the memory device shown in FIG. 1 along three different lines 2A—2A, 2B—2B and 2C—2C, respectively.

Referring to FIG. 1, a dynamic random access memory (DRAM) device embodying the invention is generally designated by the numeral 50. FIG. 1 shows the main part of the DRAM device 10, that is, two adjacent memory cells M1, M2 in an array of rows and columns of 1-bit memory cells. In this figure, a plurality of intermediate dielectric layers or films provided between stacked different layers are omitted for purposes of illustration only.

The DRAM 50 has a semiconductor substrate 52 of a selected conductivity type. The substrate may be made from silicon of n-type conductivity. Substrate 52 has a top surface in which a p-type well region 54 is formed as shown in FIG. 1. Substrate 52 has a plurality of vertical grooves 56 defined in the selected surface positions. The grooves are called "trenches." Each of trenches 56 has a narrow rectangular prism form which penetrates p-type well region 54 and terminates in substrate 52.

A plurality of patterned island-like semiconductor layers 58 are disposed on the top surface of the substrate 52, only four (58a–58d) of which are visible in FIG. 1. These layers 58 may be polycrystalline silicon (polysilicon) layers. Layers 58a and 58b belong to another memory cell adjacent thereto, whereas layers 58c and 58d belong to an adjacent memory cell. The two intermediate layers 58b, 58c overlie respective trenches 56.

A plurality of parallel elongate conductive layers 60 are insulatively disposed above the substrate 52 in such a manner that they extend above island layers 58 along a first direction on substrate 52. Layers 60 may be made from polycrystalline (polysilicon) silicon. Layers 60 include a layer 60a that overlies the island layers 58a, 58b in one cell area, and another layer 60b overlying islands 58c, 58d in another cell area. Each layer 60 rides on two adjacent island layers 58a, 58b (58c, 58d) at the side portions thereof.

A plurality of parallel elongate conductive layers 62 are insulatively disposed above the layers 60; only one of these layers 62 is visible in FIG. 1, which may be made from polycide or metal such as W. This layer 62 extends in a second direction transverse to the first direction (that is, parallel to the array of island layers 58a–58d) so that the layers 58a, 58d of the four island layers 58a–58d which exclude those covering the trenches 56 may be electrically connected to each other by means of layer 60 at their contact areas 64 on the top surfaces thereof.

Figure 2B:
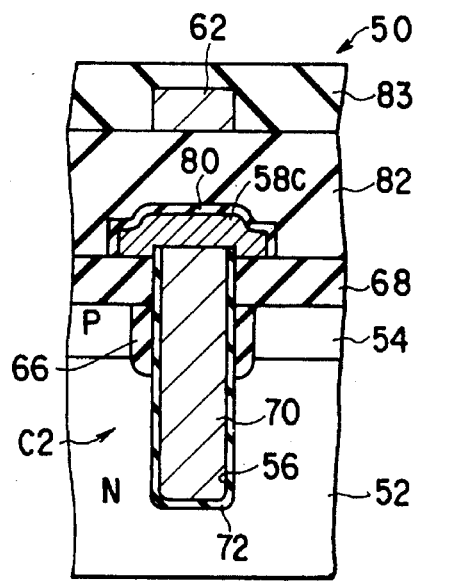
Figure 2C:
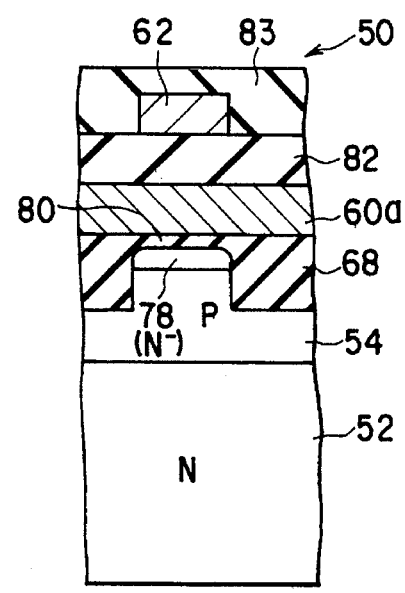

The detail of the memory cell structure of FIG. 1 will be apparent by referring to the fragmentary cross-sectional views of FIGS. 2A–2C, which respectively show the profiles in three different cross sections on the structure of FIG. 1 (not drawn to scale). The longitudinal profile of the structure along a line 2A—2A of FIG. 1 is shown in FIG. 2A. The first lateral profile of it along a line 2B—2B of FIG. 1 is shown in FIG. 2B, and the second lateral profile of the FIG. 1 structure along a line 2C—2C is shown in FIG. 2C.

As shown in FIG. 2A, the trenches 56 are deep enough to penetrate the p-type well region 54. The bottom portion of trench 56 terminates at a previously specified portion in substrate 52. The upper side-wall portion of each trench 56 is surrounded by an insulating film 66, which may be made from silicon oxide. All oxide films 66 are formed deeper than the well region 54. Each oxide film 66 suppresses or prevents the generation of a leak current in the side wall of a corresponding trench 56. In a case where trench 56 is 6 micrometers in depth and 0.5 micrometers in width, the oxide film 66 may measure approximately 2 micrometers in height and approximately 50 nanometers (nm) in thickness. A field insulating layer 68 is arranged between adjacent trenches 56 to electrically isolate the trenches from each other. Assume that the selected upper regions of the opposite side surfaces of trenches 56 are replaced with the field insulating layer 68. Alternatively, it may be imagined that the upper regions of the trenches overlap field insulating layer 68. In either case, field insulating layer 68 is directly connected to the opposite side surfaces of the adjacent trenches 56 at two ends thereof.

An arsenic (As) impurity-doped polycrystalline silicon (polysilicon) layer 70 is insulatively buried in each of the trenches 56. The buried layer 70 is electrically isolated from the internal surface of the trench by an insulating thin film 72. Each of the buried layers 70 is slightly projected upwardly from the substrate surface (that is, the surface of the p-well region 54) together with the insulating thin-film 72. Thin-film 72 may be an NO film. A resultant capacitor structure C (C1 or C2) uses the substrate 52 as a plate electrode which is common for cell capacitors and uses the buried layer 70 in the trench 56 as an individual 1-bit storage electrode, that is, "storage node." A plate voltage Vp is applied to substrate 52.

As is apparent from FIG. 2A, the two intermediate square island layers 58b, 58c of FIG. 1 cover the top portions of the storage nodes 70 of corresponding trenches 56. The remaining square island layers 58a, 58d are arranged on the well region 54.

In one of the two trenches 56, an n-type impurity-doped layer 74 is formed in the well region 54 to underlie the island-like layer 58b and to be set in contact with the oxide film 66. Another n-type impurity layer 76 is spaced apart from impurity layer 74 in well region 54. Layer 76 is disposed directly under the island-like layer 58a and made in contact with this layer 58a. Layer 76 is less in impurity concentration than island-like layers 58. In the well region 54, a boron (B)-doped p-type layer 78 is formed between the two spaced-apart n-type layers 74 and 76. The arrangement of layers 74, 76 and 78 is the same as that of the layers for the other of the above two trenches.

An insulating thin-film 80 covers the island-like layers 58. This thin film has rectangular openings in the top portions of the island-like layers 58a, 58d. Each of the openings corresponds to the contact area 64 shown in FIG. 1. The insulating thin-film 80 may be made from silicon dioxide ($SiO_2$). As shown in FIG. 2A, the elongate layers 60a, 60b of FIG. 1 are formed on thin film 80 in such a manner that layer 60a overlies the boron-doped layer 78 and also overlies the side portions of the adjacent island-like layers 58a, 58b; the other layer 60b overlies the side portions of the adjacent island-like layers 58c, 58d. As shown in FIG. 2A, the profile along the line 2A—2A in each of the elongate layers 60a, 60b exhibits a "Y-shaped" cross section. Note that, while the gate profile is illustrated in the "Y"-like shape as shown in FIG. 2A, it will be possible that the gate profile becomes similar to a "T"-shape rather than the "Y"-shape if a central concaved portion in the cross section becomes smaller depending upon the actual positional relation between adjacent island layers 58; however, the terminology "Y-shaped" will be employed throughout the rest of the description. Each of the Y-shaped layers 60a, 60b is covered with a $SiO_2$ film 81.

In the left-side one of the two trenches 56 shown in FIG. 2A, a memory-cell transfer-gate MOS transistor Qm1 (the suffix "m" stands for memory cell) uses the Y-shaped layer 60a as a gate electrode, the spaced-apart n-type diffusions 74, 76 as source and drain regions, and the p-type layer 78 therebetween as an n-type channel region. Also, in the right-side trench of FIG. 2A, a cell structure Qm2 with the same structure is formed. Each of the transistors Qm1, Qm2 is connected to a corresponding trench-cell capacitor C1, C2 in the n-type source (or drain) region 74.

A thick insulating layer 82 entirely covers the Y-shaped gate electrodes 60a, 60b and square island layers 58. Layer 82 has openings corresponding to the contact areas 64 of FIG. 1 at the positions of the island layers 58a, 58d. The elongate layer 62 of FIG. 1 transverse to the gate electrodes 60a, 60b extends on layer 82 and is connected to both of the island layers 58a, 58d through respective contact areas 64. Layer 62 functions as a data transfer line of the DRAM 50, that is, bit line. The bit line 62 is covered with another insulating layer 83. This layer 83 may be a boron-doped phosphosilicate glass (BPSG) film.

In the DRAM 50 with the above trench-cell structure, a transistor Qr, which is a typical one of transistors included in peripheral circuits (such as row and column decoder circuits, etc.) provided in the surface area of the substrate 52 other than the memory cell array section, is shown as a model structure in FIG. 3.

As shown in FIG. 3, the transistor Qr has a pair of square island-like layers 58e, 58f, which are formed on the n-type silicon substrate 52 having the p-type well region 54 in the same manner as those in the memory-cell section of FIG. 1. No trenches are formed in those portions of the substrate 52 which lie below the above layers. A gate electrode 60c is formed on the top surface of the substrate 52: Gate 60c is similar in structure to the gate electrodes 60a, 60b of FIG. 1. Gate 60c slightly rides on the side portions of the adjacent island layers 58e, 58f. Island layers 58e, 58f are respectively connected to conductive wiring layers 84, 85.

As shown in FIG. 4, spaced-apart n-type impurity-doped layers 86, 88 which are made in contact with the overlying island layers 58e, 58f are formed in the well region 54. A lightly doped n-type layer 90 acting as a channel region of the transistor Qr is formed therebetween. The channel region 90 is substantially self-aligned with the opposing side edges of island layers 86, 88. The insulating thin-film 80 of FIG. 2A covers the island layers 58e, 58f. In FIG. 4, the gate 60c has a Y-shaped profile. The thick insulating film 82 covers gate 60c while permitting the wiring layers 84, 85 to be electrically connected to island layers 58e, 58f.

The method of manufacturing the DRAM device 50 having the trench-cell structure shown in FIGS. 1–2C and the transistor structure of FIGS. 3–4 is as follows. First, see FIG. 5A that illustrates a portion of the substrate 52, wherein the memory cell section of FIGS. 1 and 2A–2C is to be completed. The illustration of FIG. 5A is partly cut away to reveal the internal structure. Substrate 52 is made from n-type silicon as described previously. A silicon layer is formed on the top surface of the substrate to a selected thickness of the well region 54 typically shown in FIG. 2A by using a known epitaxial growth technique. A chosen impurity is doped into the resultant epitaxial layer by the ordinary lithography and ion-implantation technique, and is thermally diffused therein to form a p-type well region 54 with a depth of approximately 1.5 micrometers. A portion of substrate 52 in which the peripheral transistor section of FIGS. 3 and 4 will be fabricated and which is obtained in the same manufacturing step of FIG. 5A is shown in FIG. 6A. It may be apparent by viewing FIGS. 5A and 6A that the well region 54 is formed in the memory cell section and the peripheral circuit section simultaneously. In the following description, the manufacturing process will be explained by referring to the memory cell section and peripheral circuit section.

Subsequently, in the memory cell section shown in FIG. 5B, a shallow groove with a depth of approximately 0.4 micrometers is formed in an element-isolation area of the substrate 52 by use of reactive ion etching (RIE) technique; an insulation film (TEOS-$SiO_2$ film) is deposited as the field insulating layer 68 of FIG. 2A in the groove by chemical vapor deposition (CVD) technique. The resultant structure is subjected to planarization such as etch-back using the RIE technique, thus providing field insulating film 68 having an "H" type plane pattern as suggested by broken lines in FIG. 5B. The above process is called a "trench isolation." A channel stopper may be formed if required. The trench isolation may also be attained by forming a $SiO_2$ film with a thickness of approximately 400 nanometers (nm) as field insulating film 68 by a local oxidation-of-silicon (LOCOS) method using a trisilicon tetranitride ($Si_3N_4$) film. During the process of forming film 68 in the memory cell section, the same field insulating film 68 is formed in the element isolation area (which is drawn to have a plane form of rectangular opening) of the transistor Qr in the peripheral circuit section of the substrate 52 as shown in FIG. 6B.

After the element forming area of the substrate 52 surrounded by the element isolation area is exposed to the atmosphere, a CVD-$SiO_2$ buffer layer 92, a $Si_3N_4$ film 93 and a $SiO_2$ film 94 are stacked sequentially in this order on the resultant substrate structure as shown in FIGS. 5B and 6B. Buffer layer 92 may be replaced with a thermal oxide film. The thicknesses of layers 92, 93 and 94 are approximately 10 nm, 100 nm and 300 nm, respectively. In FIGS. 5B and 6B, hatching for cross sections of the layers 92–94 is omitted for simplifying the drawing.

Then, the three stacked layers 92–94 are subjected to the selective etching process by the known photolithography and RIE technique to provide a mask layer, which defines square openings of the cell trenches 56 and is used for formation of the cell trenches 56. The mask layer is used to subject the underlying substrate 52 to the RIE process to form therein "temporary" trenches of approximately 2 micrometers in depth. After the inner walls of the trenches are subjected to the damage-recovery process, $SiO_2$ films 66 of approximately 50 nm in thickness are formed on the respective inner wall surfaces. Then, the RIE process is effected to selectively remove only the $SiO_2$ films 66 lying on the bottoms of the temporary trenches. The mask layer and the $SiO_2$ films 66 on the trench side-wall are used as a mask to perform the RIE process again so as to complete the cell trenches 56 with larger depth (for example, 3 micrometers in depth) as shown in FIG. 5B. The inner wall surfaces of the resultant trenches 56 will be "rough" in the crystal property by execution of the RIE process; in order to compensate for this, it is recommendable to carry out the physical and/or chemical surface treatment for cleaning the trench inner-wall surfaces. The above post-treatment may include (1) a process of using a cleaning liquid containing alkali liquid, etching the trench inner wall and subjecting the same to the heat treatment to remove the remaining oxide film, or (2) a process of effecting the annealing process at high temperature in an nitrogen atmosphere of 900° C., for example, to recover the crystal property. During the process, the transistor structure in the peripheral circuit section is kept unchanged as shown in FIG. 6B.

The succeeding manufacturing process of the DRAM 50 will be explained with reference to FIGS. 7A–7F. Note that FIG. 7A shows a portion obtained by combining the cross sectional view of the FIG. 5B structure taken along a line 7—7 on the left portion with the cross sectional view of the FIG. 6B structure taken along line 7—7 on the right portion, for the sake of facilitating the understanding of the manufacturing process of the memory cell section of FIG. 5B and the peripheral circuit section of FIG. 6B.

Figure 7A:
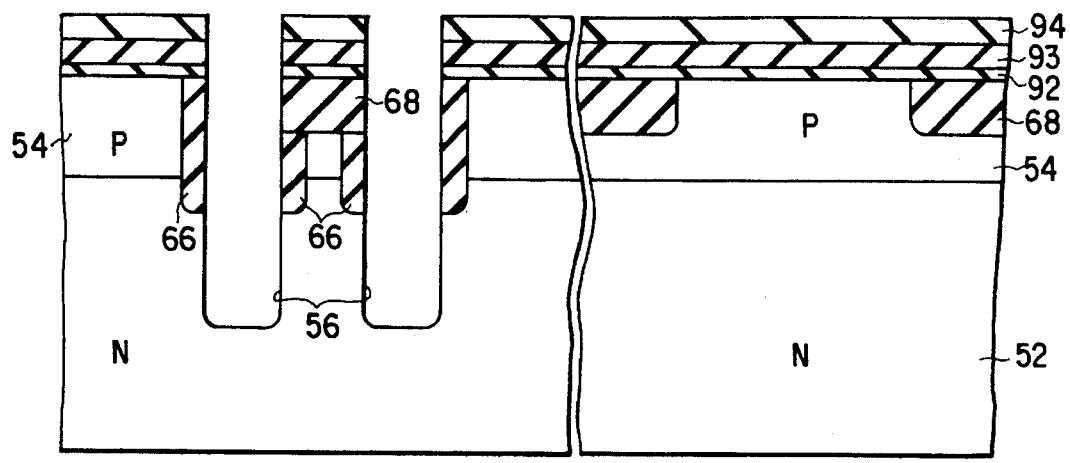
FIGS. 7A–7F illustrate, in schematic cross-section, some of major steps in the manufacturing process of the DRAM, wherein each of FIGS. 7A–7F is modified to show a portion obtained by combining the cross section of the memory cell transistor structure section of FIG. 5B taken along the line 7—7 on the left portion with the cross section of the peripheral transistor structure section of FIG. 6B taken along the line 7—7 on the right portion for purposes of illustration only.
Figure 7B:
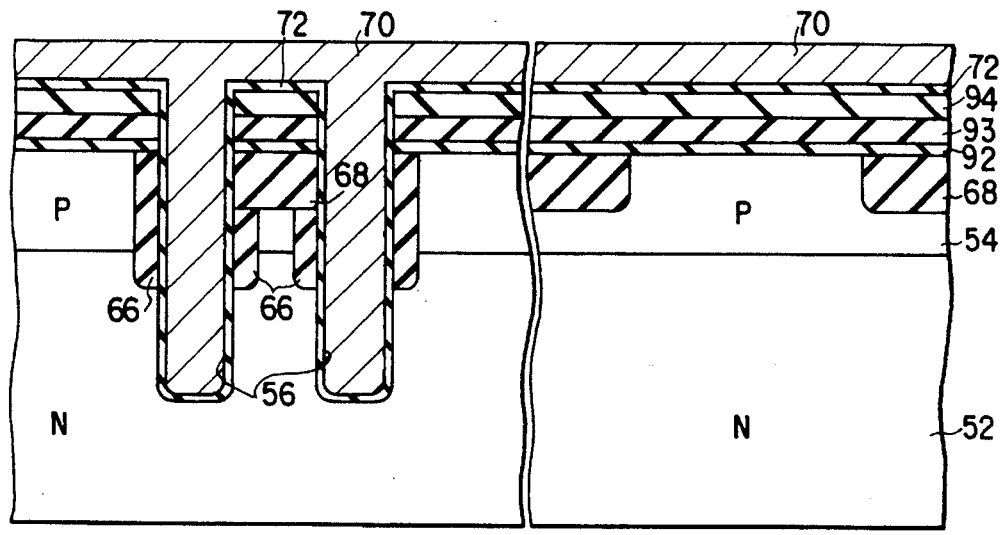
Figure 7C:
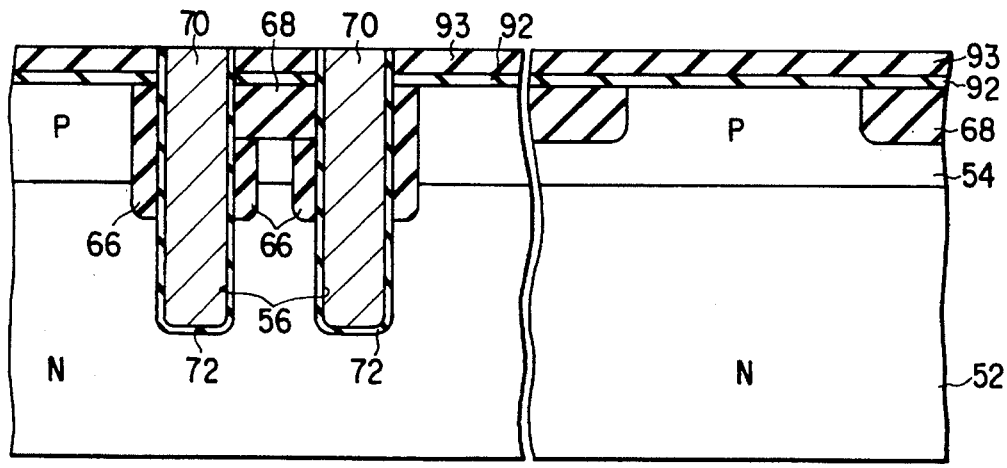

A capacitor insulation film 72 is formed on the entire surface of the structure of FIG. 7A. Film 72 is an NO film as described above; as far as the film can withstand the succeeding heat treatments, it may be a film of ferroelectric material such as a $Ta_2O_5$ film or a film of a mixture of NO material and ferroelectric material. As shown in FIG. 7B, an As-doped polysilicon layer 70 is deposited on film 72. Layer 70 may alternatively be an amorphous silicon layer. The chemical/mechanical polishing process is effected to polish the entire surface of the resultant structure so that layers 70, 72, 94 are polished in this order. As shown in FIG. 7C, polishing of these layers is suitably controlled to stop at the layer 93 in the substrate 52. Layer 93 functions as a polishing stopper. To do this, the polishing conditions (such as polishing material, load, etc.) are adequately selected so as to set the selective etching (polishing) ratio between a desired $Si_3N_4$ film and a $SiO_2$ film.

Note that, in case where the capacitor insulation film 72 is NO film, a naturally deposited oxide film on the surface of the substrate 52 is removed by chemically reducing the film by use of either a solution of hydrofluoric acid deluted with water or silane gas $SiH_4$. In the case of silane gas, after the natural oxide film in the capacitor formation area of the trench inner wall is removed, a $Si_3N_4$ film is formed on the exposed silicon surface to a thickness of approximately 1 nm, while ammonia gas ($NH_3$) is allowed to flow in the atmosphere of vacuum at high temperature (approx. 850° C.). Thereafter, a $Si_3N_4$ film is deposited by the CVD method to a predetermined thickness (50 nm, for example) on the entire surface. A resulting structure is subjected to the oxidation process for approximately 60 minutes in an atmosphere containing 10% of hydrochloric acid (HCl) at the temperature of approximately 800° C., for example, and as a result, a so-called "top oxide" film is formed with a thickness of 2 nm on the surface thereof. At this time, an NO film 72 which is a capacitor insulating film is formed by a combination of nitrogen (N) of the $Si_3N_4$ film and oxygen (O) of the oxide film as shown in FIG. 7B.

Figure 7D:
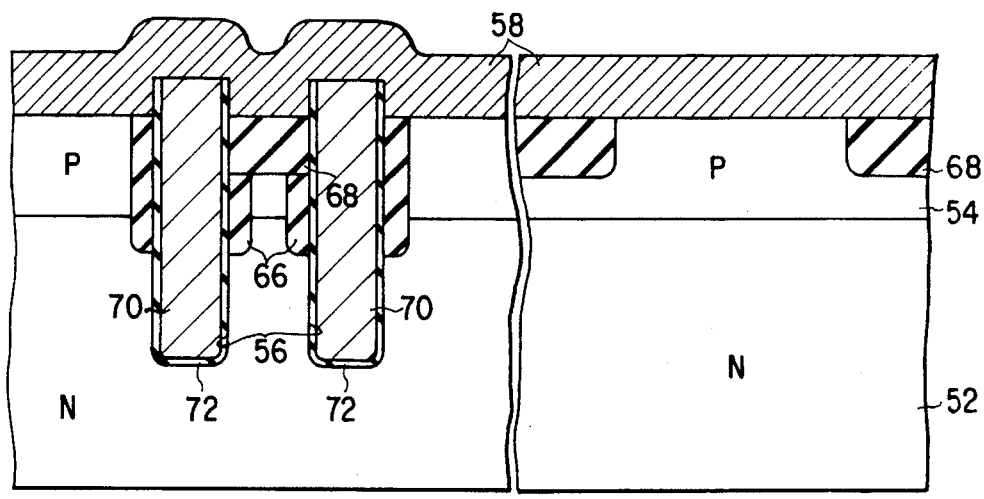

Subsequently, the polishing stopper layer 93 of FIG. 7C is selectively removed. Removal of the layer 93 is effected by use of a thermal oxide film (not shown) with the thickness of approximately 10 nm having a corresponding removing pattern as a mask. In this case, the CDE method using $CF_4$ gas or chemical processing method using "hot phosphoric acid" (that is, heated phosphoric acid) may be suitably used. During the process, the $SiO_2$ film and a $SiO_2$ film (not shown) that have been secondarily formed on the surface of the polysilicon layer 70 are removed by use of dilute HF solution. As a result, the substrate 52 and trench-buried polysilicon layers 70 are completely exposed. Then, as shown in FIG. 7D, a polysilicon layer 58 is formed to cover the exposed surface.

After this, a chosen n-type impurity such as As or P is selectively doped for preparation of later formation of source/drain regions 74, 76, 86, 88 of the trench-cell NMOS transistors Qm1, Qm2 of FIG. 2A and the NMOS transistor Qr in the peripheral circuit of FIG. 4. In an area of the polysilicon layer 58 corresponding to the substrate area in which PMOS transistors are to be formed, a p-type impurity such as B is selectively doped. Doping of $BF_2$ is also effected. The impurity doping processes are performed by the known photolithography or ion-implantation. The ion doping conditions are suitably determined to prevent impurities from penetrating the polysilicon layer 58. This results in that the doped impurities have a concentration peak in the layer 58.

Figure 7E:
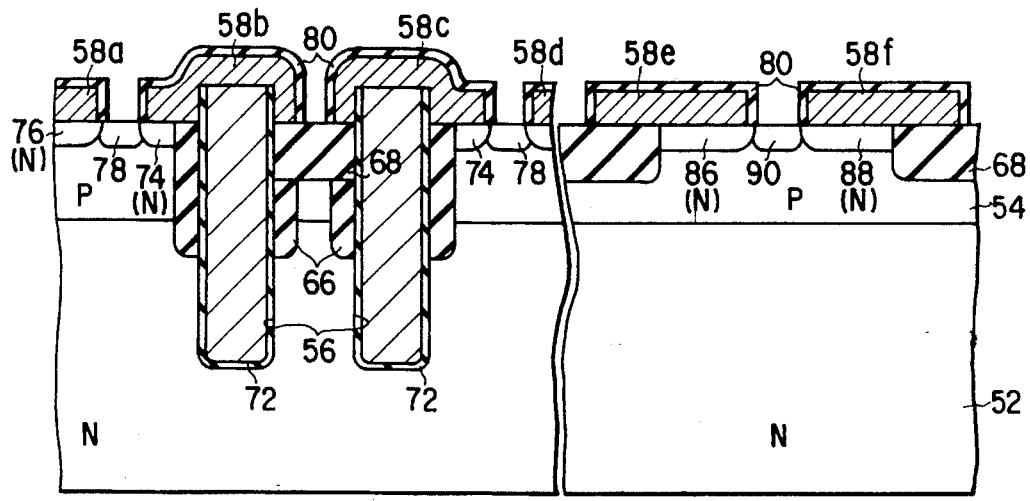

After the impurity doping, the polysilicon layer 58 is subjected to a patterning process employing the combination of known photolithography and RIE technique; layer 58 is patterned to form island layers 58a–58f on the substrate 52 as shown in FIG. 7E. The substrate surface is partly exposed between the layers 58a–58f. The exposed substrate surface portions will be used as channel regions of the transistors Qm1, Qm2, Qr. It is recommendable that the conditions for the RIE process are adequately determined so as to minimize the risk of damaging the substrate. It is further desirable to effect the post-treatment for recovery of the damaged substrate after the RIE process.

The resultant structure is subjected to the thermal oxidation. The thermal oxidation is effected in a wet atmosphere at 850° C. for 30 minutes, for example. The entire surface of the structure is then oxidized so that $SiO_2$ thin films 80 are formed on the surfaces of the island layers 58a–58f to a thickness of approximately 30 nm. At this time, $SiO_2$ thin films 80, approximately 10 nm thick, are formed on the exposed surface portions (channel regions) as shown in FIG. 7E; the impurity doping for adjustment of the transistor threshold voltage is selectively effected in the channel regions to complete the formation of the channel regions 78, 80. During the above heat treatment, the n-type impurity doped into the polysilicon layer 58 as described above is thermally diffused towards the substrate 52 (that is, into the well region 54); therefore, active (charge-carrying) regions 74, 76, 88, 90 of the NMOS transistors Qm1, Qm2, Qr are formed. The p-type impurity is also thermally diffused to form active regions of PMOS transistors (not shown). The thermal diffusion conditions (such as temperature, time and the like) are adequately determined so that the diffusion concentration will be finally (that is, at the time of completion of the device) set to approximately $1\times10^{19}$ atoms per cubic centimeter, the junction depth of n-type impurity-doped regions will be approximately 0.06 micrometers, and the junction depth of p-type impurity-doped regions will be approximately 0.08 micrometers.

The structure of FIG. 7E is subjected to the supplemental impurity-doping process for adjustment of threshold voltages of the transistors Qm1, Qm2, Qr, which process employs the ion-implantation technique. The ion-implantation of a chosen n-type impurity such as B (boron) is effected by using the island layers 58a–58f covered with the surface oxide film 80 as a mask under the application of an acceleration voltage of 40 keV and a dose amount of $1\times10^{12}$ atoms per square centimeter. The B ion is selectively doped into the well region 54 via the thermal oxide film on the surface of the substrate, which is not shown in the drawing. Transistors Qm, Qr are simultaneously completed in the above process; in the case of reduction to practice, the dose amount may be individually determined in the memory cell section and peripheral circuit section. In the PMOS transistors (not shown), the supplementary implantation of p-type impurity is effected in the same manner. After the supplementary ion-implantation, the thermal oxide film on the substrate surface is selectively removed, while causing the $SiO_2$ film overlying island layers 58a–58f to remain at the thickness of approximately 15 nm.

Figure 7F:
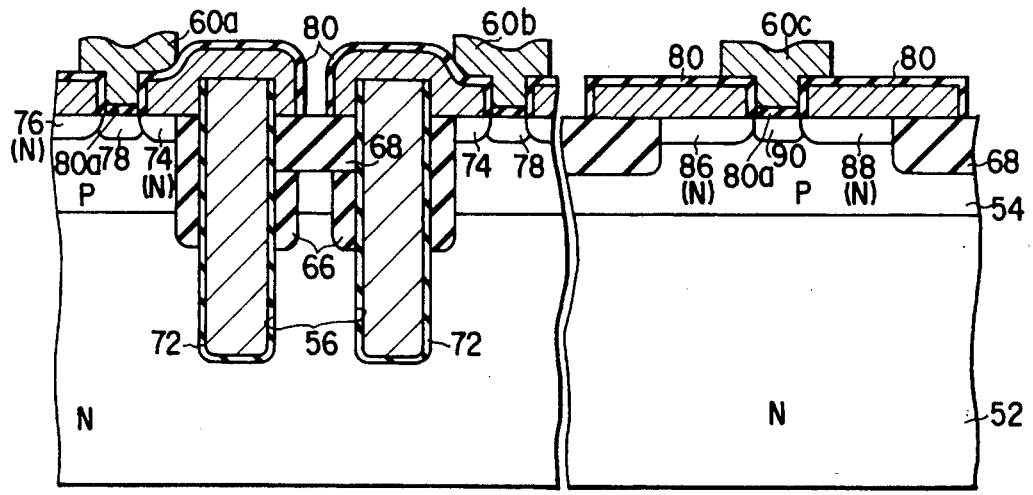

Subsequently, as shown in FIG. 7F, a gate oxide film 80a is formed on the exposed substrate surface (channel region surface) to a thickness of 10 nm. A phosphorus (P) doped polysilicon layer is formed to a thickness of 200 nm on the entire surface of the resultant structure, and is then patterned by use of the photolithography and RIE to form Y-shaped profile gate electrodes 60a, 60b, 60c. Formation of the Y-shaped gate profile is important in order to eliminate the occurrence of dielectric breakdown due to charge-up during the RIE process and enhance the reliability of the gate oxide film.

Thereafter, SiO₂ films 81 (see FIG. 2A) are formed to cover the gate electrodes 60a–60c of FIG. 7E by a known method. The BPSG film 82 of FIG. 2A is deposited to a thickness of approximately 500 nm, which film covers the resultant structure. The deposited film is then subjected to the planarization process. Either the melting process effected in an atmosphere of 850° C. or the low-temperature chemical/mechanical polishing treatment may be preferably employed for the planarization process. The planarized layer 82 is patterned to form bit-line contact-holes in the island layers 58a, 58d. A plurality of bit lines including the bit line 62 are formed on the layer 82. As is most clearly shown in FIG. 1, the bit line 62 is electrically connected to the island layers 58a, 58d in the contact areas 64.

For the bit lines, a so-called "polycide" structure using a conventional polysilicon layer and a tungsten disilicide (WSi₂) may be suitably used; alternatively, it may be made from metal such as tungsten (W). Since the polysilicon island layers 58a, 58d are present at the bit line contact portions, the metal material can be stably prevented from effecting bad behaviors, for example, breaking the shallow junction in the substrate and increasing the possibility of generation of junction leak.

Subsequently, a BPSG film 83 is deposited to a thickness of approximately 400 nm to cover the bit lines. Then, layer 83 is planarized and patterned to form wiring contact holes (not shown). Patterned wiring layers (not shown) are formed on the layer. The DRAM device 50 is thus completed. In the contact forming step, also, since the contact holes are formed in the island polysilicon layers 58, the etching margin for the RIE is enhanced.

The significant feature of this embodiment is that, with the "double-layered T-shaped profile storage node" structure being used in each cell, it is possible to reduce the area of the trench type one-transistor memory cells, while allowing a required data-storage capacitance to be maintained on the substrate of limited size. As shown in FIGS. 1 and 2A–2C, the storage node of each trench cell capacitor C1 (C2) of the DRAM 50 is formed of the square column-shaped polysilicon layer 70 insulatively buried in a corresponding one of the trenches 56 and the square island polysilicon layer 58b (58c) that covers the node top portion on the substrate 52. Source or drain region 74 is located adjacent to trench 56 through the oxide film 66. Island layer 58b is connected to the insulated trench-buried layer 70. Layer 58b is directly contacted with the underlying source or drain region 74 of the memory-cell transistor Qm1 at the edge thereof as shown in FIG. 2A. The gate electrodes 60a, 60b are specifically arranged to extend over islands 58b, 58c. Another way of saying this is that a part of the stacked storage electrodes 70, 58b is also used as one of the source and drain regions of a corresponding cell transistor. As shown in FIG. 2A, it is not necessary to provide an extra connection area for electrically connecting MOS transistor Qm to trench capacitor C in each of an increased number of memory cells. Dispensability of the transistor-to-capacitor area can permit the memory cell area to reduce without reducing the storage capacitance Cs of the trench capacitor C.

Studying the feature of "reduction in cell area" from another viewpoint, the close positioning of the MOS transistor Qm and the trench capacitor C in each cell can permit an increase in the trench opening are under an assumption that the integration density of DRAM and the area of substrate are same; such an arrangement may lead to the achievement of an increased storage capacitance Cs, and/or to the accomplishment of an enhanced production yield due to the fact that the trench 56 decreases in depth while the capacitance Cs is constant.

Another significant feature of the embodiment is that the bit-line contact portions 64 of the MOS transistors Qm1, Qm2 of all the cells are defined on the island polysilicon layers 58a, 58d. More specifically, as shown in FIG. 2A, in each cell, the island polysilicon layer 58a (or 58d) is present between the other (the impurity-doped layer 76 in FIG. 2A) of the source and drain regions of the MOS transistor Qm and a corresponding contact portion of the bit line 62. Since the bit-line contacts 64 do not lie on the substrate surface, the structure can become completely free from the occurrence of any defect caused by the cell structure or other stress generating factors. This makes it possible to suppress or prevent the occurrence of cell junction leak (junction leak in the source and drain regions or junction capacitance in the source and drain regions). Therefore, the DRAM 50 can be enhanced in reliability.

Still another significant feature of the embodiment is that the channel region 78 of a cell transistor Qm1 (Qm2) is formed in the well region 54 between those adjacent two layers 58a, 58b (or 58c, 58d) in one memory cell among the island layers 58a–58d, which are linearly arranged on the substrate 52 in parallel to each bit line 62, in such a manner that the channel region is self-aligned with the island layers as illustrated in FIG. 2A. A corresponding insulated gate 60a (60b) overlies the channel region 78 to provide the Y-shaped gate profile as a whole (see FIG. 2A). The gate length of transistor Qm1 is determined by the distance between islands 58a and 58b, rather than by the actual width of the Y-shaped profile gate 60a. This makes it possible to increase the width of gate 60a to a desired value. This may let the resistance of the gate decrease, and at the same time, lead to the achievement of a highly integrated DRAM.

The significant feature of the manufacturing method in this embodiment is that the source and drain regions 74, 76 of each of the cell transistors Qm1, Qm2 are formed by thermally diffusing impurity previously doped in the island layers 58a–58d patterned on the substrate 52 as is already described with reference to FIG. 7E. Therefore, the impurity-diffused regions 74, 76 are precisely self-aligned with the layers 58a–58d. Further, they are extremely shallow. This is advantageous in that the microfabrication of high-performance transistors is accomplished in which a so-called "short channel" effect can be suppressed and which are excellent in the cut-off characteristic. The fact that island layers 58a–58d are arranged on the substrate surface and that source/drain regions 74, 76 are formed in the surface area of substrate 52 (well region 54) will reduce the resistance of the regions.

Another significant feature of the manufacturing method of the embodiment is that the MOS transistors Qm1, Qm2 of the specific trench memory cells of the invention which provide the above-mentioned various technical advantages are fabricated substantially simultaneously during the same process, together with the MOS transistors Qr of the peripheral circuit to be mounted on the chip substrate 52. Therefore, the fabrication of the DRAM 50 can be attained by using the presently available manufacturing technology without increasing the number of basic steps. Any special manufacturing techniques (which are often risky) for future use are not required at all. This and the above structural/methodological features will bring a great boon to semiconductor manufacturers who are always demanding higher yield of production.

The trench cell structure of FIGS. 2A–2C may be modified as shown in FIGS. 8 and 9. FIG. 8 is a partial plan view of this modification, wherein several inter-level insulating layers are omitted to reveal the pattern of the overlapping layers on the substrate 52; FIG. 9 is a cross-sectional view taken along a line 9—9 of FIG. 8. The cross sectional structure of the cell of FIG. 9 is similar to that of FIG. 2A with the island layers 58b, 58c of FIG. 2A being replaced with island layers 58g, 58h. As is clearly seen from FIG. 9, the edge portions of the respective island layers 58g, 58h which face the trench isolation field insulating film 68 positionally terminate in front of the corresponding opening edges of the trenches 56. In other words, each of the edge portions of islands 58g, 58h facing the field insulating film 68 does not extend up to the surface of field insulating film 68; each edge portion terminates on the half-way on the top surface of the trench-buried layer 70. Such an arrangement can eliminate the occurrence of unwanted electrical short circuit between miniaturized island layers 58g, 58h closely arranged on the substrate 52. At the same time, the memory cell area can be further reduced.

Figure 10A:
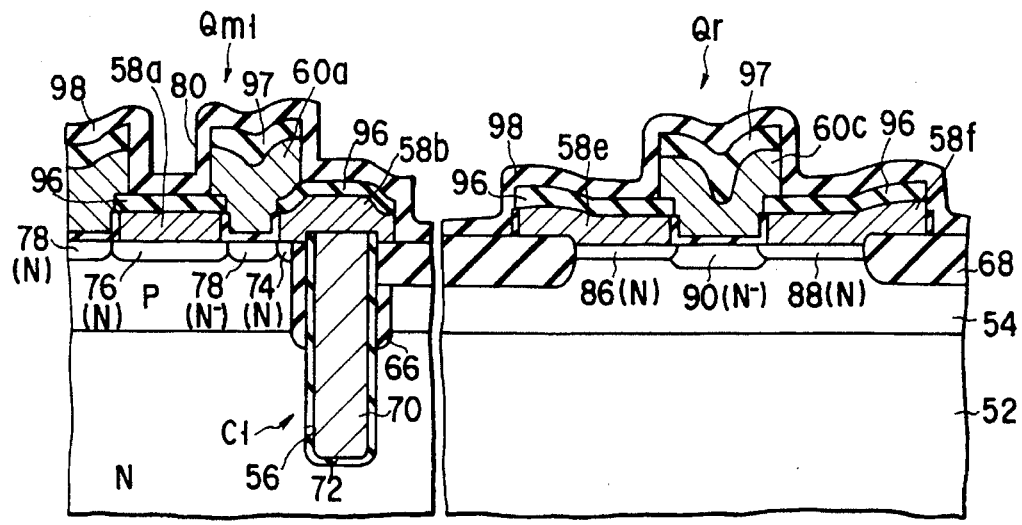
FIGS. 10A–10C illustrate, in schematic cross-section, some of major steps in the manufacturing process of a DRAM in accordance with an embodiment of the invention.
Figure 10B:
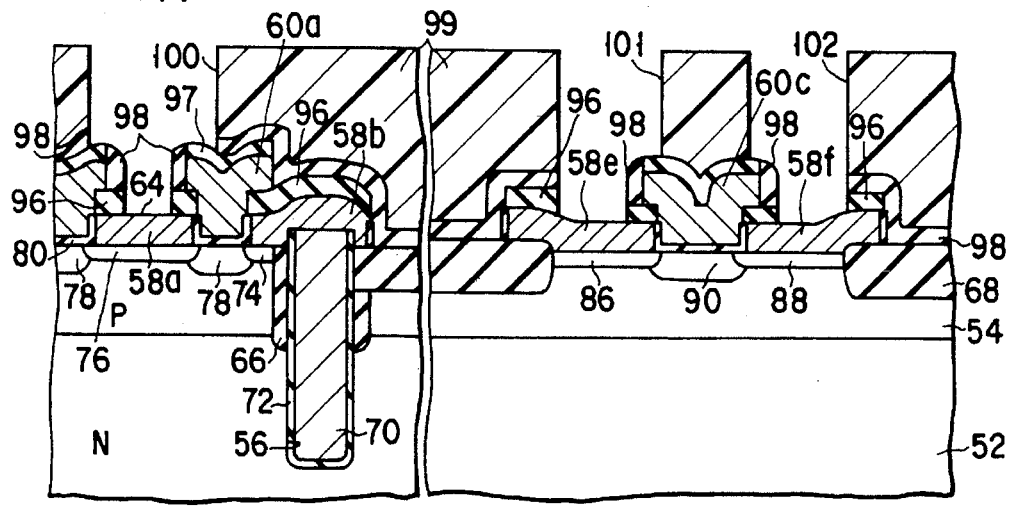
Figure 10C:
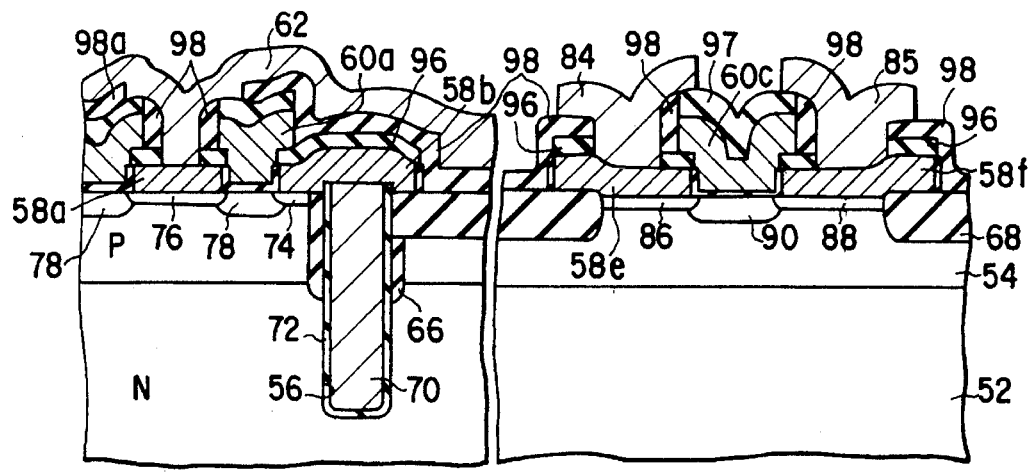

A manufacturing method for DRAMs according to another embodiment of this invention will be explained with reference to FIGS. 10A–10C. This embodiment is mainly directed to formation of the bit-line contact in the self-alignment manner with the gate electrode. In FIGS. 10A–10C, one memory cell in the memory cell section and a certain MOS transistor in the peripheral circuit section on the same substrate are shown in a combined form on the left and right sides according to the drawing technique used in FIGS. 7A–7F.

See FIG. 10A, wherein a trench capacitor C1 and cell transistor Qm1 are formed in the memory cell section on the substrate 52 having a well region 54 and an NMOS transistor Qr is already completed in the peripheral circuit section of substrate 52. The elements are basically similar in structure to those shown in FIGS. 2A–2C and 4, except that n-type polysilicon island layers 58a, 58b, 58e, 58f are provided with dielectric thin films 96 formed on the top surfaces thereof. Thin films 96 may be a $Si_3N_4$ layer, approximately 50 nm thick. Films 96 are coupled to a gate insulation film 80 on the channel region 78 of the cell transistor Qm1 as shown in FIG. 10A. A dielectric thin-film 97 formed of a $Si_3N_4$ film, approximately 200 nm thick, is formed on Y-shaped gate electrodes 60a, 60c. Thin film 97 is a patterning mask used when gate electrodes 60 were formed by an etching process. A $SiO_2$ film 98 is formed by known CVD technique to cover the entire surface of the resultant structure.

Then, as shown in FIG. 10B, a photolithography-patterned photoresist layer 99 having a plurality of openings 100, 101, 102 lying in contact portions is formed on the CVD-$SiO_2$ film 98. The entire-surface etching is performed by RIE with the layer 99 used as a mask to a depth corresponding to the thickness of $SiO_2$ film 98, while causing film 98 to remain on the side walls of gate electrodes 60a, 60c in a self-align manner, which will be used as a mask to etch the $Si_3N_4$ film, whereby (1) the $Si_3N_4$ film 96 overlying the island layer 58a formed in the bit-line contact portion 64 of the cell transistor Qm1 is selectively etched to form a contact opening therein, and substantially simultaneously, (2) $Si_3N_4$ films 96 covering the island layers 58e, 58f lying in the source/drain wiring contact portion of the peripheral transistor Qr is etched to define wiring-contact openings therein. The bit-line contact hole of the cell transistor Qm1 is precisely self-aligned with the opposite side walls of adjacent ones of the Y-shaped gate electrodes 60. One of the side walls of each source/drain wiring contact of the peripheral-circuit transistor Qr is exactly self-aligned with a corresponding edge of Y-shaped gate electrode 60c. The other side wall of each contact is determined by a corresponding one of the resist openings 101, 102; therefore, this portion is not self-aligned with the gate 60c. During the RIE process, each of Y-shaped gates 60a, 60c is covered with the insulating films 97, 98 so as to be electrically isolated from the other portions.

After the photoresist layer 99 is removed away, several patterned conductive layers acting are formed as the bit lines 62, source/drain wiring lines 84, 85. Layers 62, 84, 85 may be made from polycide or tungsten.

By employing a specific manufacturing technique for self-aligning the opening of bit-line contact with the gate electrode, any extra space is not longer present between the bit-line contact portion and the Y-shaped gate electrodes 60 adjacent thereto. Thus, the cell area can be minimized, causing the integration density of the DRAM to be further improved. In addition, the source/drain wiring lines 84, 85 of the peripheral-circuit transistor Qr are formed of the same layer as the bit line 62 of the memory-cell transistor Qm1; therefore, the necessary stacked layers can be reduced in number, which can avoid the formation of a "deep" contact hole that is generally difficult to form. It is thus possible to make easier the manufacturing method of the DRAM and to improve the manufacturing yield.

Figure 11A:
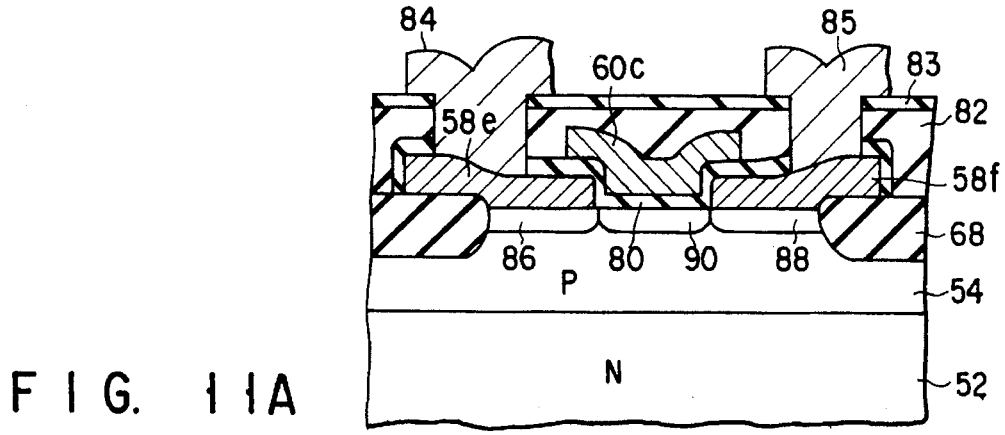
FIGS. 11A–11C are diagrams showing modifications of the cross-sectional structure of the peripheral-circuit transistor of FIG. 4.
Figure 11B:
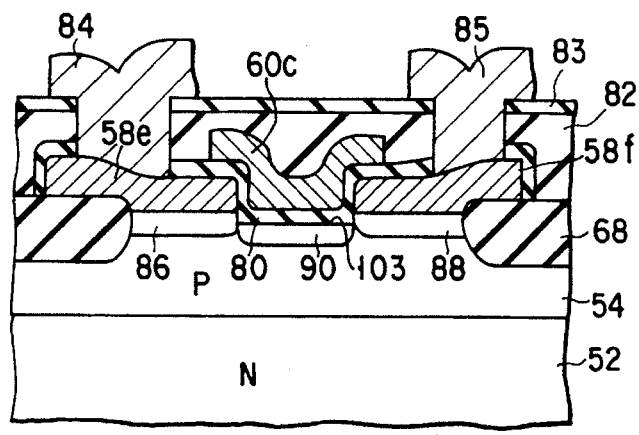
Figure 11C:
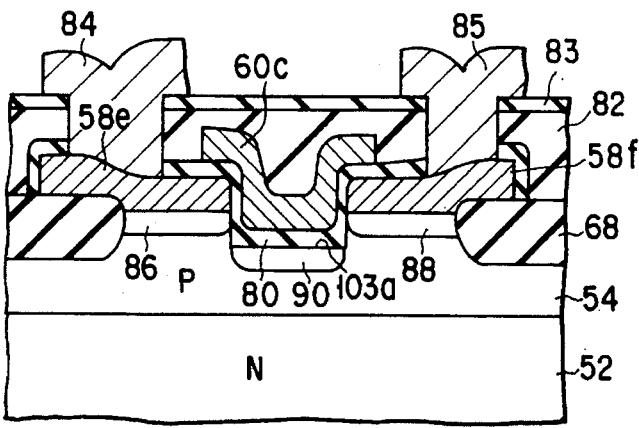

Three possible modified cross-sectional structures of the peripheral-circuit transistor Qr of FIG. 4 are shown in FIGS. 11A–11C, which are different in the channel structure from that of FIG. 4. With the transistor of FIG. 11A, like that of FIG. 4, an interface between the channel region 90 and the gate insulation film 80 lies at a level above the source and drain regions 86, 88 (which may be of either n-type or p-type conductivity, while corresponding island polysilicon layers 58e, 58f are of the same conductivity type as the source and drain regions 86, 88). This structure may be obtained by diffusing impurity into the well region 52 such that lightly-doped impurity layers constituting source and drain regions 86, 88 become deeper than the interface between the channel and the gate insulation film, while substantially or completely protecting the surface of the silicon substrate 52 during the etching-formation of island layers 58. With such an arrangement, since heavily-doped island layers 58e, 58f lie at a level higher than the transistor channel region, and since the source and drain regions 86, 88 are lower in impurity concentration than layers 58, it becomes possible to suppress the occurrence of the short channel effect.

According to the peripheral-circuit transistor shown in FIG. 11B, the substrate 52 has a shallow concave portion 103 in its channel forming area. The depth of the concave portion may be approximately 0.05 micrometers. The bottom portions of the gate insulation film 80 and Y-shaped gate 60c are in the concave portion 103 to overlie the channel region 90. The interface between channel region 90 and film 80 is positioned at the same level as or a level lower than the source and drain regions 86, 88 (which may be of n-type conductivity or p-type conductivity, whereas corresponding island polysilicon layers 58e, 58f are of the same conductivity type as the source and drain regions 86, 88). With such an arrangement, the impurity diffusion from the island polysilicon layers 58e, 58f into the well region 54 is effected only in the direction perpendicular to substrate 52. Diffusion of impurity in the lateral direction of substrate 52 is suppressed by the presence of concave portion 103. This can suppress more strongly the short channel effect. The formation of concave portion 103 may be performed by additionally and selectively etching the substrate surface before or during the etching process of islands 58e, 58f.

The "concave-channel" type transistor structure of FIG. 11C is similar to that of FIG. 11B with the concave portion 103 being replaced with a deeply-etched concave portion 103a. This concave portion 103a is deeper than the bottom portions of the source and drain regions 86, 88. The depth thereof may be approximately 0.1 micrometer. An interface between the channel region 90 and the gate insulation film 80 is positioned at a level higher than source and drain regions 86, 88. This is called an "elevated source/drain" structure. The formation of the deep concave portion 103a may be carried out by additionally and selectively etching the substrate surface using the RIE method with the spaced-apart island layers 58e, 58f covered with oxide films being as a mask, after the etching-formation of the island layers 58e, 58f. Optionally, the RIE-damage recovering process may be effected, thus removing undesirable surface irregularities in the interface. With such an arrangement, the occurrence of short-channel effect can be prevented almost perfectly.

A method of forming the source and drain regions of a MOS transistor in accordance with another embodiment of this invention will now be explained with reference to FIGS. 12A–12D. Each of FIGS. 12A–12D shows the cross-sectional views of a trench-type memory-cell transistor Qm on the left side and a peripheral-circuit transistor Qr on the right side. The characteristic feature of this method is that the source and drain regions are not formed by thermally diffusing impurity from their overlying polycrystalline island layers 58 as described before, but the source and drain regions have been previously formed before the deposition of islands 58. Therefore, in each transistors Qm, Qr, the channel region lies at a level lower than the source and drain regions, thereby permitting the "elevated source-drain" structure to be easily formed with high yield of production. This can be said because the thermal diffusion process becomes unnecessary and impurity diffusion becomes stable in the source and drain regions.

Figure 12A:
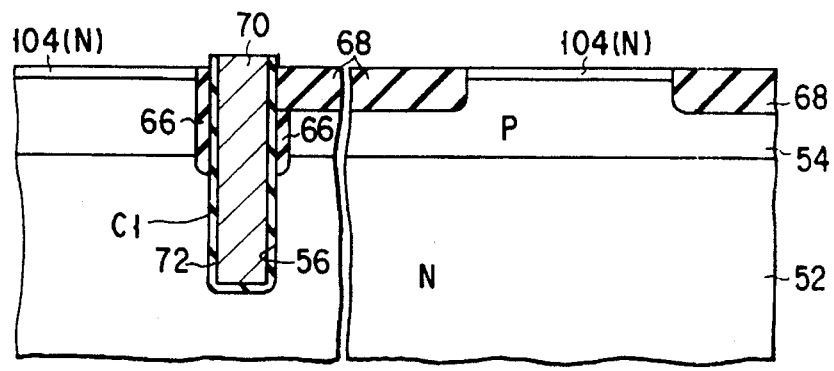
FIGS. 12A–12D illustrate, in schematic cross-section, some of major steps in the manufacturing process of MOS transistors of the DRAM in accordance with an embodiment of the invention.

As shown in FIG. 12A, a trench capacitor C1 of each memory cell is formed in the memory cell section of the substrate 52, and a field insulating film 68 is selectively formed in the peripheral-circuit section of substrate 52. Consider that a manufacturing method of the trench-cell structure follows the method shown in FIGS. 7A–7D: Repetitive explanation therefor is omitted.

After the surfaces of the substrate 52 and the trench-buried layer 70 are exposed, n-type and p-type impurities are selectively doped thereinto by use of known photolithography and RIE technique, thus forming an n-type impurity doped layer 104 having a controlled depth in the substrate region as shown in FIG. 12A. Obviously, the impurity conductivity type can be changed to modify NMOS to PMOS. While the impurity ion-implantation is effected directly with respect to the exposed substrate surface, it may alternatively be effected through a $SiO_2$ film (not shown) formed on the substrate surface; in such a case, the occurrence of contamination on the substrate due to formation of a resist layer can be prevented.

Figure 12B:
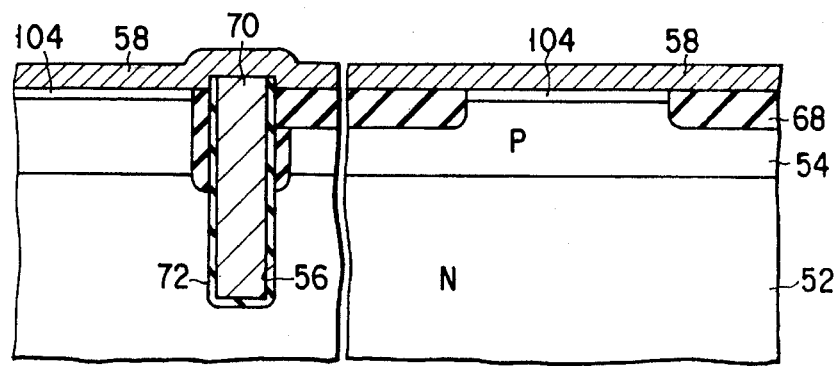

Subsequently, as shown in FIG. 12B, a polysilicon layer 58 is formed by the known CVD method to a thickness of 15 nm on the entire surface of the substrate structure. To let layer 58 to have n-type conductivity, arsenic (As) ion is implanted so as to cause a concentration peak to appear therein. To form layer 58 to have p-type conductivity, boron (B) ion is implanted causing a concentration peak to appear in layer 58.

Figure 12C:
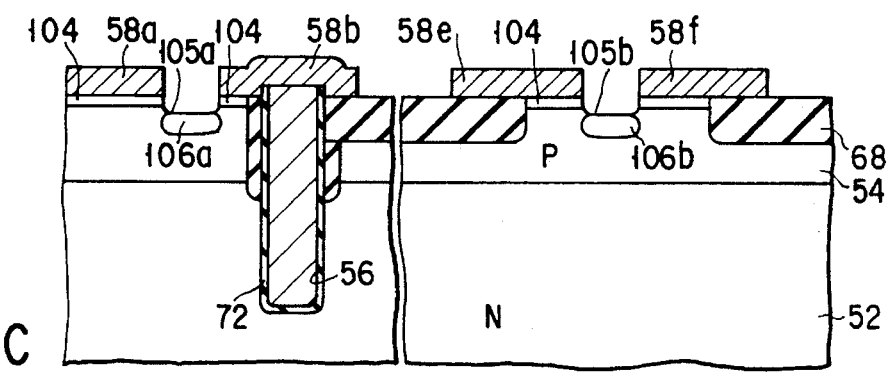

As shown in FIG. 12C, the impurity-doped polysilicon layer 58 is then patterned by use of the known photolithography and RIE technique. Simultaneously, several substrate surface areas corresponding to the channel regions are etched to form concave portions (grooves) 105a, 105b in the well region 54. Grooves 105a, 105b are deeper than the impurity-doped layer 104; therefore, layers 104 being divided by the grooves define spaced-apart source and drain regions in each transistor section. The formation of grooves 105 may be effected by using an insulating thin-film formed while an insulative film, which is formed by oxidizing the exposed surfaces of the patterned islands 58a, 58e, 58f, is used as a mask. Thereafter, a chosen impurity is doped into grooves 105 with islands 58 being used as a mask, thereby to selectively form threshold-voltage adjusting impurity-doped layers 106a, 106b in well region 54. If the ion-implantation is done through a $SiO_2$ film (not shown) of approximately 10 nm thick formed on the exposed surface, the contamination of substrate surface may be prevented.

Figure 12D:
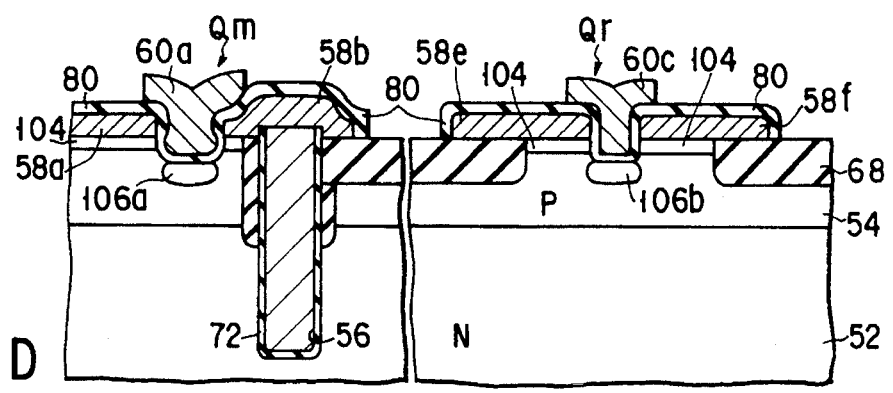

Then, as shown in FIG. 12D, a $SiO_2$ insulating thin-film 80, which partly serves as a gate insulation film, is formed on the entire surface of the resultant structure. Y-shaped gate electrodes 60a, 60c are formed according to the method described before for each transistor, thus completing the memory-cell transistor Qm and peripheral-circuit transistor Qr.

With the embodiment, principally, the impurity-doped source and drain regions of each transistor Qm, Qr are formed by ion-implantation; impurity is further diffused thereinto from the overlying island layers 58 in the later heat treatment. The formation of the source and drain regions by ion-implantation can minimize variations in the depth of the diffusion layers among the transistors; it is thus possible to attain stable lightly-doped source and drain regions in each transistor. The manufacturing yield of MOS transistors can be improved significantly.

Figure 13A:
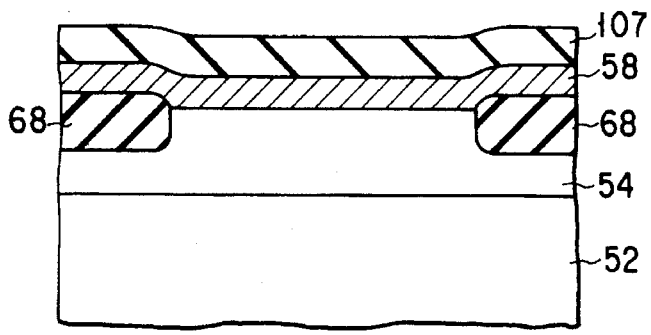
FIGS. 13A–13D illustrate, in schematic cross-section, some of major steps in the manufacturing process of a highly miniaturized MOS transistor preferably used for the DRAM in accordance with an embodiment of the invention.
Figure 13B:
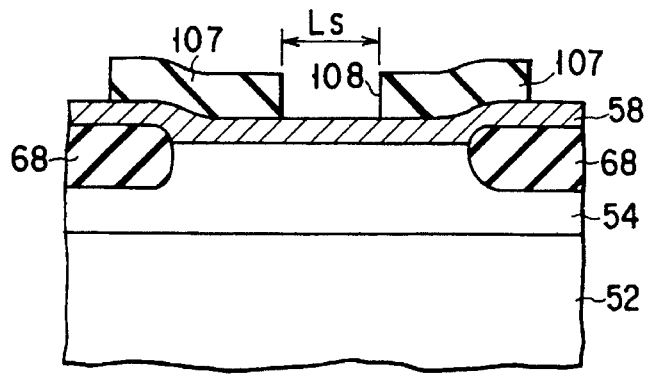

In order to further reduce the channel length of each transistor in the DRAM device 50, the "side-wall" technique shown in FIGS. 13A–13D may be used. Firstly, as shown in FIG. 13A, an impurity-doped polysilicon layer 58 is selectively formed on the entire surface of the substrate 52 having the selectively formed field insulating film 68. A $Si_3N_4$ film 107 is formed on layer 58. Then, as shown in FIG. 13B, $Si_3N_4$ film 107 is patterned in the known manner to form a channel-region opening 108 having a length satisfying the ordinary photolithography limitation. The opening width Ls is 0.4 micrometers.

Figure 13C:
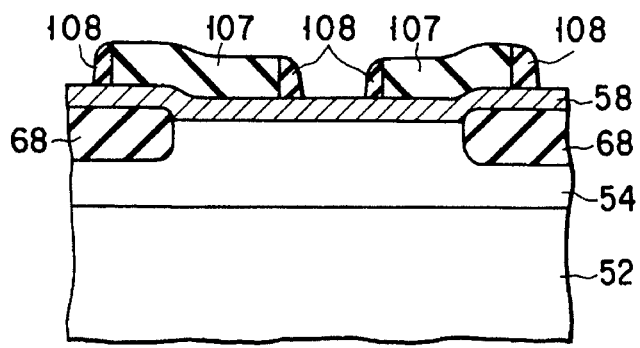
Figure 13D:
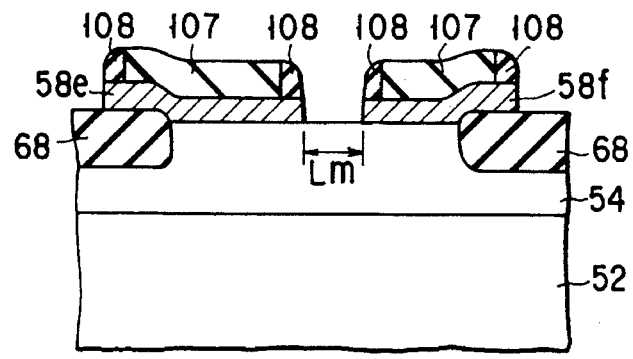

Subsequently, another $Si_3N_4$ film 108 is deposited to a thickness of approximately 0.1 micrometer on the entire surface of the resulting structure. The entire surface of the resulting structure is etched by RIE technique with respect to an etching depth corresponding to the thickness of film 108. As a result, as shown in FIG. 13C, $Si_3N_4$ film portions 108 remain only at the vertical side walls of each of the patterned layers 107. The underlying layer 58 is subjected to the RIE etching process by using the layers 107 and their side-wall layers 108 as a mask, thereby to form islands 58e, 58f that define the opening Lm having a decreased width Lm therebetween on the substrate 52.

Figure 14A:
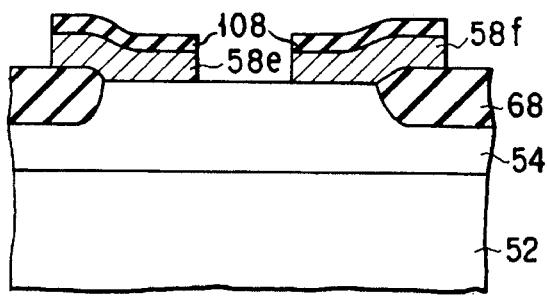
FIGS. 14A–14D illustrate, in schematic cross-section, some of major steps in the manufacturing process of a highly miniaturized MOS transistor to be used in the DRAM embodying the invention.

The MOS transistor for use in the DRAM 50 may also be formed by another fabrication method as shown in FIGS. 14A–14D. As shown in FIG. 14A, a patterned multi-layered structure of a polysilicon layer 58 and a $Si_3N_4$ film 108 is formed on the substrate 52 having a field insulation film 68 selectively formed thereon. $Si_3N_4$ film 108 may be 200 nm thick.

Figure 14B:
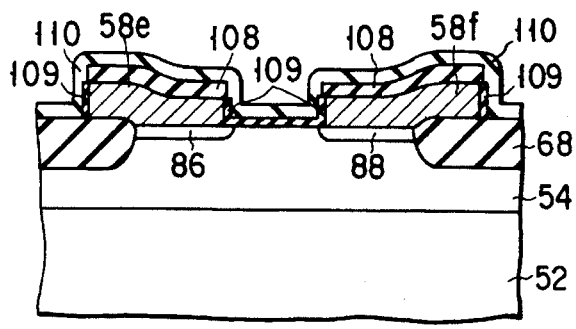
Figure 14C:
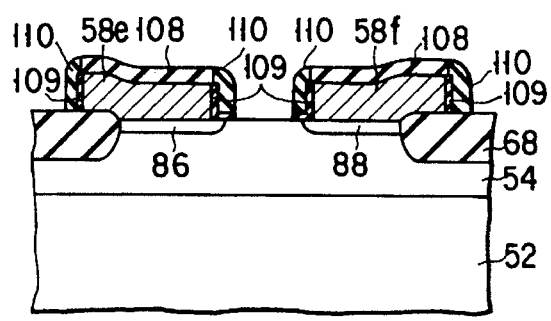
Figure 14D:
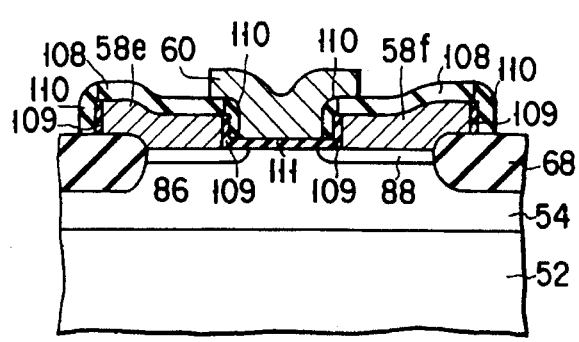

Subsequently, a $Si_3N_4$ film 109 is formed on the substrate 52 and on the side walls of the polysilicon layers 58e, 58f to a thickness of 10 nm (the thickness at the side walls of layers 58 is approximately 30 nm). Then, as shown in FIG. 14B, a $Si_3N_4$ film 110 is formed on the entire surface of the resulting structure to a thickness of 0.05 micrometers. Film 110 is then etched by RIE technique, causing $SiO_2$ film and $Si_3N_4$ film to partially remain on the side walls of each island layers 58, as shown in FIG. 14C. After the RIE-damage recovery treatment is performed, a gate oxide film 111 is formed on the exposed surface portion of substrate 52 as shown in FIG. 14D. On the resultant structure, a Y-shaped gate electrode 60c is formed by use of the technique described before.

With the embodiment, it becomes possible to compensate for a reduction in the channel length due to an undesirable outdiffusion of the source/drain impurity-doped layers in the lateral direction, by forcing insulating films to partly remain on the side walls of the polysilicon island layers 58e, 58f. This can reduce the overlap capacitance between the source/drain and the gate electrode.

Another method for forming highly miniaturized MOS transistors suitable for the DRAM 50 is explained with reference to FIGS. 15A–15C. The feature of this method lies in the timing of impurity-doping for forming MOS transistors.

Figure 15A:
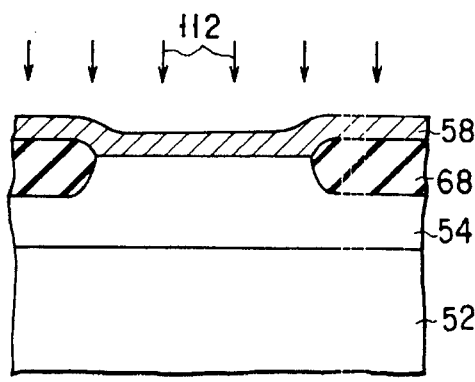
FIGS. 15A–15C illustrate, in schematic cross-section, some of major steps in the manufacturing process of an LDD type MOS transistor that may be preferably used in the DRAM embodying the invention.
Figure 15B:
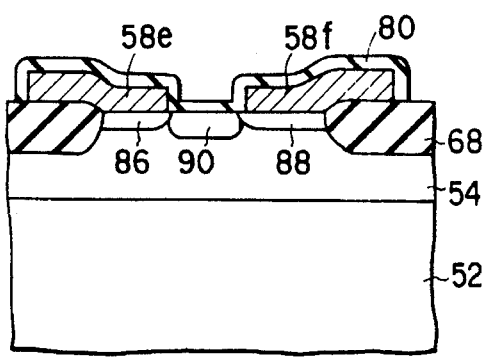

After a polysilicon layer 58 of approximately 150 nm thick is formed on the entire surface of the substrate 52, chosen impurities are selectively ion-implanted as shown by arrows 112 in FIG. 15A. An n-type impurity (such as P) is doped into the NMOS transistor forming area, whereas a p-type impurity (such as B) is doped into the PMOS transistor forming area. The impurities may be doped at the dose amount of $1 \times 10^{14}$ atoms per square centimeter. The ion-implantation conditions are controlled such that the concentration peak of doped impurity may lie at or near the interface between polysilicon layer 58 and the substrate surface (that is, well region 54).

After patterning the impurity-doped polysilicon layer 58, the $SiO_2$ film 80 is formed to cover the exposed channel-region forming section of the substrate 52 and the resultant island-shaped layers 58e, 58f. Then, as shown by arrows 113 in FIG. 15B, chosen impurities are selectively ion-implanted only into the channel-region forming section of substrate 52 (well region 54) with the island layers 58e, 58f being used as a mask. A channel region 90 is formed in each MOS transistor so that region 90 has a selected conductivity type and its threshold voltage is adequately controlled. During the formation of the $SiO_2$ film 80, an impurity is diffused from islands 58e, 58f into well region 54 of substrate 52 to form source and drain regions 86, 88. A heat treatment may be additionally effected; in this case, lateral impurity-diffusion of source/drain regions 86, 88 is secondarily controlled. It is recommendable that such an extra heat treatment may be done in a nitrogen atmosphere at 850° C.

Figure 15C:
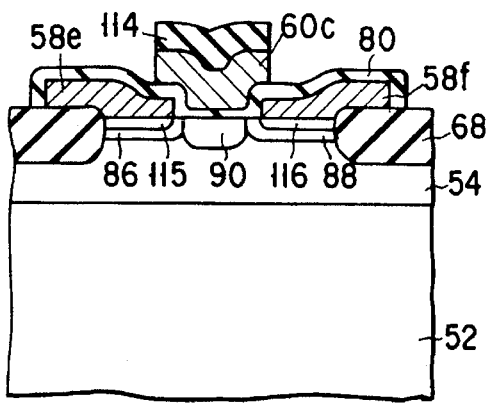

Subsequently, as shown in FIG. 15C, an insulated multilayered structure of a conductive layer 60c and a $Si_3N_4$ layer 114 patterned into a Y-shaped gate profile is formed to overlie the channel region 90. In the case of NMOS transistor, an n-type impurity (such as As) is ion-implanted into the island-like polycrystalline silicon (polysilicon) layers 58e, 58f at the dose amount of $5 \times 10^{15}$ atoms per square centimeter with gate 60c used as a mask. In the case of PMOS transistor, a p-type impurity (such as B) is ion-implanted at substantially the same dose amount. The resultant structure is then subjected to the heat treatment (in a nitrogen atmosphere at 850° C., for example), thereby to form impurity-doped layers 115, 116 in the source and drain regions 86, 88, respectively. Layers 115, 116 are self-aligned with island layers 58e, 58f. Those portions of the source and drain regions in which layers 86, 88 are formed is less in impurity concentration than layers 115, 116.

With the embodiment, each of the source and drain regions is equivalent to a so-called "lightly-doped drain (LDD)" structure wherein the impurity concentration is decreased at a portion being contacted with the channel region 90, due to the presence of the heavily-doped layer 115 (or 116) in the lightly-doped layer 86 (88). Such an LDD-type MOS transistor is excellent in reliability and can be preferably used for the DRAM 50.

Figure 16:
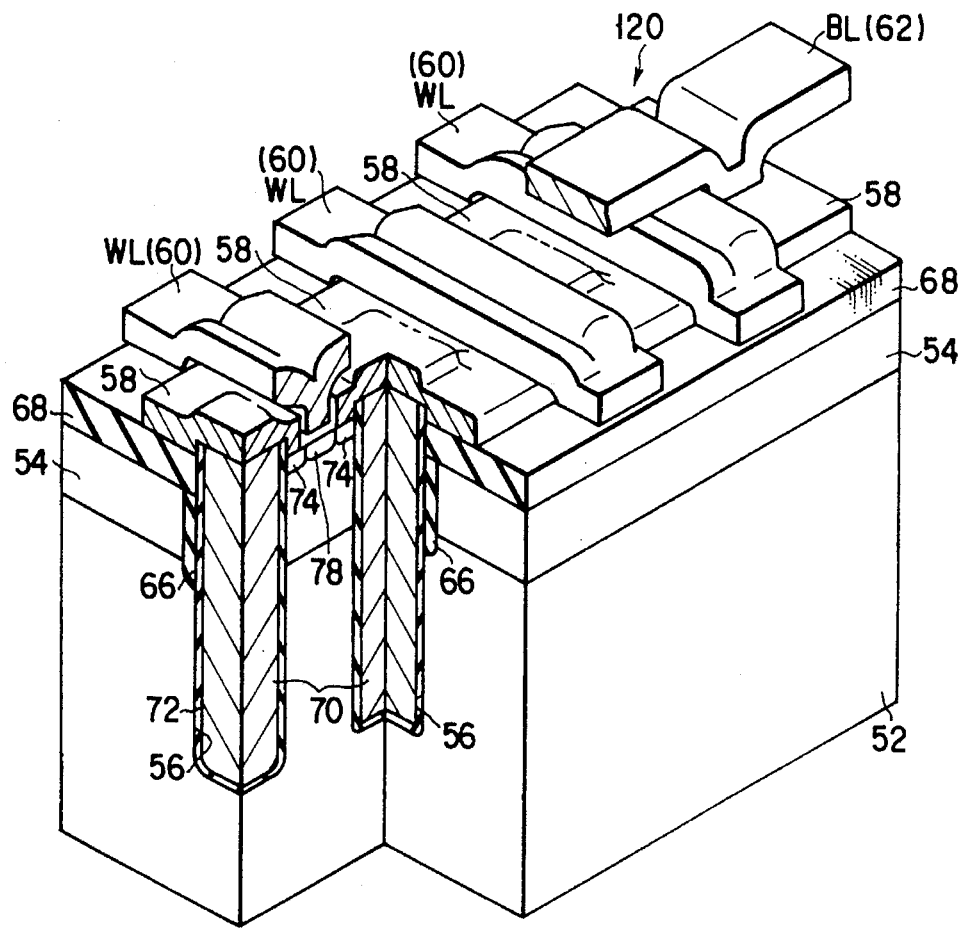
FIG. 16 is a perspective view with partly cut-away portion schematically showing the structure of a main portion of a memory cell array section of a NAND type DRAM device according to another embodiment of the invention.

Turning now to FIG. 16, a NAND type DRAM device in accordance with another embodiment of this invention is generally designated by the numeral 120. (Note that the NAND type DRAM may alternatively be called the "cascade-connected" DRAM.) In principle, the NAND DRAM 120 includes a plurality of series-connected memory cells each of which employs the trench-type one-transistor memory cell shown in FIGS. 1 and 2A–2C having the T-shaped double-layered storage node structure and the Y-shaped gate profile memory-cell transistor Qm. The series-connected memory cells constitute one NAND cell associated with one bit line. Only for the purpose of avoiding repetitive explanation, similar elements corresponding to those shown in FIGS. 1 and 2A–2C are identified by the same reference characters so as to exclude redundancy of description.

Figure 17:
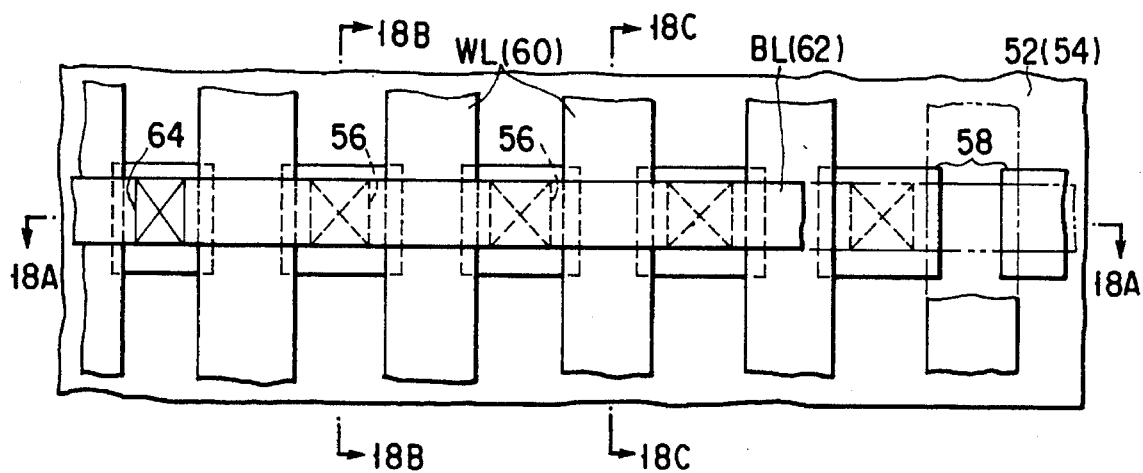
FIG. 17 is a plan view of the NAND DRAM of FIG. 16.

As shown in FIG. 16, parallel control lines (word lines) WL associated with a selected number of one-transistor memory cells extend in a first direction above the substrate 52 having well region 54 formed therein. Each word line is disposed, as shown in FIG. 17, to extend over adjacent ones of island layers 58 to provide a Y-shaped profile as shown in FIG. 16. A corresponding one of parallel data-transfer lines (bit lines) BL extends above word lines WL in a second direction transverse to the first direction. Each word line WL of FIG. 16 corresponds in structure to the wiring 60a, 60b having the Y-shaped gate profile of FIG. 1; the bit line BL corresponds to the layer 62 of FIG. 1.

Figure 18A:
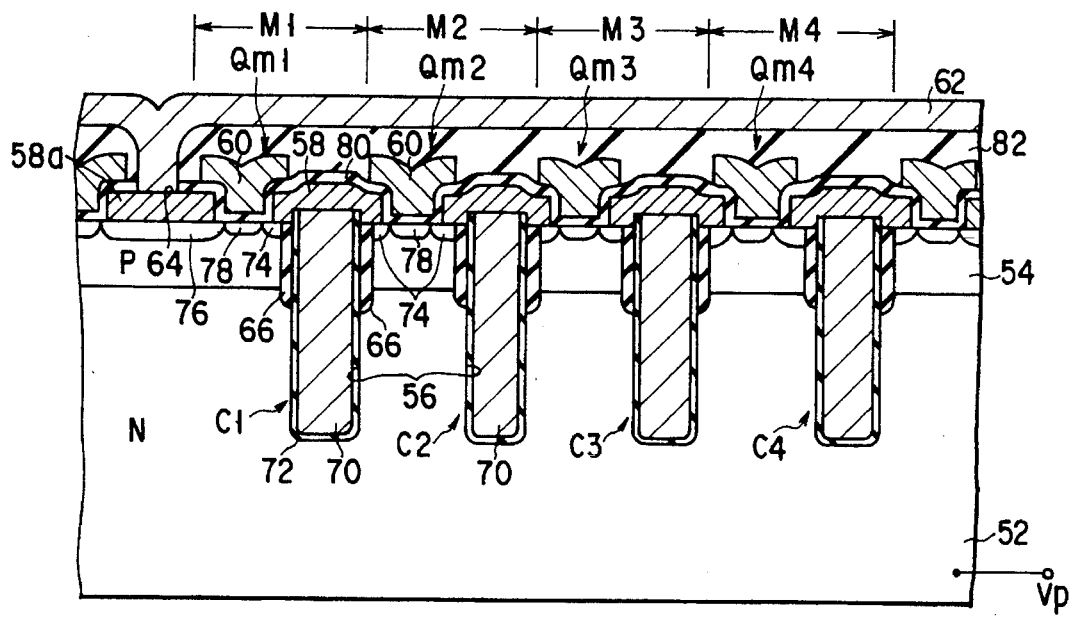
FIGS. 18A, 18B and 18C are fragmentary cross-sectional views of the NAND DRAM of FIG. 17 along three different lines 17A—17A, 17B—17B and 17C—17C, respectively.

As is clearly seen from the cross section along the bit line BL of FIG. 18A, four memory cells M1, M2, M3, M4 are arranged linearly. The number "four" is a mere example; when the invention is reduced to practice, one NAND cell section associated with one bit line BL may include eight or sixteen cells M. The memory cell M1 consists of a T-shaped double-layered trench capacitor C1, and an NMOS transistor Qm1 having spaced-apart n-type regions (source and drain) 74, 76 one of which is connected to the capacitor, a channel region 78 formed therebetween and a Y-shaped gate electrode 60 overlying the channel region. The other n-type region 76 of transistor Qm1 is connected to bit line BL via the bit-line contact island layer 58a, like the embodiment shown in FIG. 2A. Memory cell M2 consists of a T-shaped double-layered trench capacitor C2, and an NMOS transistor Qm2 that has spaced-apart n-type source and drain regions 74, a channel region 78 and a Y-shaped gate electrode 60. Each of the other cells M3, M4, . . . is similar in structure to cell M2.

Figure 18B:
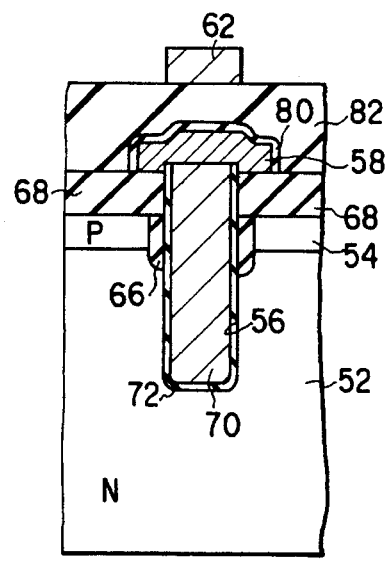
Figure 18C:
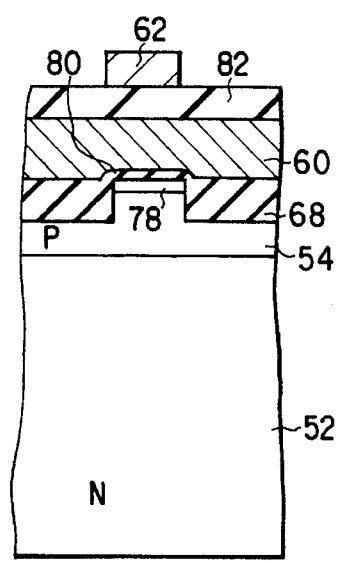
Figure 19:
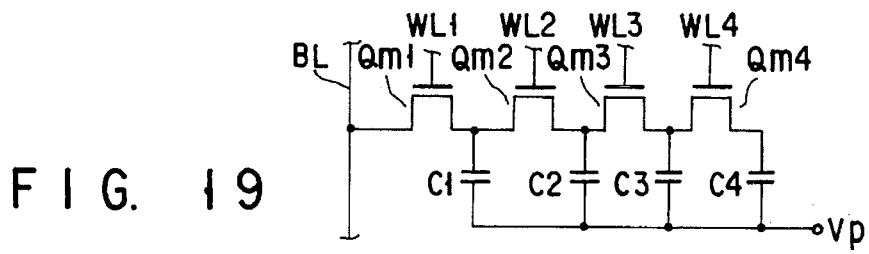
FIG. 19 shows the electrical equivalent circuit of one NAND cell section including a plurality of series-connected memory cells as typically shown in FIG. 16A.

Note that the drain region 74 of the cell transistor Qm2 is also used as the source of the adjacent cell transistor Qm1, and that the source of cell transistor Qm2 is also used as the drain of the adjacent cell transistor Qm3 on the opposite side. The cross sections of each cell Mi shown in FIGS. 18B and 18C are the same as those of FIGS. 2B and 2C. The substrate 52 is coupled to a plate voltage Vp, and serves as a common electrode of the trench capacitors C1–C4. FIG. 19 shows an equivalent circuit of the NAND cell. The voltage Vp is 1.5 volts, for example.

Principally, a method of forming the NAND cell structure is the same as that explained with reference to FIGS. 7A–7F as far as the trench cell is concerned. An explanation will now be made by referring to FIGS. 20A–20D to demonstrate the fact that a plurality of trench NAND cells M1–M4 can be formed simultaneously.

Figure 20A:
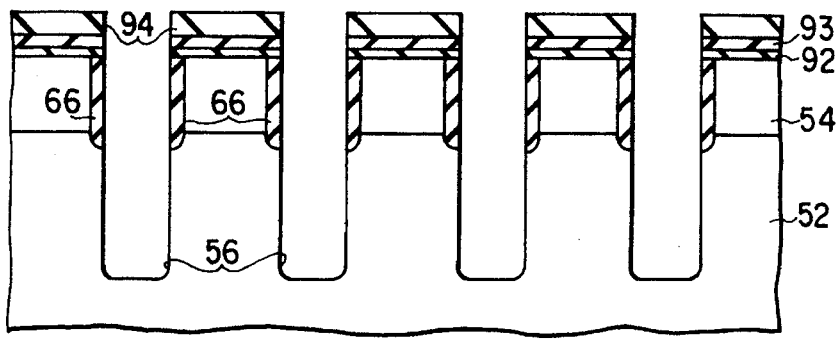
FIGS. 20A–20D illustrate, in schematic cross-section, some of major steps in the manufacturing process of the NAND DRAM device of FIGS. 16–19.

The cross sectional view of FIG. 20A is similar to that of FIG. 7A except that the number of trenches 56 is different therefrom. A CVD-SiO$_2$ buffer layer 92, a Si$_3$N$_4$ film 93 and a SiO$_2$ film 94 are stacked on the substrate 52 having a well region 54 in this order. By using the technique as described previously with reference to FIG. 7A, trenches 56 of a preselected number corresponding to the number of the NAND cells M are formed simultaneously in the substrate 52.

Figure 20B:
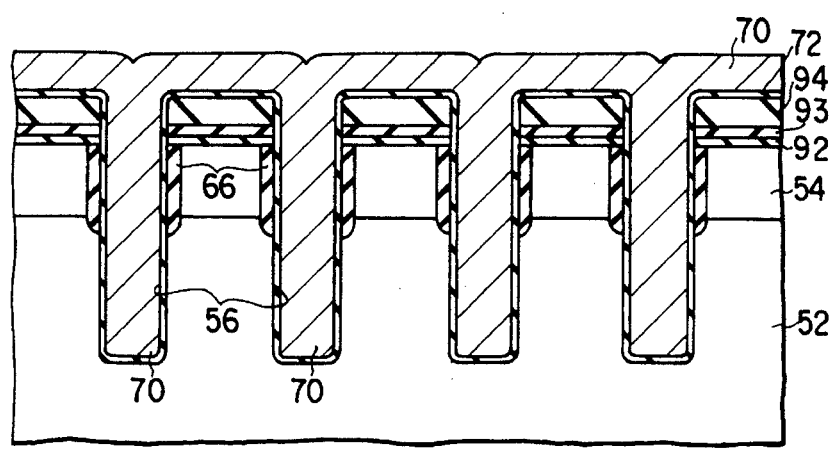
Figure 20C:
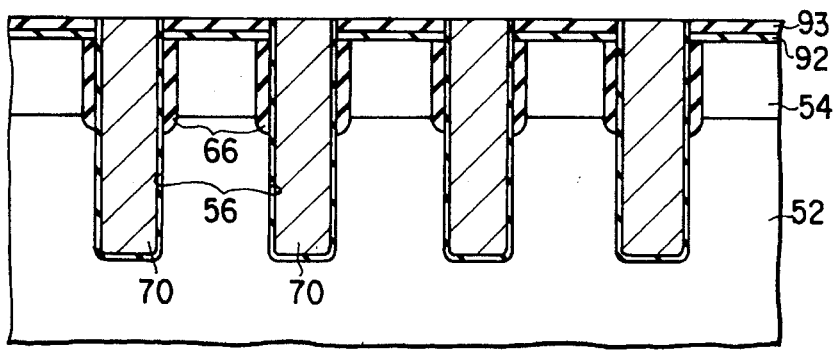
Figure 20D:
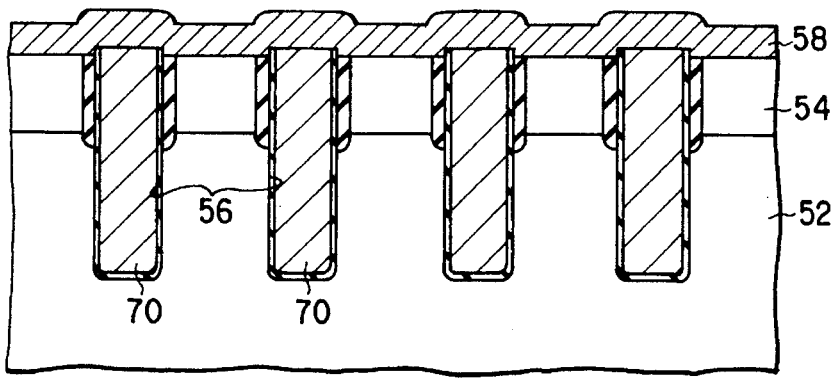

Subsequently, as shown in FIG. 20B, an NO film 72 is formed as a capacitor insulating film on the entire surface of the resultant structure. A polysilicon layer 70 is formed on the film. Thereafter, the polysilicon layer 70, NO film 72, SiO$_2$ film 94 are etched using the technique as described above with reference to FIG. 7C, to leave buried layer portions 70 isolated from one another in the trenches 56 as shown in FIG. 20C. After layers 92, 93 are removed, a polysilicon layer 58 is formed to cover the trench-buried layers 70. The succeeding manufacturing process is the same in principle as the method explained with reference to FIGS. 7E and 7F.

The significant feature of the NAND type DRAM device 120 shown in FIGS. 16–19 is that the integration density as a whole can be dramatically increased while maintaining all the aforementioned advantages, by causing the trench-type one-transistor memory cell M, which has the T-shaped double-layered storage node structure and the Y-shaped gate profile memory-cell transistor Qm, to be directly connected to a corresponding bit-line contact portion 64. This results from the fact that (1) it is not necessary to provide a contact portion for each of a plurality of memory cell transistors Qm, and that (2) the distance between the adjacent trenches 56 can be extremely reduced by commonly using the sources and drains of the transistors Qm2, Qm3 of neighboring cells M2, M3 of the NAND cell section.

Another significant structural feature of the DRAM 120 is that the capacitor electrode consisting of the polycrystalline silicon films 58, 70 acts as a storage node, and at the same time, performs the function of a current-flow path between adjacent ones of the memory cells.

A NAND type DRAM device of FIG. 21 is similar to that shown in FIG. 18A with a separation transistor Ts being arranged between a 4-bit NAND cell section NC1 and its adjacent NAND cell section NC2. NAND cell section NC1 includes four trench-type one-transistor memory cells M1–M4, each of which has the T-shaped double-layered storage node structure and the Y-shaped gate profile memory-cell transistor Qm as described previously. The same goes with NAND cell section NC2. The bit line 62 (BL) extends above the substrate 52 to overlie NAND cell sections NC1, NC2. Bit line 62 is contacted to a plurality of common bit-line contact sections 64, each of which is associated with eight series-connected 1-bit memory cells M, wherein the first four cells M1–M4 and the remaining four cells M4',... are electrically isolated from each other by means of a separation transistor Ts. The transistor Ts may be a Y-shaped gate-profile MOS transistor that is similar in structure to the memory cell transistors Qm1–Qm4. The gate electrode of transistor Ts is forced to be set at a constant potential, which maybe either the ground potential (zero volts) or a negative-polarity voltage. In the NAND DRAM device shown in FIG. 21, the memory-cell structure exhibits a right-and-left symmetry about the bit-line contact section 64; it also is symmetrical about the separation transistor Ts.

Figure 22:
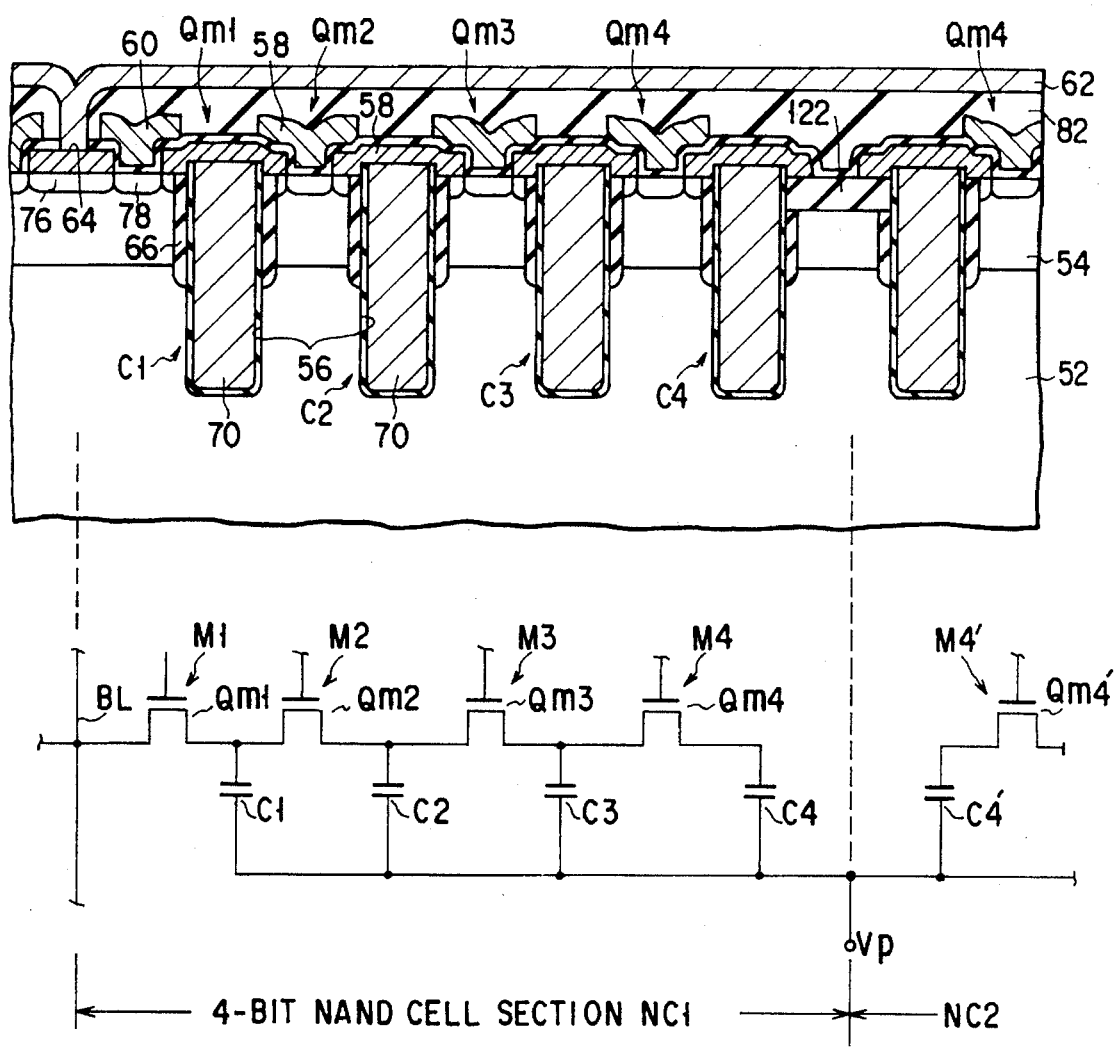

A NAND type DRAM device of FIG. 22 is similar to that shown in FIG. 21 with the separation transistor Ts being replaced with a dielectric layer 120, which may be equivalent in structure to the field separation layer 68 of FIG. 2A. With such an arrangement, since the regularity is still maintained in the DRAM cell structure, the same advantages as that of FIG. 20 can be attained.

Figure 23:
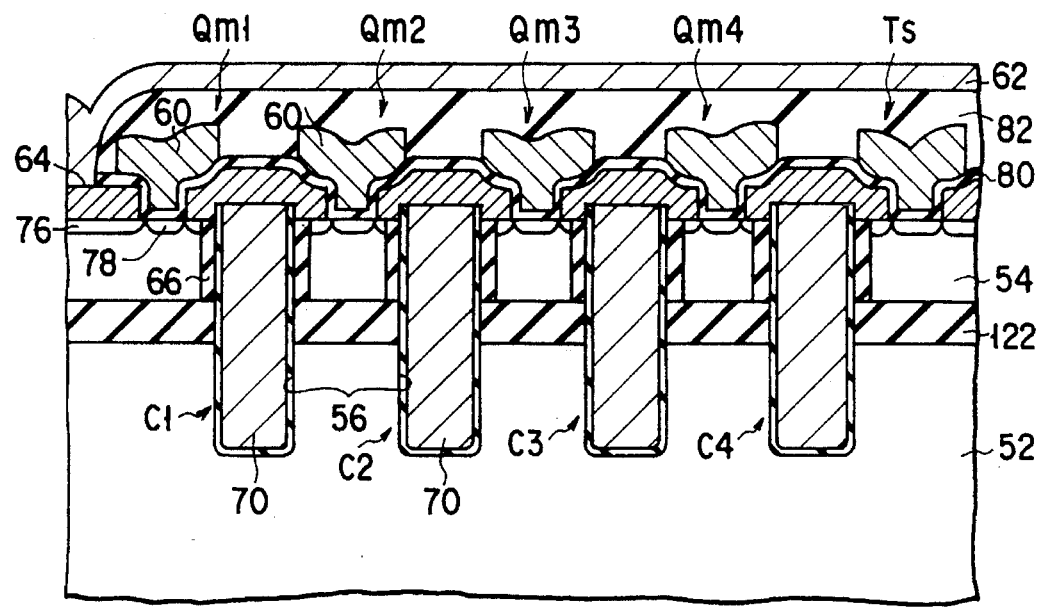
Figure 24:
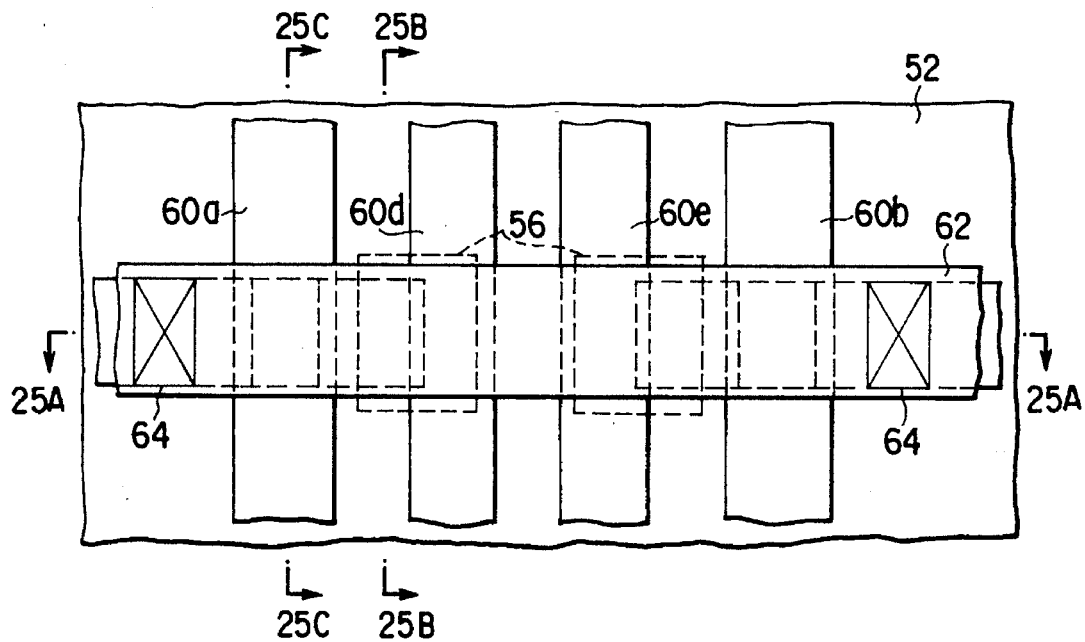
FIG. 24 shows a partial plan view of a DRAM device in accordance with the invention.

A NAND DRAM device of FIG. 23 is similar to that shown in FIG. 21 with an intermediate dielectric layer 122 being sandwiched between the substrate 52 and the well region 54. The layer 122 may be a silicon dioxide film of the thickness of 100 nm. Such a multi-layered silicon substrate structure may be fabricated by either (1) effecting the lapping process after laminating the SiO$_2$ film 122 on substrate 52, or (2) using a so-called SIMOX method for forming an epitaxial silicon layer, ion-implanting impurity thereinto and annealing the same at high temperature to form an oxide film in the silicon substrate. With such an arrangement, the electrical isolation of substrate 52 acting as a plate electrode can be made more effectively to permit a desired plate voltage Vp to be applied to the plate electrode.

Figure 25A:
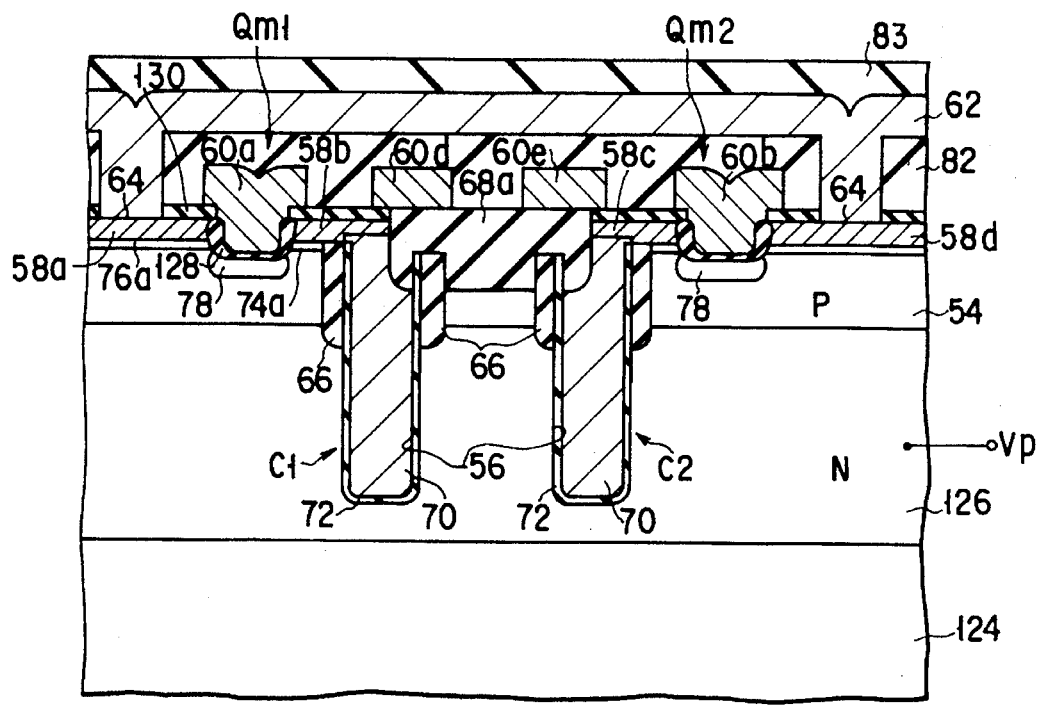
FIGS. 25A, 25B and 25C show three different cross-sectional views of the DRAM of FIG. 24 along lines 25A—25A, 25B—25B and 25C—25C in FIG. 24.

A DRAM device shown in FIGS. 24 and 25A–25C is similar to those of FIGS. 1–15 in that each of the trench-type one-transistor memory cells M is coupled to a corresponding bit line 62 at its contact section 64. As shown in FIG. 25A, the DRAM has a silicon substrate 124 of p type or n-type conductivity, which has an n-type well region 126. This well region functions as a cell plate electrode. The p-type well region 54 is formed in n-type well region 126.

The storage node of each of the trench capacitors C1, C2 consists of a trench-buried layer 72 and an island layer 58 overlying the layer 72, like the embodiment of FIG. 2A. A field insulation layer 68a for electrically isolating adjacent trenches 56 partly overlaps the trenches 56 at its opposite edge portions as shown in FIG. 25A. Y-shaped gate electrodes 60a, 60b of cell transistors Qm1, Qm2 insulatively overlie island layers 58. Other gates 60d, 60e extend in parallel to Y-shaped gates 60a, 60b on insulating layer 68a. Each cell transistor Qm1, Qm2 includes extremely thin source and drain regions 74a, 76a in the surface of the p-type well region 54. Regions 74a, 76a may be thermal-oxide films doped with n-type impurity such as As. The p-type well region is less in depth than the SiO$_2$ film 66 surrounding the upper portion of side-wall of trench 56. Y-shaped gates 60a, 60b are electrically isolated by a gate insulation film 128 from the underlying channel layer 78; each gate 60a, 60b is isolated from islands 58 by a SiO$_2$ insulating layer 130. Transistors Qm1, Qm2 are connected to a bit line layer 62 at corresponding contact portions 64.

Figure 25B:
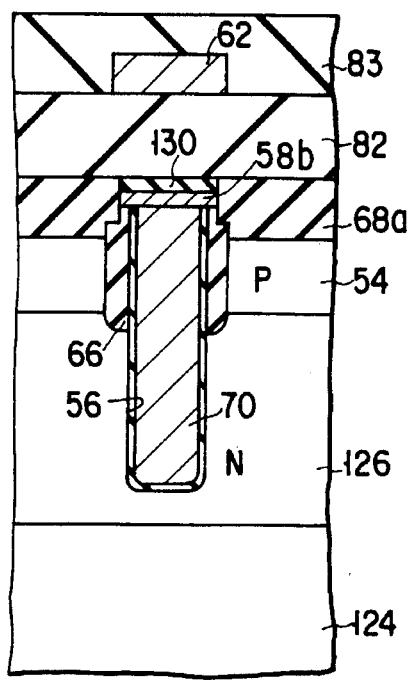
Figure 25C:
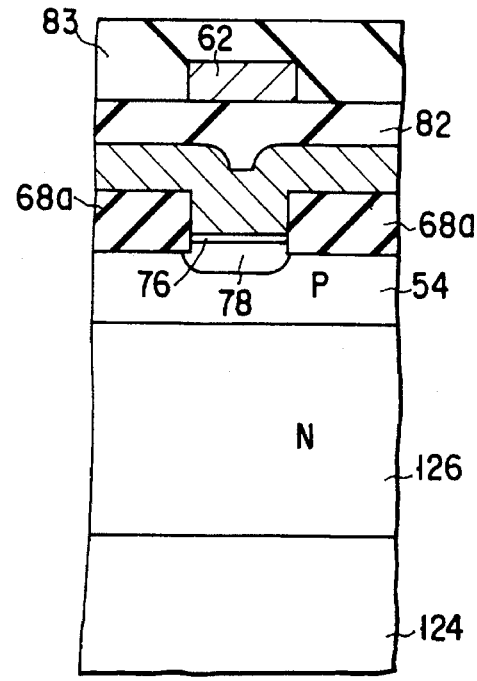
Figure 26:
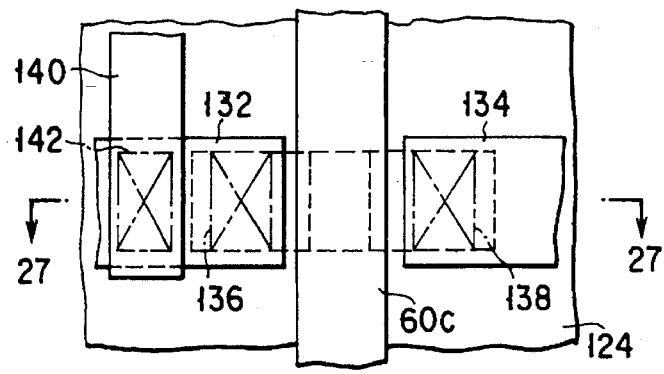
FIG. 26 shows a partial plan view of one of peripheral-circuit transistors arranged in the substrate of FIGS. 25A–25C.
Figure 27:
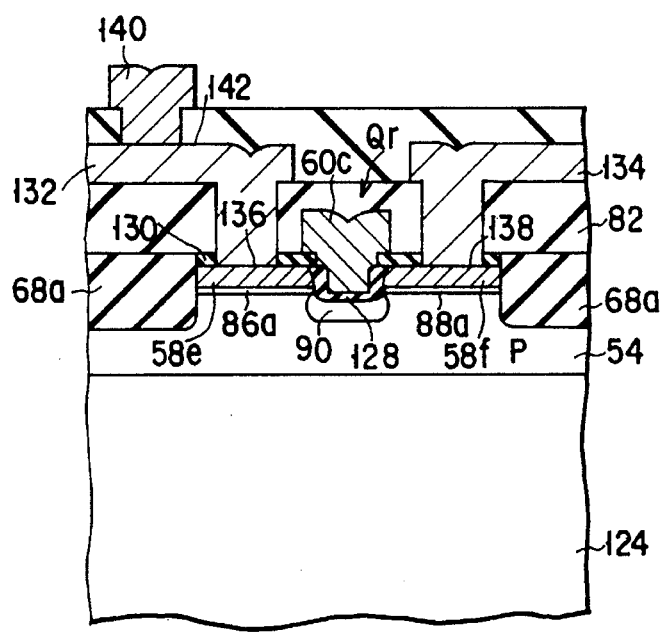
FIG. 27 shows a cross-sectional view of the transistor of FIG. 26 along lines 27—27 in FIG. 26.

One of the MOS transistors formed in the peripheral-circuit area on the substrate 124 of FIGS. 25A–25C is shown in FIGS. 26–27. This peripheral-circuit transistor Qr is similar in structure to the cell transistors Qm1, Qm2 of FIGS. 25A–25C. As shown in FIG. 26, wiring layers 132, 134 are respectively connected to the island layers 58e, 58f at contact portions 136, 138. The layers 132, 134 extend in a direction transverse to the gate electrode 60c above the substrate 52. A wiring layer 140 parallel to gate 60c is connected to a layer 132 at a contact portion 142. Naturally, either an NMOS transistor or PMOS transistor can be attained by adequately designing the conductivity types of well region 54, shallow source/drain regions 86a, 88a, and channel region 90.

The manufacturing method of the DRAM of FIGS. 24–27 is as follows. A chosen n-type impurity is doped into the silicon substrate 124 under the application of an acceleration voltage of several MeV, thus forming a first well region 126 of n-type conductivity therein to the depth of approximately 2 to 8 micrometers. At this time, the impurity concentration at the surface of the substrate 124 is kept at a low level; the impurity concentration becomes higher in well region 126 only. Such a structure is known as a "retrograded well" structure.

Next, a p-type impurity is doped into only the memory cell array area of the substrate 124 to form a second well region 54 of p-type conductivity, which has the depth of approximately 2 micrometers. At the same time, the same well region is formed in the peripheral-circuit area of substrate 124, decision of the conductivity type of the well region is the obvious design choice and may be made depending on the channel conductivity type of a MOS transistor in the transistor forming area; for example, in the case of PMOS transistor, the well region may have an n-type conductivity by doping n-type impurity. The epitaxial technique may be used to form the well regions 126, 54.

Figure 28A:
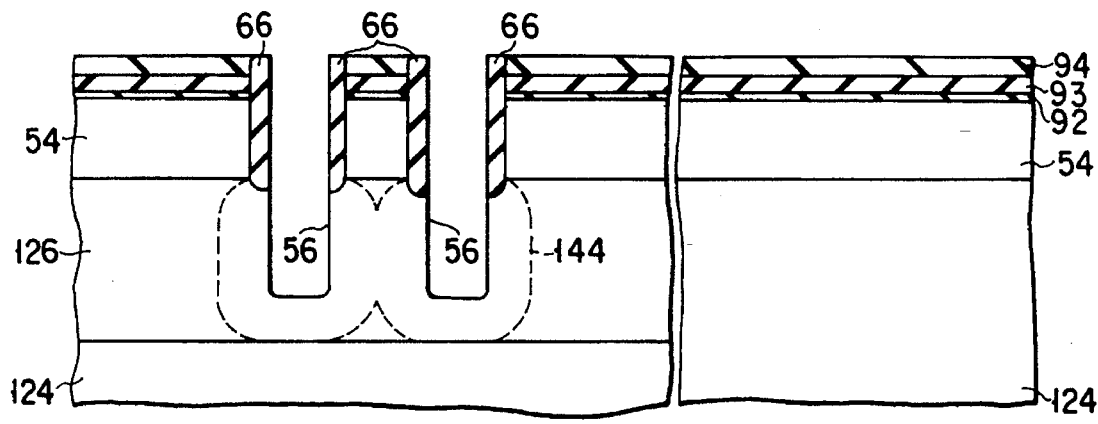
Figure 31:
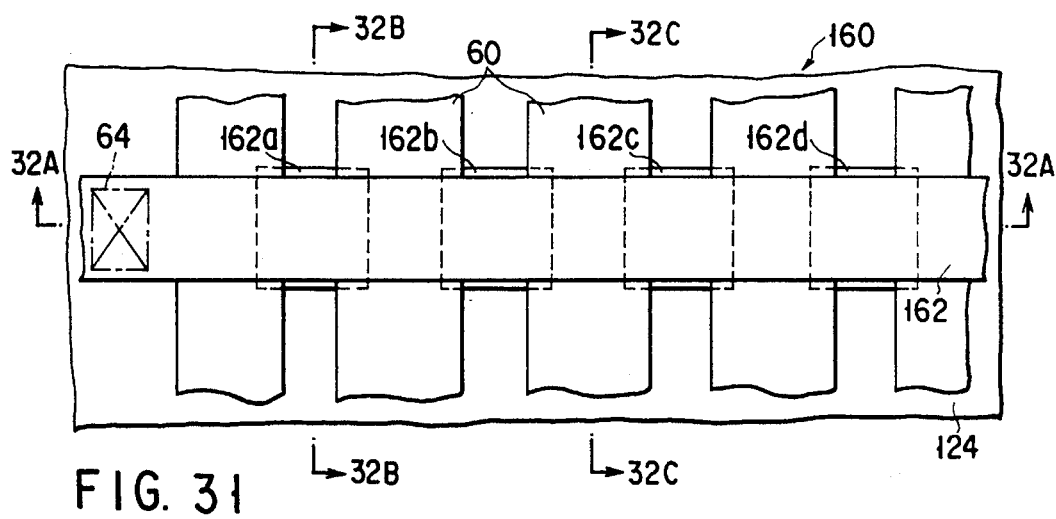

Then, a $SiO_2$ buffer layer 92, $Si_3N_4$ film 93 and $SiO_2$ film 94 are stacked in this order on the entire surface of the substrate 124. The thicknesses of the layers 92, 93 and 94 may be approximately 10 nm, 100 nm and 500 nm, respectively. The lithography and reactive ion etching (RIE) process are effected to sequentially etch the stacked layers 92–94 to form trench openings therein. Each trench opening is square, which measures 0.4 micrometers in length at each side. The RIE process is performed, with the etched layer 93 used as a mask, to form first trenches of approximately 2 micrometers deep in the substrate 126. After the RIE damage recovery process is effected for the trench inner wall surface, a $SiO_2$ layer 66 is deposited to a thickness of approximately 50 nm on the entire inner wall surface of the trench. The RIE etching is effected again to remove the $SiO_2$ layer lying on the bottom portion of each trench. Substrate 124 is further etched by the RIE technique, by using $SiO_2$ layer 66 left on the layer 94 and trench inner wall as a mask, thereby to form second trenches as shown in FIG. 28A. The trenches are 4 micrometers deep, for example. The resultant trenches 56 are finally 6 micrometers deep. The damage-recovery process to be effected after this is the same as that effected in the embodiment as described with reference to FIG. 7A.

An n-type impurity such as As, for example, is doped to a concentration of $1 \times 10^{19}$ atoms per cubic centimeter in the substrate area exposed by formation of the trenches 56, so that a lightly-doped n-type region 144 is formed in the first well region 126. Region 144 surrounds adjacent trenches 56. Region 144 is coupled to the $SiO_2$ layer 66 at its upper portion. The bottom portion of region 144 is almost in contact with the interface between well region 126 and substrate 124. Doping of As may be done using the thermal diffusion technique.

A capacitor insulation thin-film layer 72 and a storage node layer 70 are sequentially deposited on the entire surface of the resultant structure. Layer 72 may be an NO thin-film. Layer 70 may be made from As-doped amorphous silicon of approximately 400 nm thick. Chemical/mechanical polishing is effected to continuously polish the layers stacked on the substrate 124. The polishing is controlled to stop at the layer 93. The polishing control technique itself is known. Thus, there is obtained the substrate structure having layers 70, 72 left in the trench 56 and being flat on its top surface as shown in FIG. 28B.

The capacitor insulation film 72 may be made from another material (for example, a film of ferroelectric material such as $Ta_2O_5$, $SrTiO_3$, or a mixture thereof) if it can withstand the succeeding heat treatment. In the case of NO film, a thermal oxide film of 2 nm thickness is formed on a $Si_3N_4$ film of 6 nm thickness to form a capacitor insulation film 72 with a thickness of approximately 5 nm which is expressed in terms of the effective thickness of the $SiO_2$ film.

The thermal oxidizing treatment is performed only at the exposed surfaces of trench-buried layers 70 to form $SiO_2$ films of approximately 10 nm thickness thereon. The CDE process using a $CF_4$ gas and chemical process using a hot phosphoric acid solution are effected with the above film used as a mask so as to remove the top layer 93 of FIG. 28B. After the underlying buffer layer 92 of FIG. 28B and the $SiO_2$ films on the trench-buried layer surfaces are removed, an impurity-doped polysilicon layer 58 is deposited to a thickness of 150 nm on the entire surface of the resulting exposed substrate. The deposited layer 58 has convex portions in the trench-buried layers 70. The convex portions are removed by the polishing process to make the entire surface of the substrate structure flat.

Next, a $Si_3N_4$ film 130 is deposited to a thickness of 150 nm on the planarized layer 70. Selected conductivity types of impurities are ion-implanted into the layer 50 via film 130. For example, n-type impurity such as As is used for the memory cell array of the substrate 124 and is doped into the layer 58 with the dose amount of $5 \times 10^{15}$ atoms per square centimeter to make the layer 58 have N-type conductivity of increased concentration. $BF_2$ is used as p-type impurity for PMOS transistor forming portions in the peripheral-circuit area of substrate 124. $BF_2$ ions are selectively doped into layer 58 under a condition corresponding to the dose amount of $5 \times 10^{15}$ atoms per square centimeter and the impurity-doped portions are made to have p-type conductivity of increased concentration. Then, the thermal diffusion process is effected to outdiffuse n-type and p-type impurities doped into layer 58 to the substrate surface (that is, surface of the well region 54), thereby forming shallow impurity-diffused regions 146, 147 having corresponding conductivity types which will act as the source/drain regions 74a, 76a, 86a, 88a of MOS transistors in the cell array and peripheral-circuit areas. The shallow impurity layers 146, 147 may be formed by ion-implantation instead of diffusion. The ion-implantation may be effected before deposition of the layer 58.

Then, the lithography process and RIE process are effected with a patterned photoresist layer (not shown) used as a mask, and a wide and shallow groove 148 overlapping the adjacent trench-buried layers 70 is formed as shown in FIG. 28C. At the same time, similar grooves 149 are formed in element isolation portions of the peripheral-circuit area. As shown in FIG. 28C, insulating layers 68a are buried as element-isolation layers into grooves 148, 149. The thickness of the layer 68a is approximately 500 nm. The layers 68a may be made from CVD-TEOS $SiO_2$. A thermal-oxide thin-film or $Si_3N_4$ film of approximately 10 nm thickness may be additionally formed to overlie the film 68, if necessary. Element isolation layer 68a is subjected to surface polishing and made flat. In reducing this invention to practice, impurity doping into the layer 58 and formation of the shallow regions 146, 147 may be effected after formation of element-isolation layer 68a.

Next, grooves are formed in portions of the layers 58, 130 corresponding to the channel regions of MOS transistors in the cell array area and peripheral-circuit area and the substrate surface portions underlying the above layers so as to form island layers 58a–58f and source/drain regions 74a, 76a, 86a, 88a as shown in FIG. 28D. Formation of the grooves permits the impurity-doping for adjusting transistor threshold-voltage to be selectively effected in the exposed substrate surface portions in the same manner as described before so as to form channel regions 78, 90. The inner wall surfaces of the grooves are covered with insulating thin films 128. Then, gate electrodes 60a–60e are formed on the layer 130 by use of a known patterning technique by a known method. The process for obtaining a structure shown in FIGS. 25A–25C and 27 from the structure of FIG. 28D will be easily understood by those skilled in the art without special activity and therefore the detail explanation therefor is omitted here.

The significance of the manufacturing method is that trench-cell DRAMs with high integration, high reliability and high performance can be manufactured with high yield of production and the minimized number of steps without using special processes which are risky for the semiconductor manufacturers. Since the highly-doped impurity layers 74a, 76a, 86a, 88a which serve as source and drain regions of transistors are formed in the substrate surface portion, the total resistance of the source and drain regions can be lowered even if the junction depth in the substrate is reduced. Since the bit-line contact portions and wiring contact portions are entirely disposed on the polysilicon layer rather than the substrate, it is possible to suppress or eliminate the occurrence of crystal defects caused by stress due to a difference in the thermal expansion coefficient of the stacked structure of different layers of different materials and complicated substrate structure or an increase in the junction leak caused by the crystal defect. Further, since the threshold-voltage adjusting impurity layers 78, 90 are selectively formed in the channel regions of the MOS transistors with the polysilicon layer 58 used as a mask, the junction leak and/or junction capacitance between the source/drain and the substrate can be reduced.

A DRAM device of FIG. 29 is a NAND-cell DRAM obtained by using the trench-cell structure shown in FIGS. 24 and 25A–25C in respective cells of a 4-bit NAND cell section. Each of the separation transistor Qr and transistors Qm1–Qm4 of the cells M1–M4 connected to a bit line 62 corresponding to the contact portion 64 employs the typical transistor structure shown in FIG. 25A. With the embodiment, the integration density of the DRAM can be further enhanced while maintaining the advantages described before.

An important key technique in the manufacturing process shown in FIGS. 28A–28D is the timing at which impurity doping into the polysilicon layer 58 of FIG. 28C is effected. In the above-described embodiment, the transistor channel regions 78, 90 are formed after various types of impurities doped in the polysilicon layer 58 are outdiffused therefrom into the substrate surface portion including channel regions to form source and drain regions. Alternatively, the impurity doping into the layer 58 may be effected before the formation of the source and drain regions, as will be described below.

See FIG. 30A, wherein non-doped island polycrystalline layers 58e, 58f of a peripheral-circuit transistor are formed on the substrate. The element isolation, formation of an insulating film 128 on the channel groove, formation of a channel region 90, and formation of a Y-shaped profile gate electrode 60c have been already completed. A thin thermal oxide film 150 and insulating layer 152 are patterned and selectively formed on the gate electrode 60c. Layer 150 may be a $SiO_2$ film. Layer 152 may be a $Si_3N_4$ film of 200 nm thickness. As indicated by arrows 154, an impurity of selected conductivity type is ion-implanted into island layers 58e, 58f with layers 150, 152 being as a mask. Obviously, during this process, channel region 90 is kept in a state so as not to be subjected to the ion-implantation of impurity. Then, the thermal diffusion process is effected so that shallow source and drain regions 86a, 88a are selectively formed in the substrate surface portion, as shown in FIG. 30B, due to the impurity outdiffusion from layers 58e, 58f.

A NAND-type DRAM device 160 shown in FIGS. 31 and 32A–32C is similar to that of FIGS. 17 and 18A–18C with (1) the substrate 52 being replaced with the substrate 124 having first and second well regions 126, 54 of FIG. 25A, (2) the bit-line contact island-shaped layer 58a of FIG. 18A being removed causing the bit line 62 to be directly contacted with impurity region 76, and (3) each of the island layers 58 of FIG. 18A being replaced with "half-buried" island layers 162a–162d.

A structural feature of the DRAM 160 is that a part of the gate electrode 60 extends above the trench 56. In other words, gate 60 has the opposite edge portions, each of which overlies adjacent ones of trenches 56 as typically shown in FIG. 32A. This means that a trench-capacitor can be formed at a part of the gate electrode area. With such an arrangement, the opening size of each trench 56 can be increased, while causing the trench depth not to increase. Therefore, the storage capacitance can be increased while preventing the element surface configuration and the memory-cell area from becoming greater.

Figure 32A:
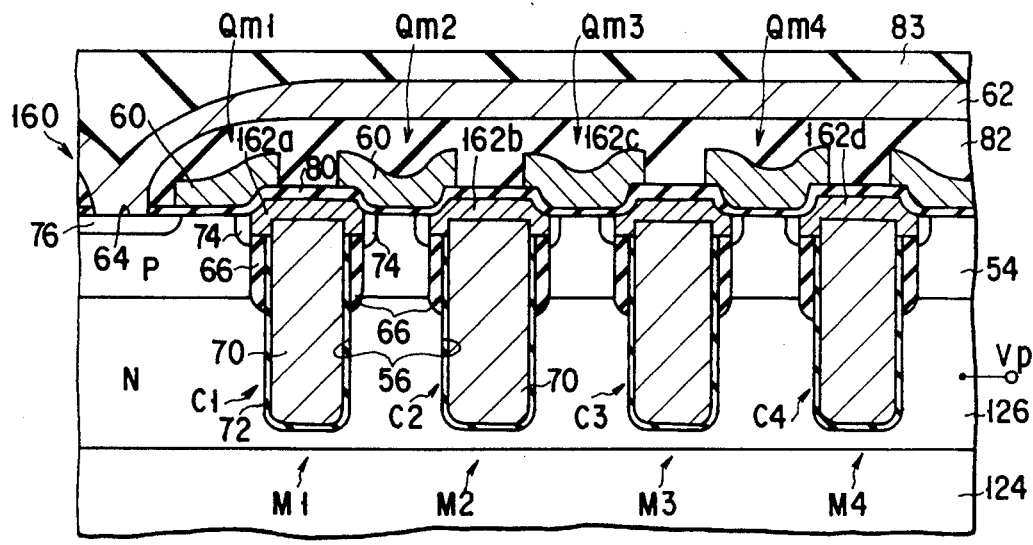
Figure 32B:
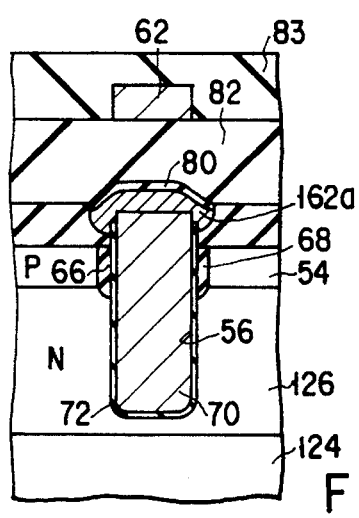
Figure 32C:
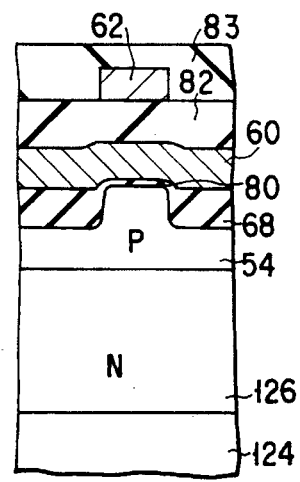

As shown in FIG. 32A, a trench capacitor Ci (i=1, 2, 3, 4) of each of series-connected memory cells M1–M4 has a trench-buried storage-node polysilicon layer 70 whose top portion is arranged at a level positionally substantially equal to or lower than the substrate surface. A capacitor insulating thin-film 72 and side-wall leak-inhibition dielectric layer 66 in each trench 56 has a "submerged" top surface which is positionally lower than the top surface of layer 70. In each trench 56, a half-buried island layer 162 overlies the layers 66, 70, 72. Island layer 162 has a profile of "square bracket" shape. The main portion of the bracket, which lies horizontally, is at substantially the same positional level as the substrate surface as shown in FIG. 32A.

With the embodiment, the resistance between adjacent cell transistors Qm1, Qm2 in the storage electrode can be decreased to accelerate the flow of signal current therebetween, in addition to the aforementioned feature that "the mutually connected sources/drains of adjacent transfer-gate transistors Qm on the trench-cell storage node are commonly formed" (in other words, adjacent cell transistors are connected together via the storage electrode). This can be said because, while the signal current path is relatively long due to the fact that each island layer 58 is positioned at a level higher than the substrate surface in the trench-cell structure of FIG. 18A, the current flow via the half-buried island layer 162a in the trench-cell structure of FIG. 32A is defined along a straight line substantially parallel to the substrate surface, thereby minimizing the current flow path.

Another advantage of the embodiment is that surface irregularities on the substrate surface of the NAND cell array can be suppressed by forming half-buried island storage-node electrodes 162a–162d. The suppression of a difference in positional level on the element surface leads to the achievement of high reliability of layers stacked on the element surface. Therefore, the operation reliability can be enhanced while maintaining the manufacturing yield of the NAND-type DRAM 160 high.

Figure 33A:
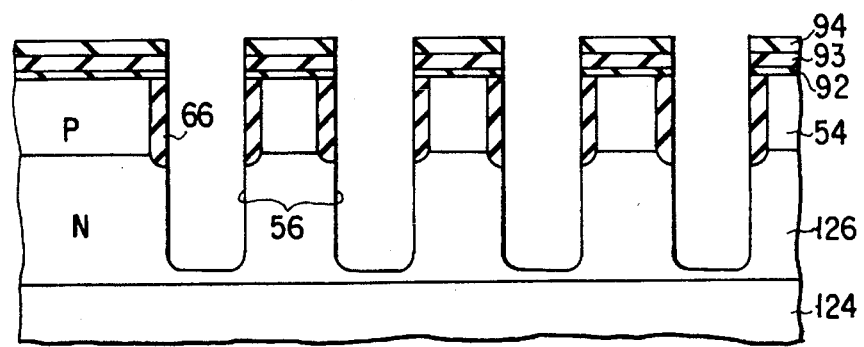
FIGS. 33A–33D illustrate, in schematic cross-section, some of major steps in the manufacturing process of the NAND DRAM of FIGS. 31 and 32A–32C.

The manufacturing method of the NAND-type DRAM 160 is as follows. First, referring to FIG. 33A, the substrate structure having trenches 56 is substantially the same as that shown in FIG. 28A. The manufacturing process is also the same. Note however that first and second well regions 126, 54 are formed in the silicon substrate 124 in a manner described before. The fabrication method of these well regions are the same as that described with reference to FIG. 28A.

Figure 33B:
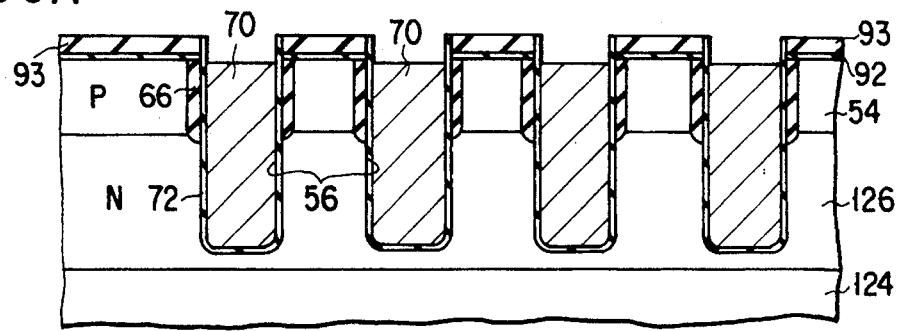

As shown in FIG. 33B, capacitor insulation films 72 and polysilicon layers 70 are formed in the trenches 56. The method is the same as that described before with reference to FIG. 28B. The polishing condition is adequately controlled so that the top surface of the layer 70 buried in each trench may be made substantially at the same level as the substrate surface.

Figure 33C:
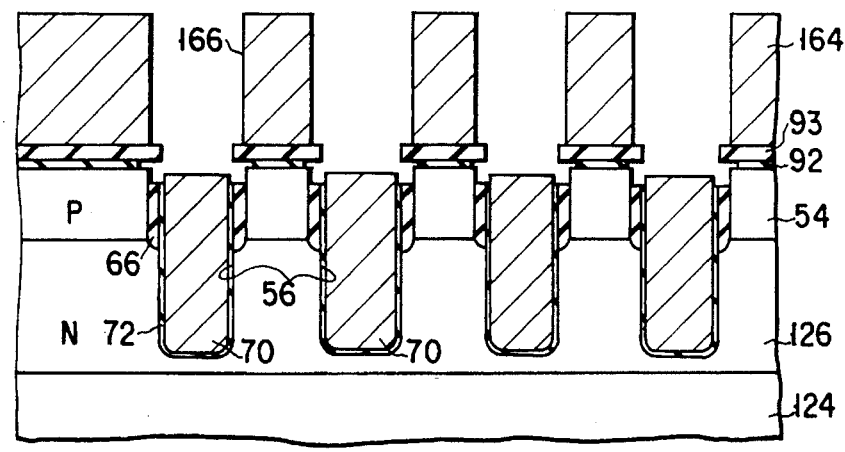
Figure 33D:
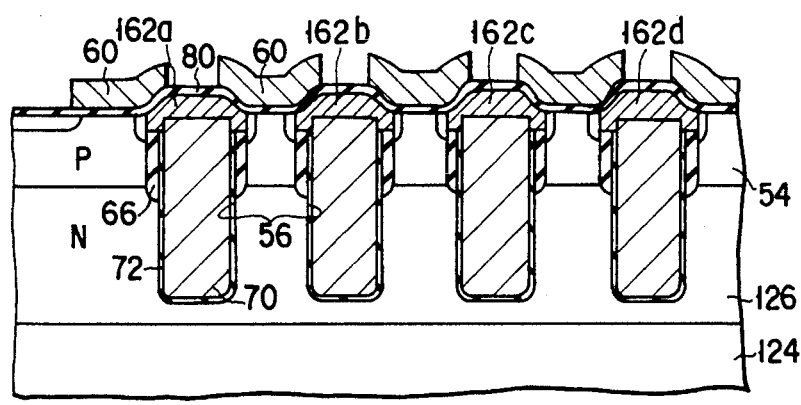

Since the next process is important, the explanation of it is will be given in greater detail as follows. A photoresist layer 164 is deposited on the entire surface of the structure of FIG. 33B. The photoresist layer is patterned so as to have openings 166 at positions corresponding to the openings of the respective trenches 56. The etching process is effected with the patterned resist layer 164 used as a mask to partly remove the capacitor insulation film 72 and side-wall layer 66 of each trench so that the top portions thereof will be set in a level lower than the top surface of the layer 70. It will be understood by carefully comparing FIG. 33C with FIG. 32A that the exposed surfaces of the layers 66, 70, 72 of each trench define the undersurface configuration of the bracket-shaped storage-node profile 162 of FIG. 32A. During the etching process, the SiO₂ buffer thin-film 92 on the substrate surface provides an opening slightly larger than that of its overlying Si₃N₄ layer 93, since the etching degree in the lateral direction becomes larger in the former layer than in the latter layer because of a difference in the etching rate.

After the resist layer 164 is removed, a natural oxide film formed on the exposed substrate surface is removed. An As-doped polysilicon layer 162 is then deposited to a thickness of approximately 300 nm on the entire surface of the resultant structure and is subjected to the surface polishing process; as a result, an array of island layers 162a–162d can be obtained on the respective trench-buried layers 70. At this time, the layer 93 acts as a polishing stopper. After removing the layers 92, 93, a gate insulation film 80 is formed to a thickness of approximately 10 nm to cover the exposed substrate surface and island layers 162a–162d. Formation of the gate insulation film is the same as that in the embodiments described before. Next, patterned gate electrodes 60 are formed to lie above the substrate and between the adjacent trenches 56. Ion-implantation is effected with the gate electrodes 60 as a mask, thereby to form the source and drain regions of the transistors Qm in the well region 54. If desired, as in the embodiments described before, impurity may be optionally doped into the channel region to adjust the threshold voltage.

The trench-cell structure in the above embodiment can also be applied to non-NAND type DRAM devices as demonstrated by some modifications as shown in FIGS. 34A–34C. First, referring to FIG. 34A, a DRAM having one-transistor trench-cell structure is shown, wherein each cell transistor is provided with a bit-line contact portion. Adjacent trenches 56 are electrically isolated from each other by an insulating film which is the same as the layer 68 of FIG. 2A. Individual trench structures are basically similar to that of FIG. 32A; however, the half-buried bracket-shaped storage-node layers 162 of FIG. 32A are replaced with half-buried "L"-shaped storage-node layers 168a, 168b. The "L"-shaped storage-node profile is set in substantially the same level in position as the substrate surface so as to cause the substrate surface configuration to moderate or decrease.

A DRAM of FIG. 34B is similar to that shown in FIG. 34A with the trench side-wall insulator 66 being replaced with an inner dielectric layer 170, and the trench-buried storage-node layer 70 being replaced by double-layered layers 70a, 70b in each of the trenches 56. Inner layer 170 may be made from SiO₂. Layers 170 have long vertical side wall portions which reach the substrate surface in the facing side walls of the trenches 56 lying on the opposite sides of the field isolation layer 68. Their opposite side-walls terminate on the half way to the substrate surface so as to permit the overlying storage-node layer 70b to be in direct contact with a corresponding n-type transistor current-carrying layer (i.e., source or drain) 74 in each trench 56. With such an arrangement, since the trench side-wall insulator 170 is arranged in each trench 56, a distance between the adjacent trenches 56 can be reduced. Therefore, the integration density of trench capacitors can be improved; alternatively, the capacitance of the cell capacitor can be increased by increasing the area of the opening of each trench 56.

The trench cell structure of FIG. 34B can be fabricated by use of one of the presently available fabrication techniques as will be explained below. After the trenches 56 are formed in the substrate 124 by the afore-mentioned method, impurity-doped polysilicon layers 70a are buried therein. An etching process is effected to remove substantially upper half portions of buried layers 70a. A SiO₂ film is formed to a thickness of approximately 50 nm in each trench. The RIE process is effected to form an opening in the bottom portion of the SiO₂ layer in each trench to expose the underlying layer 70a in the opening. A layer 70b is buried in each trench to provide a double-layered storage-node layer structure. Next, in each trench, an island layer 168a having an "L"-shaped profile is formed. An impurity diffusion process is effected to diffuse impurity from the layer 168a into the substrate 124 (well region 54) so as to form an impurity-doped region 74 serving as one of the source and drain regions of a corresponding cell transistor.

A DRAM of FIG. 34C is similar to that shown in FIG. 34A with the field-separation layer 68 of FIG. 334A being replaced with the laterally-extended layer 68a shown in FIG. 25A. The trench-cell structure is obtained as the result of formation of the field separation layer 68a (that is, trench separation process) effected after trench-cell capacitors are formed. With the embodiment, exposure of corners of the element separation portion of a MOS transistor in each cell can be suppressed or inhibited, thereby making it possible to prevent occurrence of a parasitic channel.

Several embodiments of the NAND-type DRAM device shown in FIGS. 16–19 are introduced. First, referring to FIG. 35 and FIGS. 36A–36B, a NAND-type DRAM device 180 has a heavily-doped p (p+) type silicon substrate 182 in which the p-type well region 54 of FIG. 18A is formed. The n-type substrate 52 shown in FIG. 18A may alternatively be employed in this embodiment. Each trench capacitor Ci (i=1, 2, 3, 4) has the insulated storage-node layer section having the T-shaped profile which consists of the trench-buried layer 70 and its overlying square island layer 58.

Figure 35:
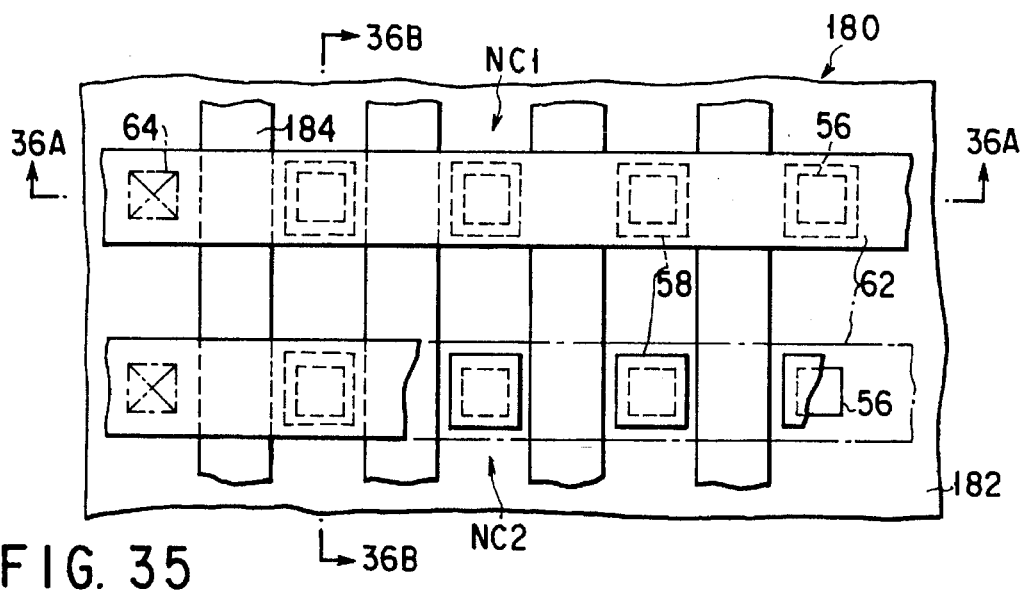
FIG. 35 is a partial plan view of a NAND-type DRAM device also embodying the invention.

As shown in FIG. 35, cell transistors Qm1–Qm4 have insulated gate electrodes 184 which extend in parallel on the substrate. Each gate electrode is insulated from the substrate by a gate insulation film 80 and serves as a word line. The island layer 58 of each cell capacitor Ci is arranged between adjacent ones of the gate electrodes 182. The gate electrodes 184 do not overlap with the island layers 58 and have a "dash" (–) shaped profile. As shown in FIG. 36B, adjacent cells of adjacent NAND cell sections NC1, NC2 are electrically isolated from each other by a field insulation film 186 formed in the element isolation area of the substrate 182.

Figure 37A:
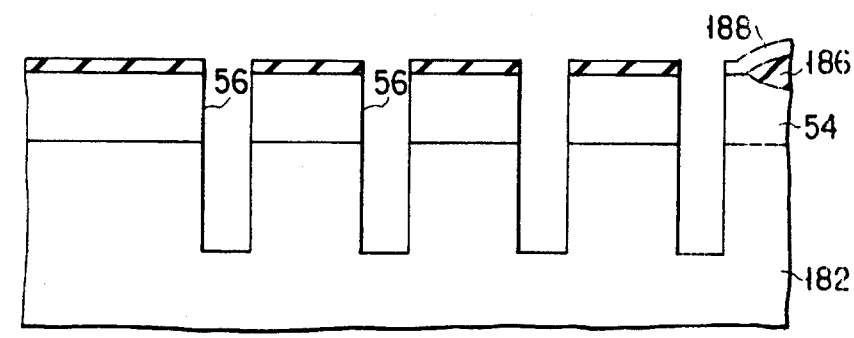
FIGS. 37A–37D illustrate, in schematic cross-section, some of major steps in the manufacturing process of the NAND DRAM device of FIGS. 35 and 36A–36B.

The NAND-type DRAM 180 may be manufactured as follows. The substrate 182 is doped with p-type impurity such as B to a concentration of $1\times10^{19}$ atoms per cubic centimeter. Epitaxial growth is effected to form a well region 54 to a thickness of 1 micrometer on the substrate 182 in such a manner that well region 54 is doped with B to a concentration of $1\times10^{15}$ atoms per cubic centimeter. A field insulation film 186 which is patterned to define a memory-cell array forming area is formed on substrate 182. Boron (B)-ion implantation is effected only for the cell-array area of substrate 182 and the impurity concentration of well region 54 is optimized by a known well-diffusion technique. A silicon dioxide layer 188 which is patterned to define openings of trenches 56 is formed on substrate 182. Then, lithography and RIE process are performed with layer 188 being used as a mask to form trenches 56 as shown in FIG. 37A. The trench depth is 5 micrometers, for example.

Figure 37B:
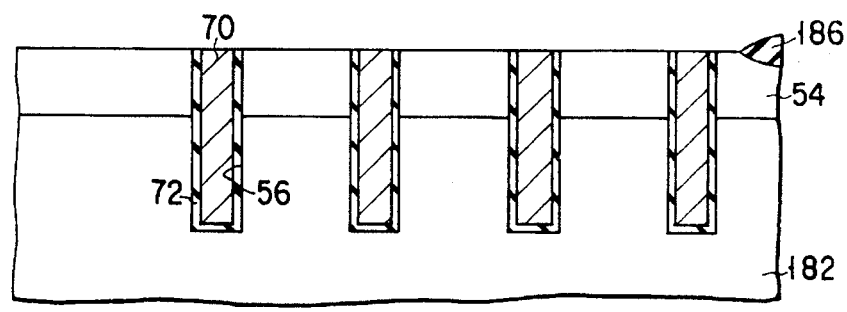

Next, a capacitor insulation film 72 is formed to cover the inner walls of the trenches 56. The material and thickness of the capacitor insulation film are the same as those of the afore-mentioned embodiment. A polysilicon layer 70 is deposited on trenches 56 to have a layer portion buried in trenches 56. The polysilicon layer is doped with a n-type impurity such as phosphorus (P). An etching process is effected to leave the stacked layers 70, 72 in each trench 56 and remove the other layer portion as shown in FIG. 37B.

Figure 37C:
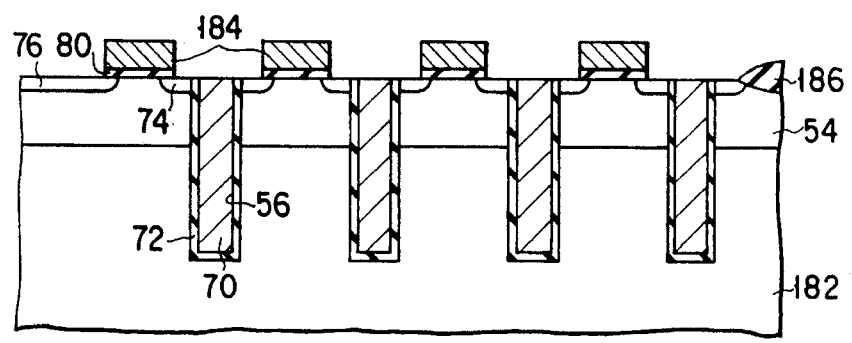

Then, an insulation thin-film serving as the capacitor insulating film 80 and a second polysilicon layer serving as the gate electrodes 184 are formed on the well region 54 of the substrate 182. The above layers are patterned by use of the lithography and RIE technique so as to form parallel gate electrodes 184 as shown in FIG. 37C. Impurity ion-implantation is effected with gates 184 as a mask so as to form source and drain regions 74, 76 of cell transistors Qm in well region 54.

Next, a third polysilicon layer is deposited on the entire surface of the resultant structure and is then doped with impurity. The third polysilicon layer doped with impurity is patterned by use of the lithography and RIE technique so as to form a plurality of divided island layers 58 which overlie the respective trench-buried layers 70 as shown in FIG. 37D. The planar arrangement of the above layers is shown in FIG. 35. After this, bit lines are formed to extend above the gate electrodes 184 in a direction perpendicular to the electrodes to provide a trench-type DRAM profile of FIGS. 36A and 36B.

Figure 36A:
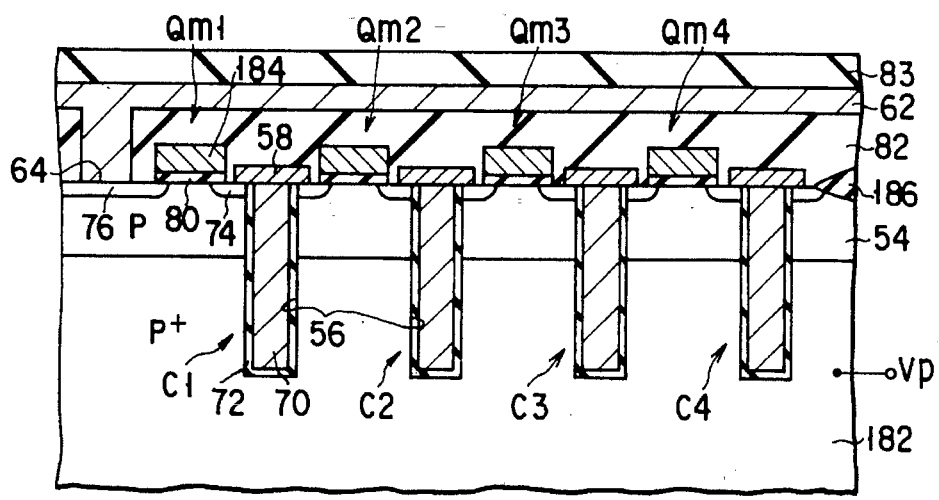
FIGS. 36A and 36B are two different cross-sectional views of the DRAM along lines 36A—36A and 36B—36B.
Figure 36B:
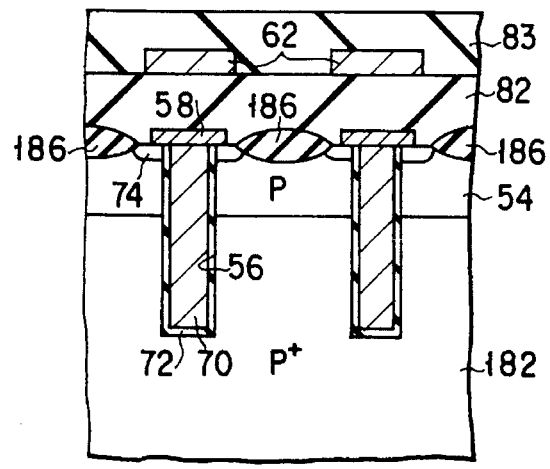
Figure 37D:
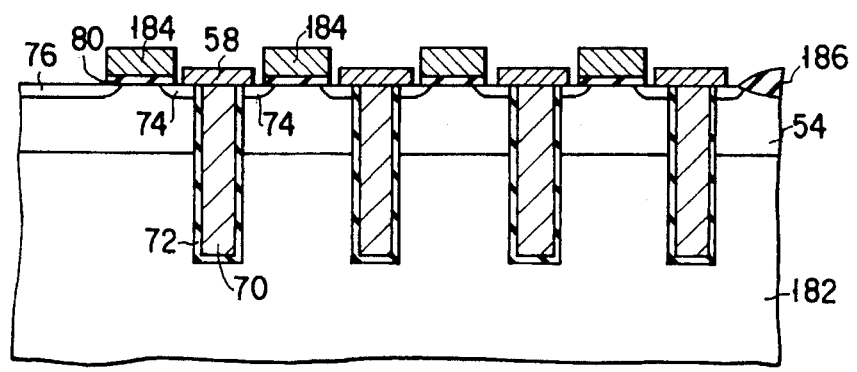
Figure 38:
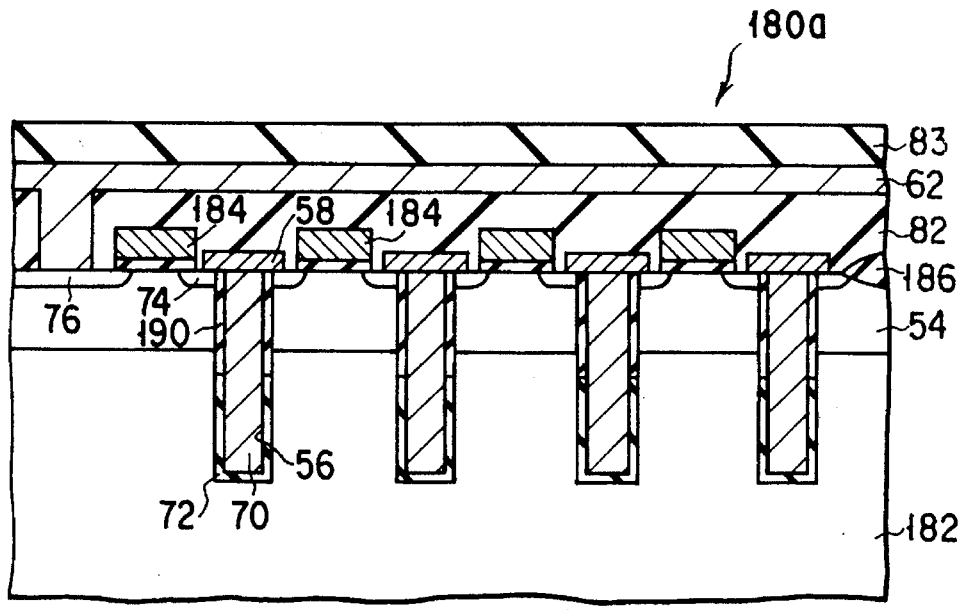
FIGS. 38 and 39 show the cross-sectional structures of modifications of the NAND DRAM of FIGS. 35 and 36A–36B.

A NAND DRAM 180a shown in FIG. 38 is similar to that of FIG. 36A with the trench-capacitor insulation film 72 being partially replaced at its upper half portion with a silicon dioxide film 190 in each trench 56. The thickness of the film 190 is set independently from that of its underlying film 72 due to the fact that film 190 is formed during a separate fabrication process. By forming only the film 190 relatively thick, the cell capacitance can be increased while keeping the dielectric strength between the storage-node layer 70 and a corresponding transistor active region 74 high.

Figure 39:
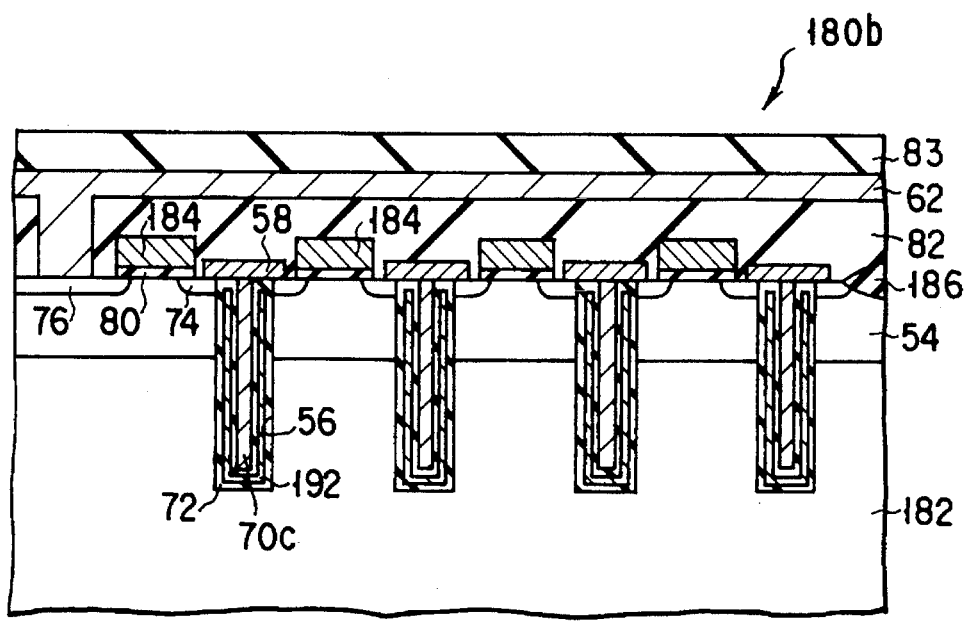

A NAND DRAM 180b shown in FIG. 39 is similar to that of FIG. 36A with the insulated storage-node layer 70 being replaced with a thinner storage-node layer 70c, and with an insulated "U"-shaped profile plate electrode 192 being added in each trench 56. The additional electrode 192 insulatively surrounds storage-node layer 70c in each trench 56, thereby releasing the substrate 182 from a role of a common plate electrode for all of the trench capacitors. According to the "individual" plate electrode structure, the plate voltage Vp can be independently set for each cell capacitor Ci.

Figure 40:
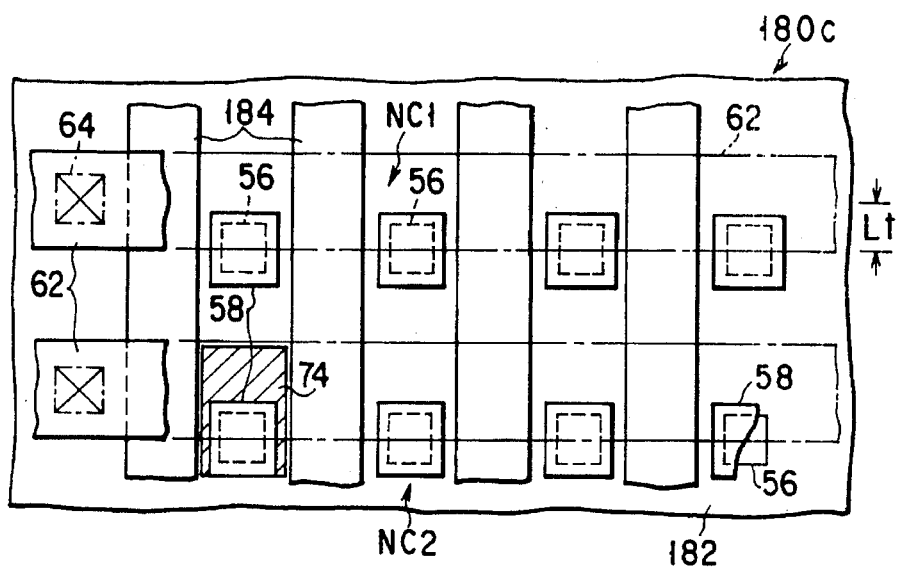
FIGS. 40–42 are the plan views of modifications of the NAND DRAM.
Figure 41:
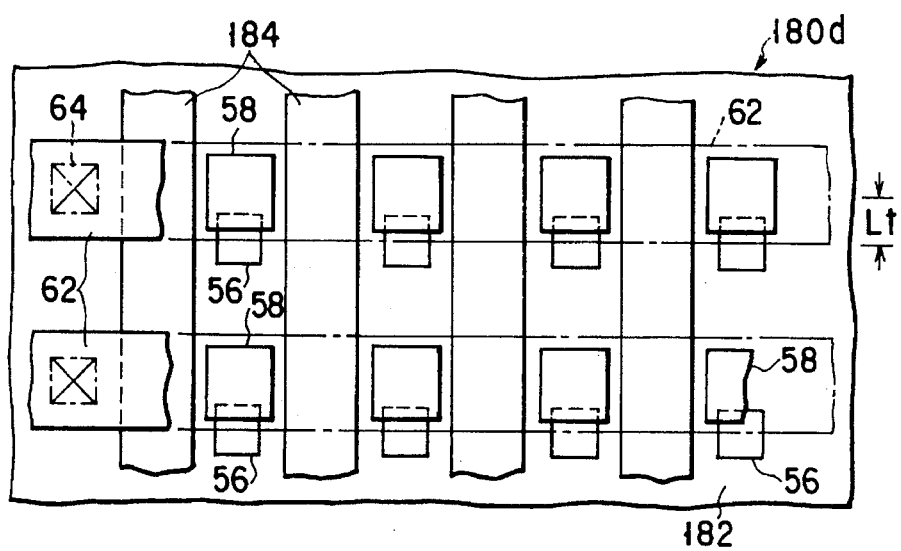
Figure 42:
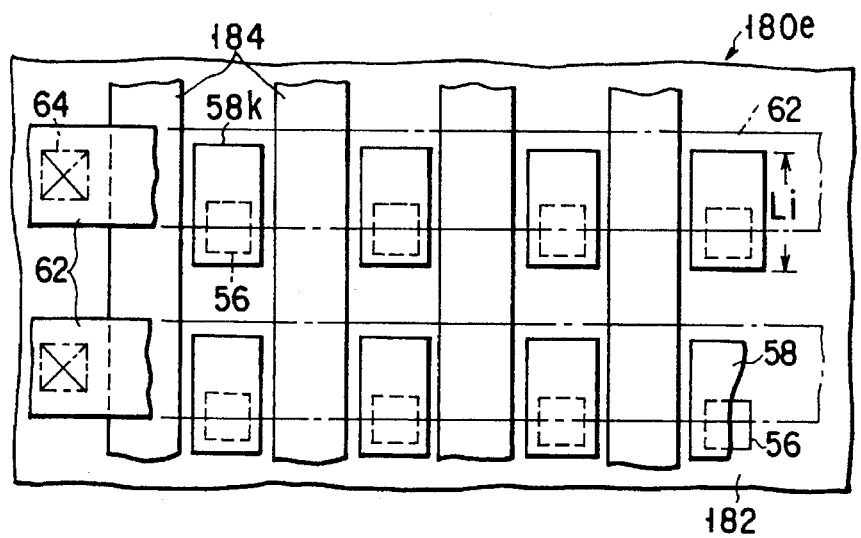

The planar arrangement of the trench capacitors of the NAND RAM 180 of FIG. 35 may be modified as shown in FIGS. 40–42. In the first place, according to a NAND DRAM 180c of FIG. 40, the array of trenches 56 in each NAND cell section NC1, NC2 is positionally deviated from the central line of a corresponding bit line 62 by a distance Lt. In FIG. 40, for simplifying the drawing, only one trench 56 lying in the lower left portion is shown with the schematic plane configuration of the source/drain region 74 indicated by hatching. With such an arrangement, each trench 56 is displaced in a direction in which the word line (184) extends so as to increase the area of the substrate portion provided directly below a corresponding bit line for formation of the source (or drain) of a transistor. Therefore, the area of the source (or drain) of adjacent transistors of adjacent NAND cell sections can be increased. This makes it possible to effectively suppress an increase in the source/drain resistance caused by the presence of the trench.

A NAND DRAM 180d of FIG. 41 is similar to that of FIG. 35 with the array of trenches 56 being positionally shifted by the distance Lt along the direction of parallel word lines (gate electrodes) 184 in the same manner as in FIG. 40, while having the island storage-node layers 58 stationary at the position beneath the bit lines 62. With such an arrangement, a contact area between the source (or drain) and a corresponding island layer 58 can be increased in addition to the effect obtained by the DRAM 180c. In each trench cell, an electrical connection resistance between the capacitor Ci and the transistor Qmi can be lowered.

A NAND DRAM 180e of FIG. 42 is similar to that of FIG. 35 with the array of trenches 56 being positionally shifted by the distance Lt along the direction of parallel word lines (gate electrodes) 184 in the same manner as in FIG. 40, and with each of the island storage-node layers 58 being replaced by an enlarged one 58k of the length Li. The structure is a combination of the embodiment of FIG. 40 and the embodiment of FIG. 41. With such an arrangement, all of the advantages associated with the planar arrangement of trenches of FIGS. 35, 40 and 41 can be obtained.

Figure 43:
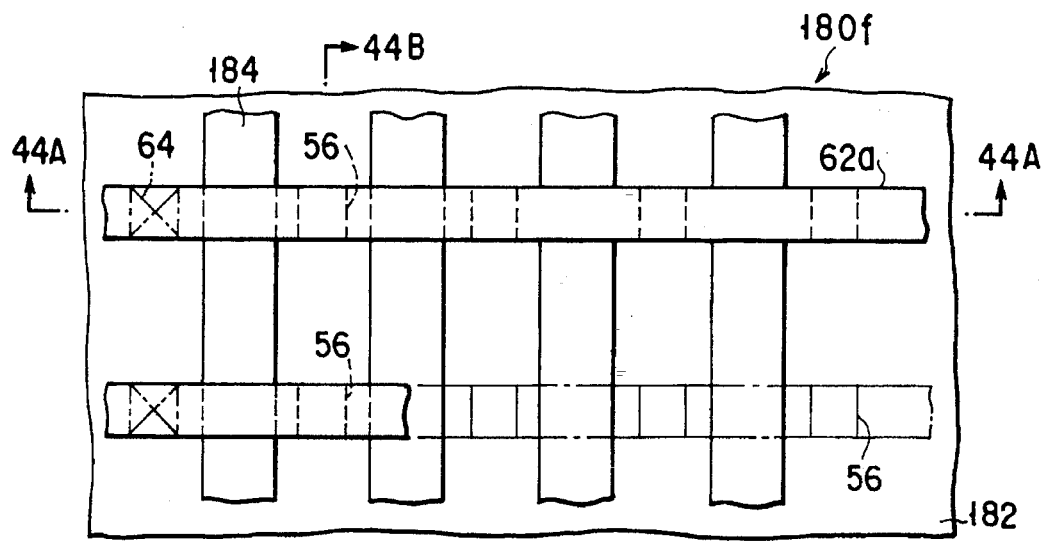
FIG. 43 is a partial plan view of a NAND-type DRAM device also embodying the invention.
Figure 44A:
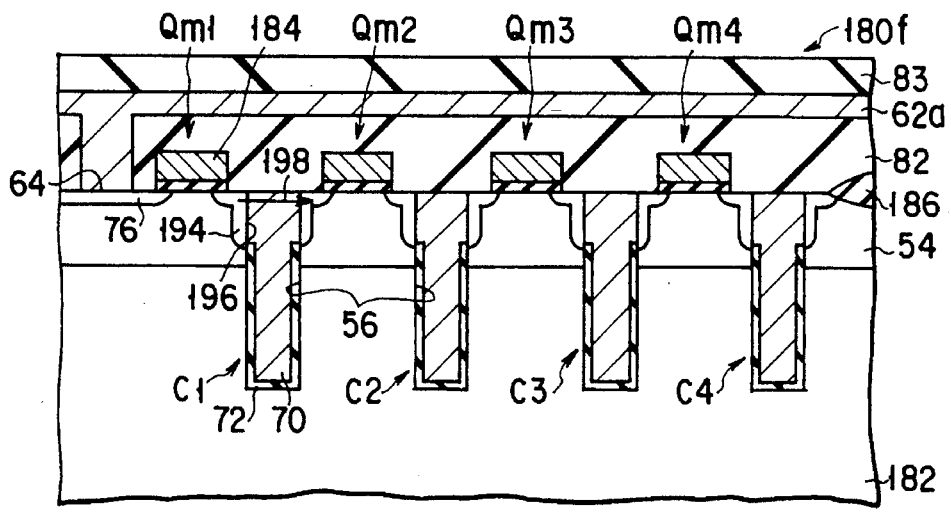
FIGS. 44A and 44B are two different cross-sectional views of the DRAM along lines 44A—44A and 44B—44B.
Figure 44B:
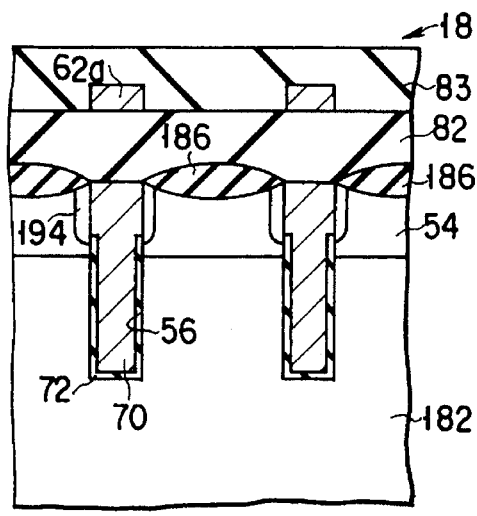

A NAND DRAM 180f of FIGS. 43, 44A and 44B is similar to that shown in FIGS. 35, 36A and 36B with (1) each of the bit lines 62 being replaced with a thinner bit line 62a, (2) the island layers 58 being removed, and (3) the transistor active region 74 of FIG. 36A being replaced by a side-wall type impurity-doped layer 194 around each trench 56. The layer 194 is the same in conductivity type as the layer 74 of FIG. 36A; that is, it is of n type. In each trench cell Ci, the side-wall active layer 194 has a layer portion extending in a vertical direction which is coupled to a corresponding storage-node layer 70 via a side-wall contact section 196 defined on the trench by partially removing the capacitor insulation film 72. The width of the narrowed bit line 62 is substantially the same as the length of one side of a square opening of the trench 56 as is clearly seen from FIG. 43.

With such an arrangement, a signal current flowing between adjacent cell transistors Qm1, Qm2 of the NAND cell array is forced to flow through the side-wall type impurity-doped layer 194 surrounding the upper portion of the trench capacitor C1 disposed therebetween. That is, the signal current penetrates a corresponding storage-node buried layer 70 along a direction parallel to the substrate surface by the presence of layer 194 used as the source/drain regions of adjacent transistors Qm1, Qm2 and is forced to flow straightly as shown by an arrow 194 in FIG. 44A. With such a "signal-transmission via storage-node" feature, the current flow path can be minimized to further reduce the source/drain resistance while maintaining the afore-mentioned advantages. This will greatly contribute to reduction in the resistance of the whole NAND cell array when the number of bits is increased.

Another advantage of the NAND DRAM 180f is that the parasitic capacitance of the bit line can be minimized since each bit line 62 is decreased in width so as to be aligned with the trench opening. Therefore, the noise margin can be increased. Further, as shown in FIG. 44B, the field insulation film 186 is increased in width so that the end portion thereof will be aligned with the opening end (or side-wall) of each trench, thereby removing the horizontally extending portion of the layer 194. In this case, connection between the adjacent cell transistors Qm1, Qm2 is attained by portions of the layer 194 disposed on the two opposite side walls of a trench 56 lying therebetween. With such an arrangement, the area of n-type layer 194 can be reduced so as to reduce the junction capacitance. The bit line width may be generally set in the same manner as in the case of FIG. 35; in such a case, the profile of each layer 194 in the cross sectional structure of FIG. 44B is the same as that of FIG. 44A.

Figure 45:
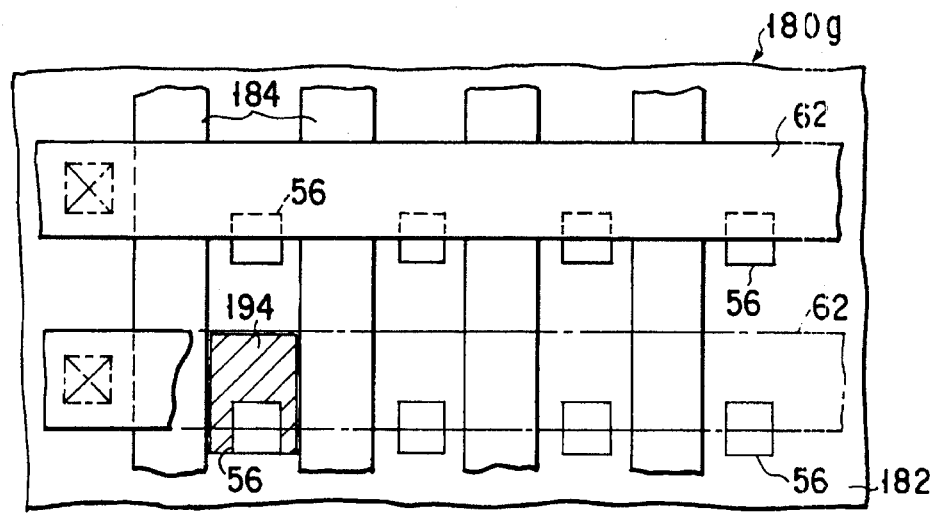
FIG. 45 is a partial plan view of a NAND DRAM which is an modification of the NAND DRAM of FIGS. 43, 44A and 44B.

A NAND DRAM 180g of FIG. 45 is similar to that shown in FIGS. 43 and 44A–44B with the bite lines 62a being replaced with the bit lines 62 of FIG. 35, the trenches 56 being positionally shifted by the distance Lt as in the embodiment of FIG. 40. With such an arrangement, the advantages explained in the embodiment of FIG. 40 can be attained while maintaining the advantages of the cross sectional structure of the trenches of FIGS. 44A and 44B.

Figure 46:
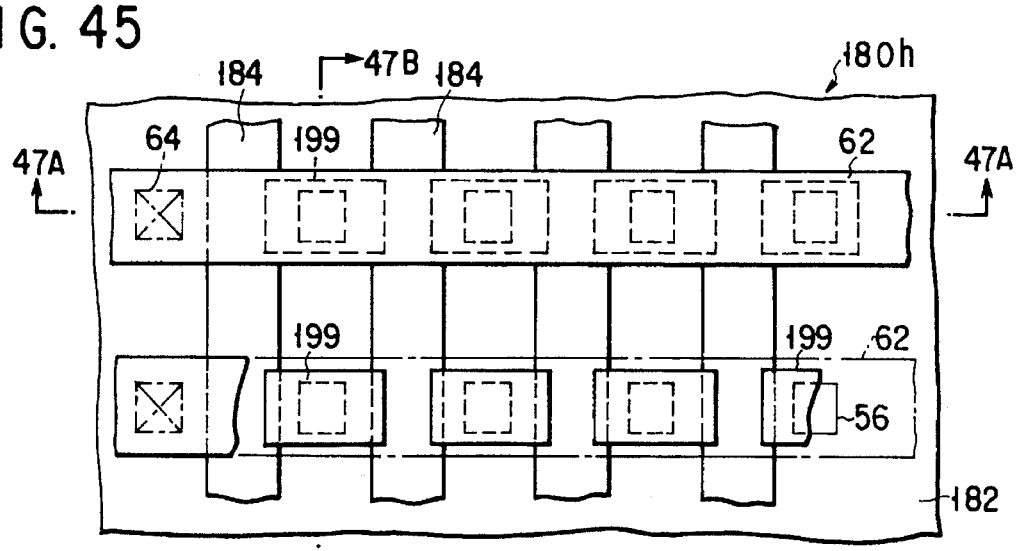
FIG. 46 is a partial plan view of a NAND-type DRAM device also embodying the invention.
Figure 47A:
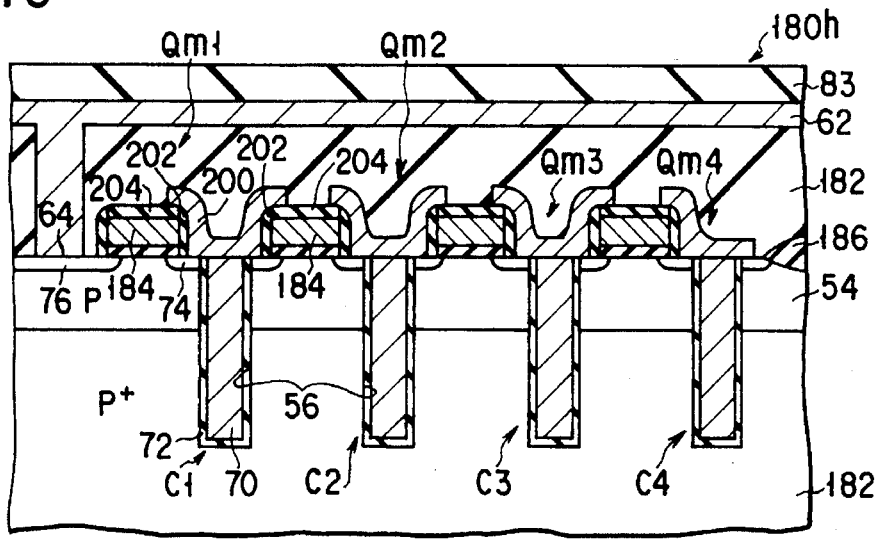
FIGS. 47A and 47B are two different cross-sectional views of the DRAM along lines 47A—47A and 47B—47B.
Figure 47B:
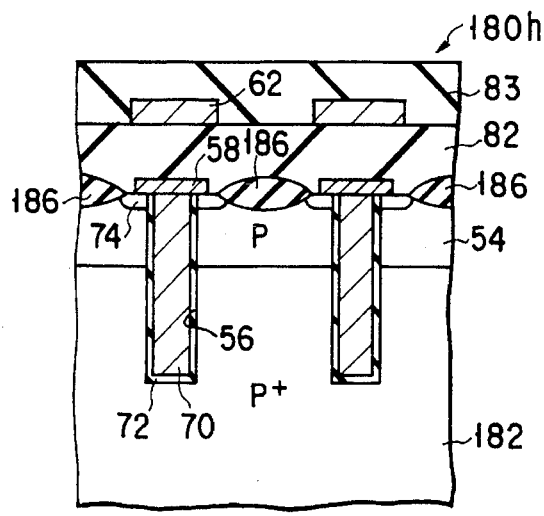

A NAND DRAM 180h shown in FIGS. 46, 47A and 47B is similar to that of FIGS. 35, and 36A and 36B with each of the island layers 58 between adjacent trenches 56 being replaced by a "U"-shaped polycrystalline layer 200 of the n-type conductivity, which overlies the neighboring gate electrodes 184 at its two edge portions. (The layer 200 has an "L"-shaped profile at the fourth NAND cell capacitor C4, since there is no adjacent gate electrode.) The "U"-shaped island 200 is electrically insulated from the gate electrodes 184 by dielectric films 202, 204 arranged on the side walls of gates 184 and the top surfaces thereof. Films 202, 204 may be made from trisilicon tetranitride. With such an arrangement, it is possible to decrease the distance between adjacent gate electrodes 184, causing the cell area to further decrease.

Figure 48A:
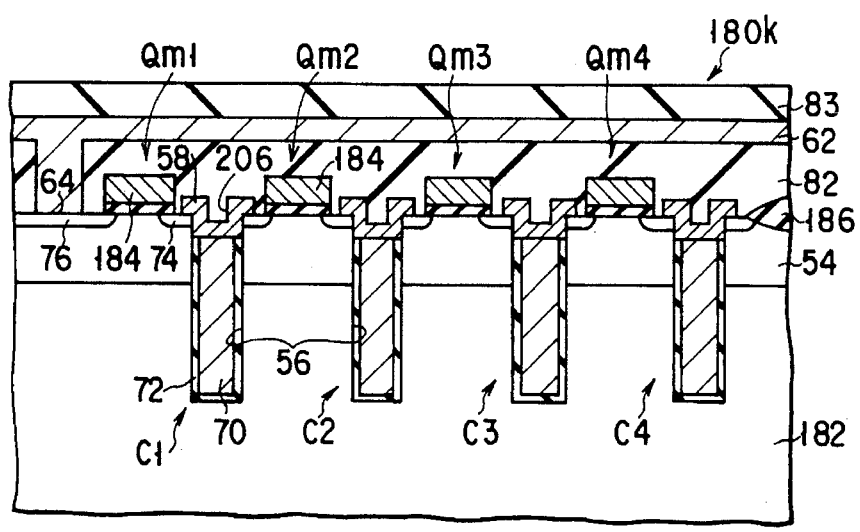
FIGS. 48A and 48B illustrate a modified NAND-cell cross-sectional structure of that of FIGS. 36A and 36B.
Figure 48B:
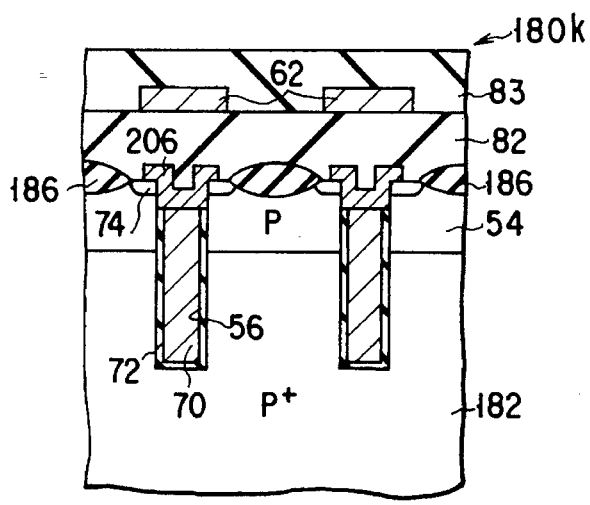

A NAND DRAM 180k of FIGS. 48A and 48B is similar to that of FIGS. 36A and 36B with the trench-buried storage-node layer 70 and the capacitor insulation layer 72 of each trench cell Ci being cut off at their upper portion, and the island layer 58 being modified in cross-section to have a concave portion 206 within a corresponding trench 56. With such an arrangement, the contact area between layer 58 and the transistor active region 74 can be increased to reduce the resistance of the trench cell capacitors C1–C4 and the transistors Qm1–Qm4 that are alternately series-connected to one another in a NAND cell section.

Figure 49:
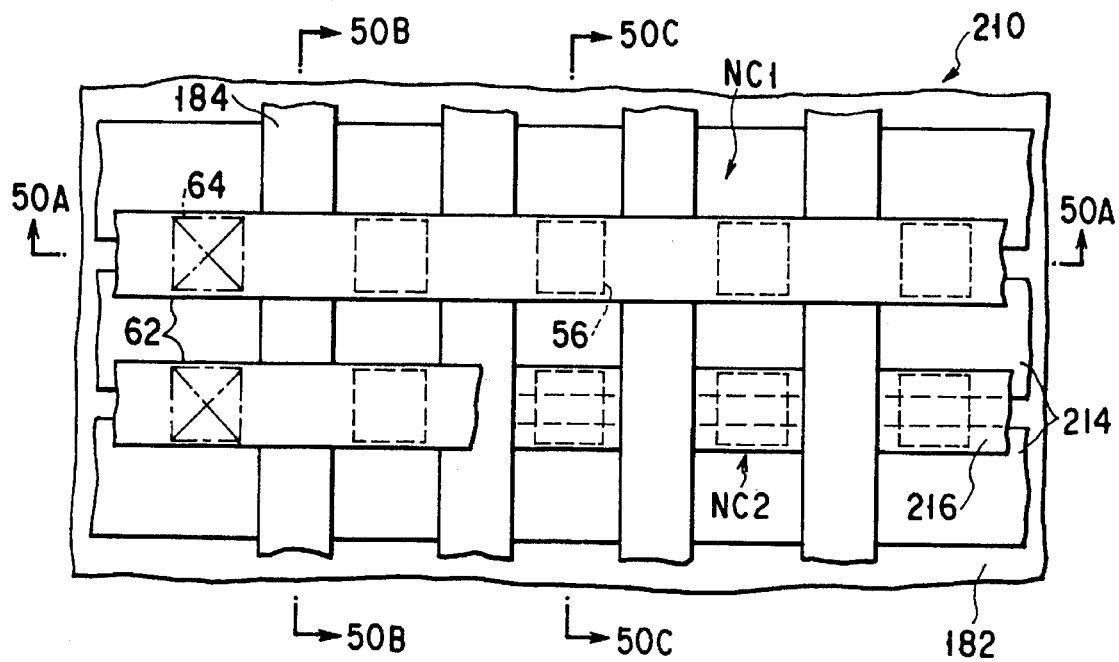
FIG. 49 is a plan view of the NAND DRAM embodying the invention.
Figure 50A:
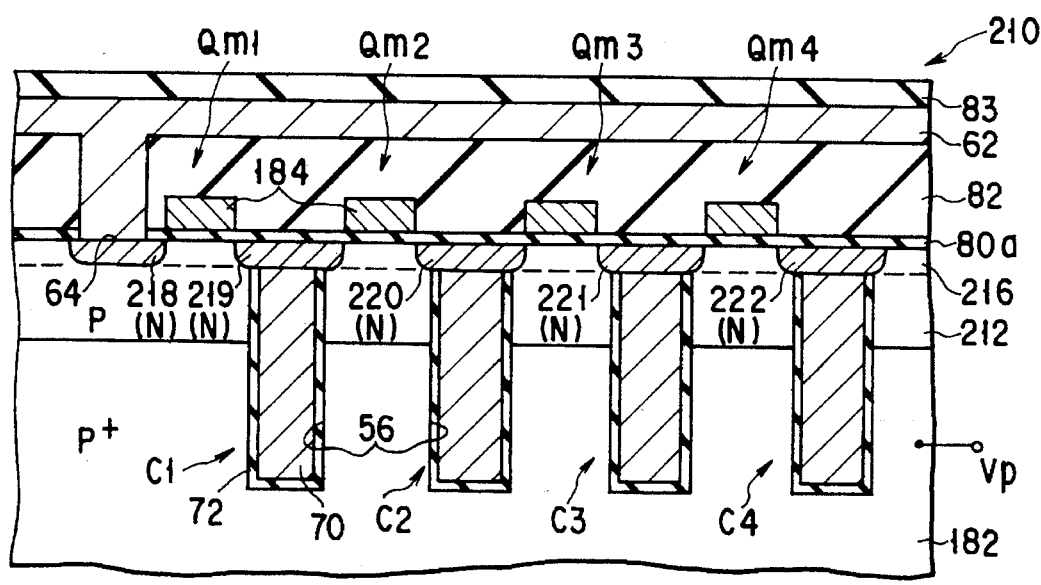
FIGS. 50A, 50B and 50C are three different cross-sectional views of the NAND DRAM of FIG. 49 along lines 50A—50A, 50B—50B and 50C—50C, respectively.

A trench-type NAND DRAM device 210 is shown in FIGS. 49 and 50A–50C. As shown in FIG. 50A, the NAND DRAM 210 has an epitaxial silicon layer 212 arranged in the surface of the silicon substrate 182 of heavily-doped p (p+) type conductivity. The trench-type memory cells each consisting of a transfer-gate transistor Qmi and trench capacitor Ci are arranged in epitaxial silicon layer 212 to constitute a NAND cell sections NC1, NC2.

As shown in FIG. 49, a plurality of parallel dielectric layers 214 are arranged on the epitaxial layer 212 so that element-formation areas are defined therebetween. The insulated gate electrodes 184 serving as the word lines extend transversely to the overlying bit lines 62 in substantially the same manner as in the embodiments as previously described. Each NAND cell section includes four memory cells, which underlie a corresponding bit line 62. Parallel insulated epitaxial layers 216 are arranged on epitaxial layer 212 to have a stripe shape so that these layers are substantially self-aligned with each bit line 62. In FIG. 49, to visually real the underlying insulated epitaxial layer 216 that overlaps bit line 62 in the self-align manner, the bit line 62 associated with the NAND cell section NC2 is partly cut off for purposes of illustration only. In each of epitaxial layers 216, the alternate array of transistors Qm1–Qm4 and trench capacitors C1–C4 of the memory cells of a corresponding NAND cell section is formed together with its bit-line contact section 64.

Figure 50B:
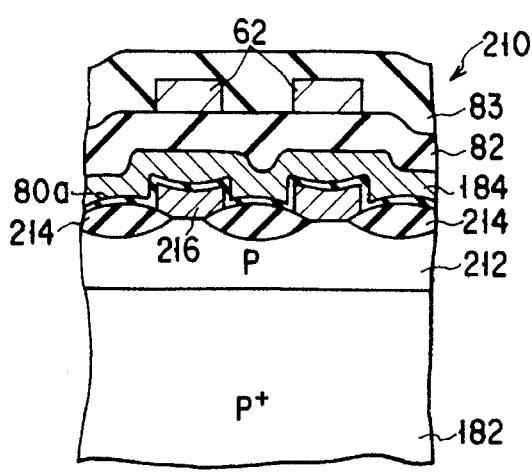
Figure 50C:
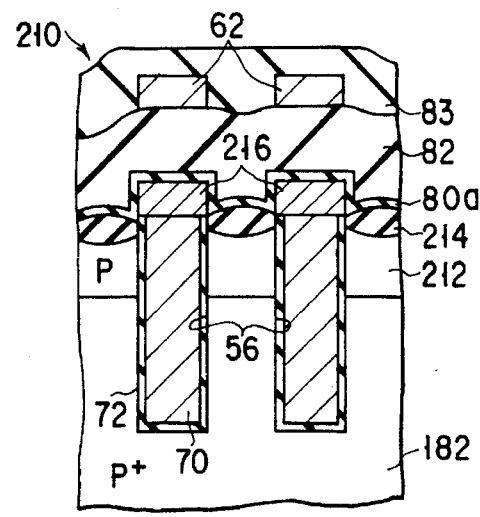

As shown in FIG. 50A, the gate electrodes 184 are electrically insulated from the underlying epitaxial layer 216 by a gate insulation film 80a that is continuously formed on the substrate 182. Gate insulation film 80a covers the neighboring epitaxial layers 216 as shown in FIGS. 50B or 50C. Very importantly, n-type impurity diffusion layers 218, 219, 220, 221, 222, which act as the sources and drains of NAND-cell transistors Qm1–Qm4, are located on the trenches 56 respectively in epitaxial layer 216. These source/drain diffusions are substantially self-aligned with the insulated gates 184. These diffusions are same in thickness with one another; therefore, each of the diffusions is coupled to the insulated polycrystalline silicon storage-node layer 70 within a corresponding one of trenches 56. A part of epitaxial layer 216 between adjacent ones of diffusions functions as a channel region. The remaining structure of this embodiment is similar to the NAND DRAM 180 shown in FIGS. 35 and 36A–36B.

The significant features of the NAND DRAM 210 are as follows: the channel regions of the NAND-cell transistors Qm1–Qm4 are specifically arranged in the stripe-shaped epitaxial layer 216 formed on another epitaxial layer 212 on the substrate surface. Therefore, even when the trenches 56 may be unintentionally shifted or deviated in position during the patterning/position-alignment process in the manufacture of the NAND DRAM 210, it becomes possible to let the connection resistance between neighboring cell transistors remain constant. This can be said because, unlike the device 180 of FIGS. 35–36B, the planar positional deviations of each trench 56 with respect to the gate electrodes 184 will not lead to any variations in the area of the diffusion layer connecting the neighboring transistors Qm.

Furthermore, with the NAND DRAM 210, the source/drain diffusion layers 218–222 overlie the trenches 56 in the stripe-shaped epitaxial layer 216. Another saying of this is that each diffusion serves as both the polycrystalline silicon island-shaped diffusion layer 58 and the diffusion layer 74 surrounding it in the trench-type T-shaped storage-node structure of FIG. 36A. Even with such an arrangement, the top surface of stripe-shaped epitaxial layer 216 including diffusions 218–222 can be flat. The structural features can further improve the series-connecting characteristic among NAND-cell transistors Qm, increase the positioning density of them, and enhance the cut-off characteristic.

Figure 51A:
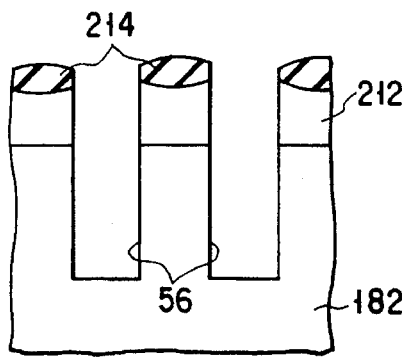
FIGS. 51A–51D illustrate, in schematic cross-section, some of major steps in the manufacturing process of the NAND DRAM of FIGS. 49–50C.

The manufacturing method of the NAND DRAM 180 is as follows. For purposes of explanation, the manufacturing method will be described on the basis of the sectional structure as shown in FIG. 50C. As shown in FIG. 51A, after the epitaxial layer 212 is formed by a well-known epitaxial crystal growth technique on the substrate 182 to the thickness of 1 micrometer, a field oxide film 214 is formed thereon. Trenches 56 are then formed. The formation of these trenches may be carried out by the lithography and RIE techniques in the same manner as in the process as has been described previously with reference to FIG. 37A. The depth of trenches 56 may be 5 micrometers.

Figure 51B:
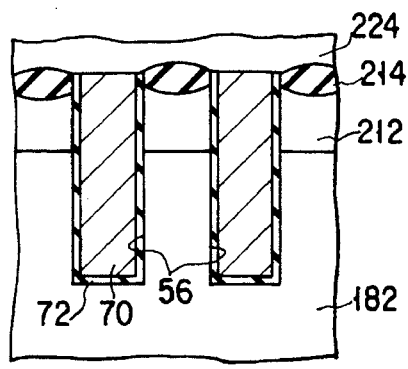
Figure 51C:
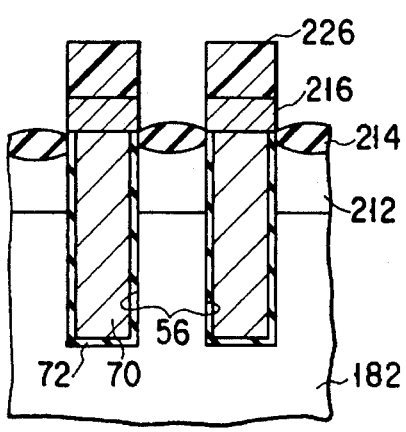
Figure 51D:
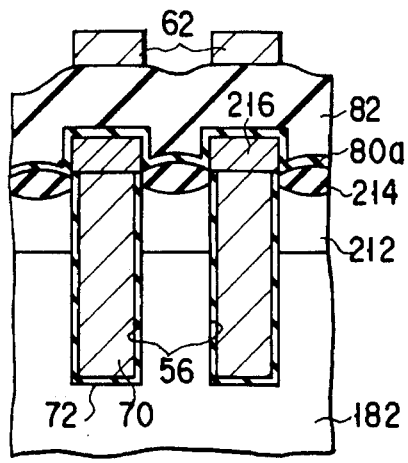

Subsequently, as shown in FIG. 51B, after the insulated storage-node layer 70 is formed and buried in each trench 56 in the same manner as has been explained above, an amorphous silicon layer 224 is deposited in the entire surface of a resultant structure. A thermal processing is performed so that a recrystallization takes place with the substrate surface (the surface of epitaxial layer 212) being as a crystal seed, thus forming an epitaxial layer. A patterned mask layer 226 is then formed on the recrystalized epitaxial layer. By using this mask layer, the lithography and RIE treatments are carried out to define the stripe-shaped epitaxial layers 216 on the substrate as shown in FIG. 51C.

After the mask layer 226 is removed away, a gate insulation film 80a is formed to cover the entire surface of a resulting structure. Parallel insulated gates 184 are then formed in gate insulation film 80a. With these gates being as a mask, an n-type impurity such as phosphorus (P) is selectively doped into the stripe-shaped epitaxial layers 216, thus forming the source/drain layers 219–222 of FIG. 50A. An insulative layer 82 is formed. Bit lines 62 are formed on layer 82. The manufacturing techniques of such layers are similar to those in the embodiments as described previously.

With the manufacturing method, the top surface of the substrate structure can remain flat at the time the insulated gates 184 are formed as word lines. This makes it possible to fabricate easily the stacked wiring layers including word lines 184 and bit lines 62, which will be formed in the following process steps, while having the reliability excellent.

A NAND DRAM device 210a shown in FIGS. 52 and 53A–53C is similar to that of FIGS. 49 and 50A–50C with (1) the dielectric element-separation layers 214 being replaced with parallel silicon oxide films 214a formed by a patterning technique on the top surface of the epitaxial layer 212 on substrate 182, and (2) each of the stripe-shaped epitaxial layers 216 of FIGS. 50B–50C being replaced with a selectively crystal-grown epitaxial layer 216a.

More specifically, after the insulated polycrystalline silicon storage-node layers 70 are buried within the trenches 56 in the substrate 182, the silicon oxide films 214a are deposited on the substrate in such a manner that these films are patterned to extend parallel with each other while a groove 230 is defined between adjacent ones of films 214a. The lithography technique may be employed to form grooves 230. The crystal growth is performed with several surface portions of the underlying epitaxial layer 212 exposed through grooves 230 being as a crystal seed, thus causing the stripe-shaped epitaxial silicon layers 216a to be selectively formed to bury grooves 216a thereunder. Layers 216a are covered by insulative thin-films 80b, respectively.

With such an arrangement, during the formation of trenches 56 and the burying of storage-node layers 70 therein, the top surface of the substrate can remain flat almost perfectly; therefore, the manufacturing process can become more simple. In addition, grooves 230 between the element-separation layers 214a can be decreased in width; it is thus possible to improve the integration density of memory cells while attaining an enhanced element-separation performance.

Figure 52:
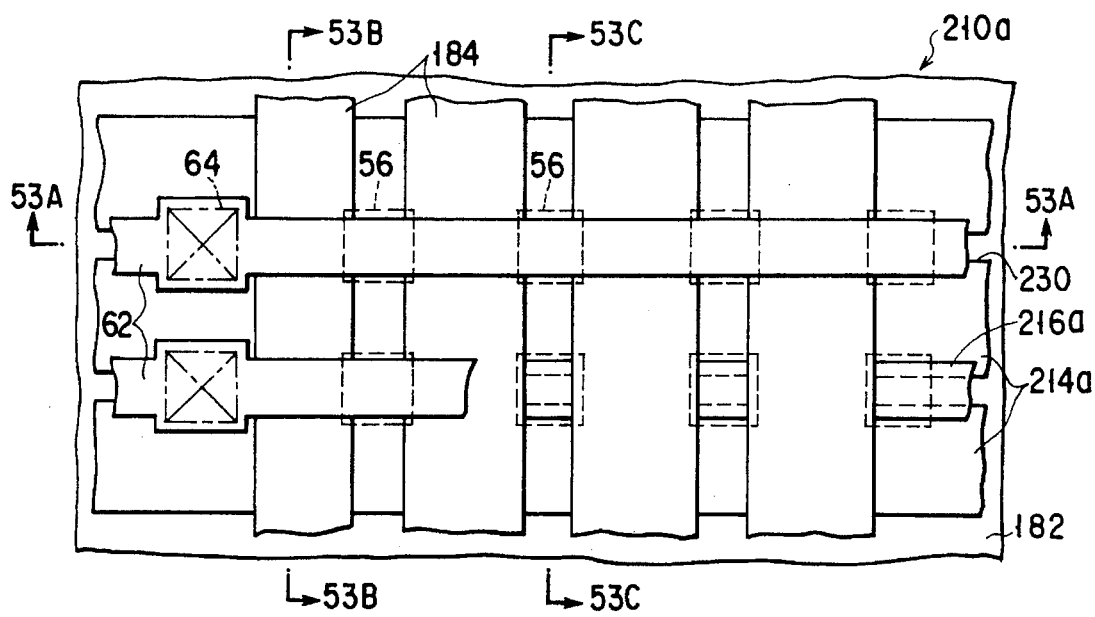
FIGS. 52, 54 and 56 are plan views of NAND DRAM devices in accordance with other embodiments of the invention.
Figure 53A:
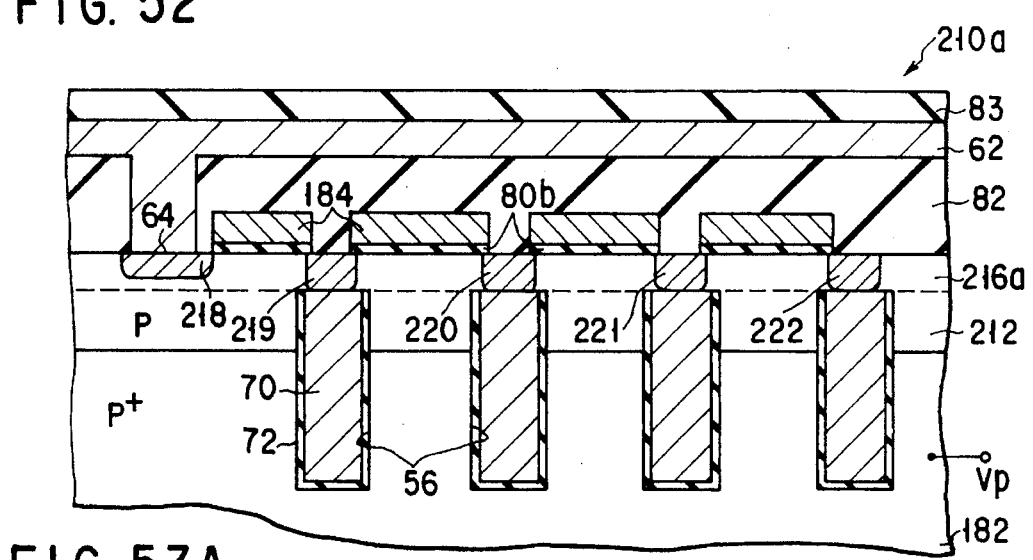
FIGS. 53A–53C, 55 and 57A–57C show the cross-sectional views of each of the embodiments of the preceding figures.
Figure 53B:
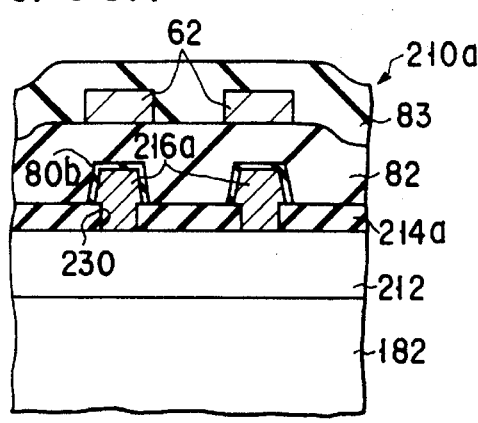
Figure 53C:
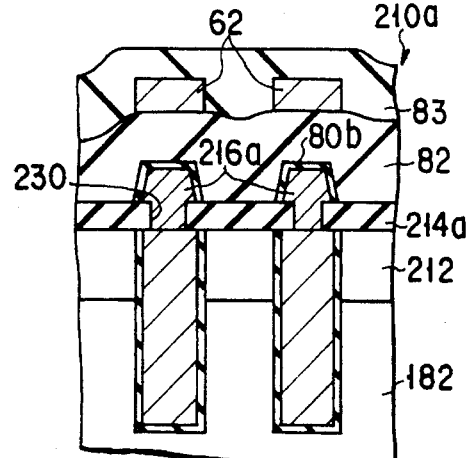
Figure 54:
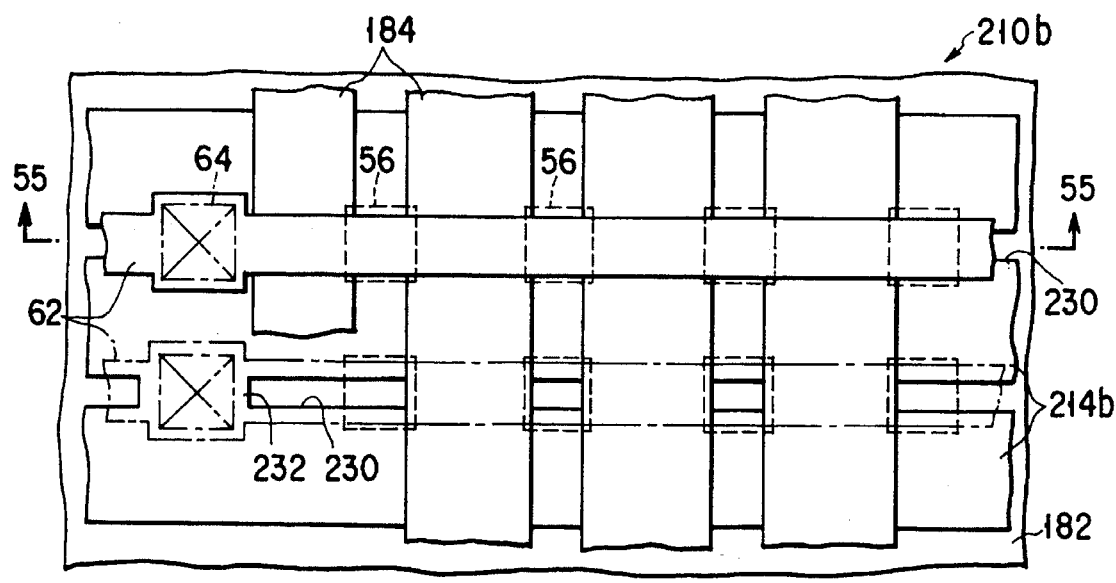
Figure 55:
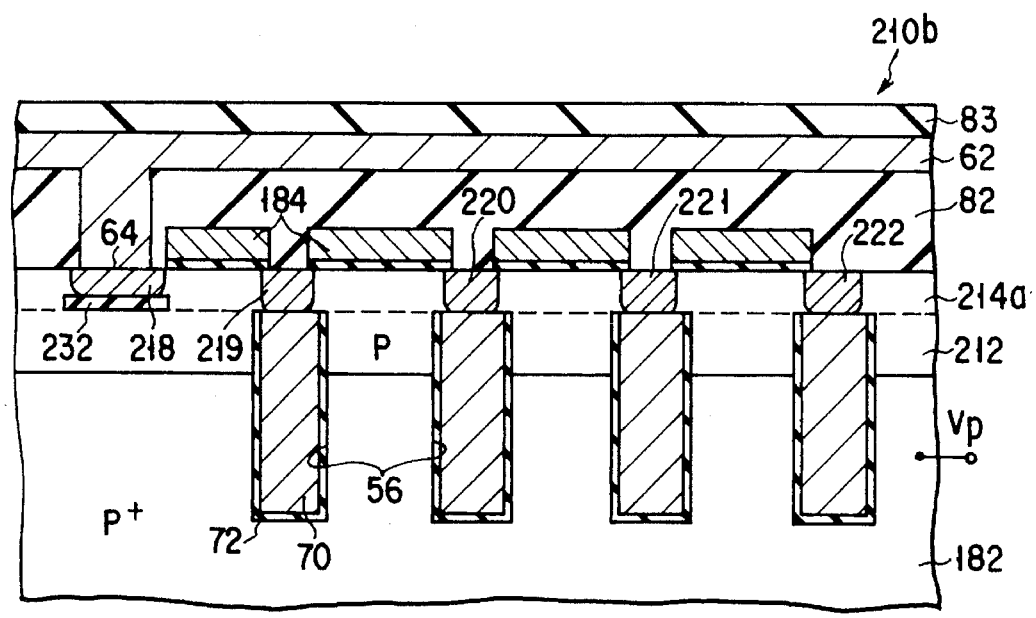
Figure 56:
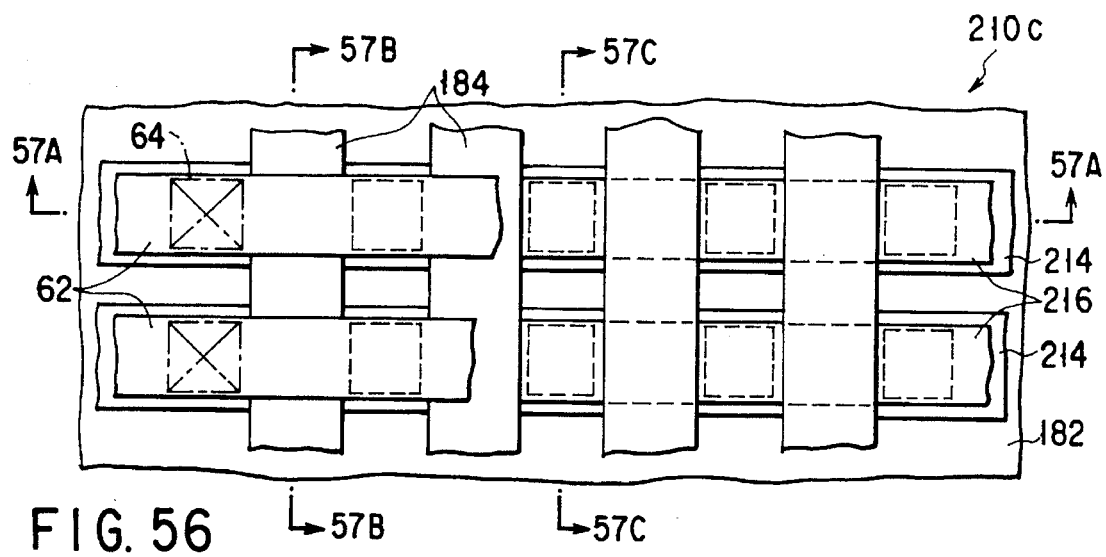

A NAND DRAM device 210b shown in FIGS. 54–55 is similar to that of FIGS. 52–53C with the separate element separation films 214a of FIG. 52 being slightly modified to have an extra film portion 232 at each bit-line contact section 64. This extra portion 232 is sandwiched between the bottom of the n-type impurity diffusion layer 218 and the epitaxial layer 212 at the bit-line contact section 64 as shown in FIG. 55. In other words, groove 230 between adjacent element-separation layers 214b is "closed" at each bit-line contact section 64. As the insulative layer portion 232 is present under diffusion 218 of contact section 64, the contact capacitance at contact sections 64 can be reduced significantly. This may improve the sense-sensitivity during data-read operations.

Figure 57A:
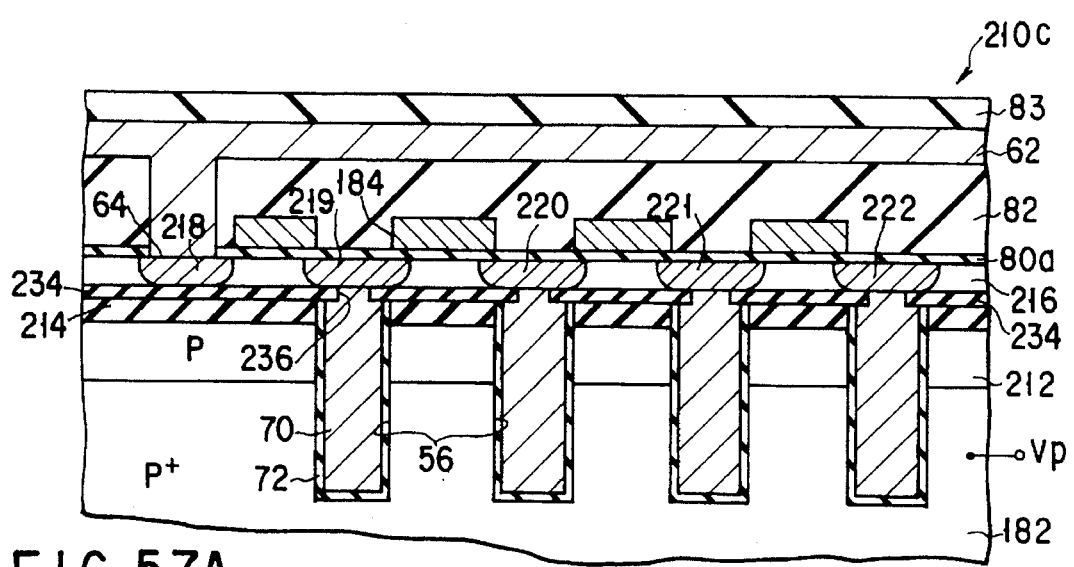
Figure 57B:
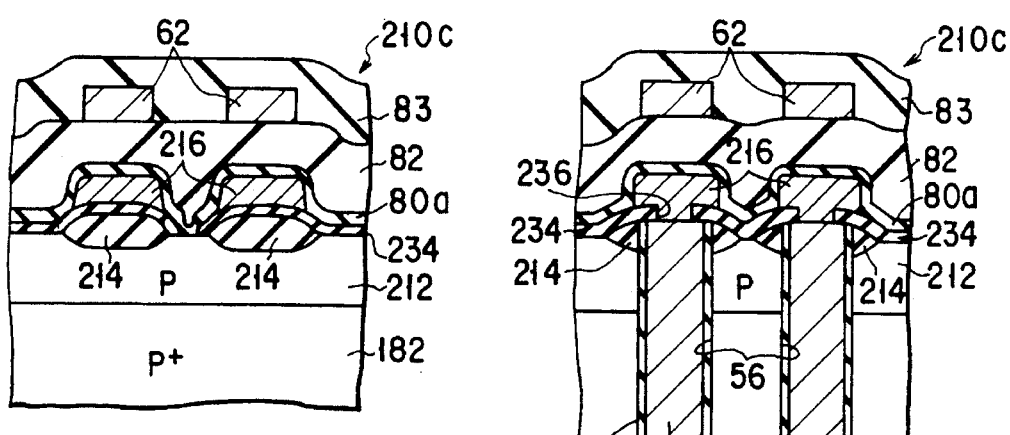
Figure 57C:
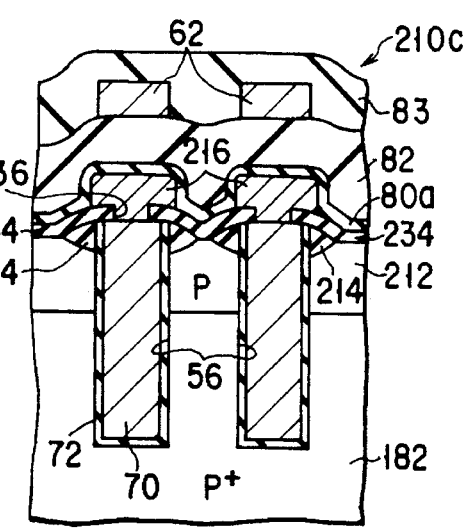

Another NAND DRAM device 210c is shown in FIGS. 56 and 57A–57C. The NAND DRAM 210c is similar to that of FIGS. 49–50c with a dielectric film 234 being added between the epitaxial layer 212 and the stripe-shaped epitaxial channel layers 216 containing the source and drain diffusions 218–222, thereby to provide a silicon-on-insulator (SOI) substrate structure. As is apparent from viewing FIG. 57B, the field oxide films 214 for the element separation underlie the epitaxial channel layers 216. The additional dielectric layer 234 may be made from silicon oxide. Dielectric layer 234 has an opening 236 on each trench 56 as shown in FIGS. 57A and 57C. Through this opening, a corresponding one of the source/drain diffusion layers 219–222 is coupled to the insulated storage-node layer 70.

With such an arrangement, the memory cells can be free from any potential variations at substrate 182; in other words, the cells can be insensible to what is called the "substrate biasing" effect. As a consequence, the transfer-gate transistors can be improved in the operation reliability, while letting the bit-line contact section 64 decrease in contact capacitance. The SOI structure may also be applied to the NAND DRAM 210a as described previously.

The present invention is not limited to the above-described specific embodiments and may be practiced or embodied in still other ways without departing from the spirit or essential character thereof.

What is claimed is:

1. A semiconductor memory cell comprising:

a semiconductor substrate having a trench formed therein;

a capacitor including an insulated layer buried in the trench as a storage node;

an island-shaped layer at least partially covering said storage node on said substrate, said island-shaped layer being coupled to said storage node;

a transistor having a source and a drain defining a channel region therebetween in said substrate, and an insulated gate overlying the channel region and extending over said island-shaped layer;

one of the source and the drain being positioned adjacent to said trench and coupled to said island-shaped layer and the other of said source and said drain having a conductive path to a corresponding data-transfer line;

a semiconductor well region arranged in said substrate to contain said source and said drain therein, said trench being greater in depth than said well region;

a dielectric layer surrounding said trench in said substrate, said dielectric layer being greater in depth than said well region and less in depth than said trench;

an impurity-doped layer in said channel region;

an additional island-shaped layer on said substrate, said additional island-shaped layer covering said other of said source and said drain and providing the conductive path by connecting to the corresponding data-transfer line;

wherein said gate insulatively overlies the island-shaped layers at its opposite edge portions; and wherein said substrate has a concave portion arranged at a surface section substantially corresponding to said channel region, said impurity-doped layer being formed at said concave portion.

2. A semiconductor memory device comprising:

a semiconductor substrate;

an array of memory cells subdivided into a plurality of cell sections on said substrate, each of said cell sections including a plurality of series connected memory cells connected to a corresponding bit line associated therewith, said series-connected memory cells each having trench capacitors and transfer-gate MOS transistors arrayed so that one of said capacitors and a corresponding one of said transistors constitute a memory cell;

each of said trench capacitors including an insulated storage-node layer in a trench in said substrate, and an island-shaped layer at least partially covering said storage-node layer on said substrate to be coupled to said storage-node layer;

each of said MOS transistors having a source and a drain defining therebetween a channel region in said substrate, and an insulated gate electrode at least partially overlying the channel region; and wherein each of said transfer-gate MOS transistors having one of its source and its drain having a first impurity-doped layer coupled to said island-shaped layer, wherein an adjacent transfer-gate MOS transistor of an adjacent memory cell in the same cell section having one of its source and its drain having a second impurity-doped layer coupled to said island-shaped layer, such that said island-shaped layer provides electrical continuity between said first impurity-doped layer of said transfer-gate MOS transistor and said second impurity-doped layer of said adjacent transfer-gate MOS transistor.

3. The device according to claim 2, further comprising:

an island-shaped layer on said substrate for each cell section overlying and coupled to one of said source and said drain of one of said MOS transistors, coupled to the corresponding bit line for providing a contact portion whereat said cell section is connected to the corresponding bit line.

4. The device according to claim 3, wherein said storage-node layer has a top surface that is entirely at a higher level than the entire surface of said substrate.

5. The device according to claim 3, wherein said storage-node layer has a top surface that is substantially same at level as a surface of said substrate.

6. The device according to claim 3, wherein said storage-node layer has a top surface that is lower at level than as a surface of said substrate, causing the overlying island-shaped layer to be partially buried within the trench.

7. The device according to claim 2, wherein said gate electrode has opposite edges overlying adjacent island-shaped layers of said series-connected memory cells.

8. The device according to claim 2, further comprising:

a well region arranged in said substrate to include said source and said drain of each of said transistors, said well region being different in conductivity type from said source and said drain, causing said substrate to act as a common plate electrode for said capacitors.

9. The device according to claim 8, further comprising:

a dielectric film surrounding an upper side-wall portion of said trench in said substrate, a height of said dielectric film being substantially the same as or greater than a thickness of said well region.

10. The device according to claim 9, further comprising:

an impurity-doped semiconductor layer in said channel region in said well region.

11. The device according to claim 3, wherein said storage-node layer, said island-shaped layer on this storage-node layer and said island-shaped layer at the contact portion are made from an impurity-doped semiconductor material.

12. A series-connected memory cell array for use in a dynamic random access memory device, said array comprising:

a substrate;

a well region in said substrate;

a plurality of memory cells on said substrate including transistors connected in series with one another, and trench-type capacitors each coupled to a corresponding one of said transistors to constitute a data storage cell, said transistors and said capacitors being positioned along a certain direction;

said transistors each having a source and a drain defining a channel region in said well region, and an insulated gate overlying the channel region;

said capacitors each having an impurity-doped semiconductor storage-node layer buried in a trench defined in said substrate to be greater in depth than said well region, causing said substrate to function as a common plate electrode; and a plurality of island-like layers arranged on said substrate to at least partially cover said storage-node layer at each of said capacitors in such a manner that adjacent ones of said transistors are electrically connected to each other by a corresponding one of said island-like layers.

13. The array according to claim 12, further comprising:

a bit line connected to said memory cells at a contact whereat one of the series-connected transistors is coupled to said bit line.

14. The array according to claim 13, further comprising:

an impurity-doped semiconductor layer in the channel region.

15. The array according to claim 14, further comprising:

a dielectric layer surrounding an upper portion of said trench of each capacitor in said substrate.

16. The array according to claim 15, further comprising:

an intermediate dielectric layer directly underlying the well region in the substrate.

17. The array according to claim 15, wherein said storage-node layer has a top surface that is entirely positioned at a level higher than a surface of said substrate.

18. The array according to claim 15, wherein said storage-node layer has a top surface that is substantially flush with a surface of said substrate.

19. The array according to claim 15, wherein said storage-node layer has a top surface that is positioned at a level lower than a surface of said substrate, causing the corresponding island-like layer to be partially buried within said trench.

20. The array according to claim 19, wherein said storage-node layer is contacted with the corresponding island-like layer both at said top surface and at an upper side wall portion of said trench, thus permitting carriers to flow across said trench between adjacent ones of said transistors.

21. The array according to claim 15, wherein said island-like layers are made from a semiconductor material being same in conductivity type as said source and said drain.

22. The array according to claim 21, wherein said semiconductor material includes polycrystalline silicon.

23. A semiconductor memory device comprising:

a semiconductor substrate;

an array of one-transistor memory cells subdivided into a plurality of cell sections on said substrate, each of said cell sections including a preselected number of series-connected memory cells connected to a corresponding bit line associated therewith, said series-connected memory cells each having trench capacitors and transfer-gate MOS transistors alternately arrayed so that one of said capacitors and a corresponding one of said transistors constitute a memory cell;

a semiconductor layer underlying the bit line on said substrate, said layer covering said trench capacitors;

each of said trench capacitors including an insulated storage-node layer in a trench in said substrate;

each of said MOS transistors having a source and a drain defining therebetween a channel region in said semiconductor layer, and an insulated gate overlying the channel region; and adjacent ones of said MOS transistors being coupled directly to each other at one of said source and said drain which is arranged on a corresponding one of said trench capacitors to be coupled to the storage-node layer therein;

wherein said semiconductor layer comprises an elongate epitaxial semiconductor layer on said substrate;

a dielectric layer sandwiched between said substrate and said semiconductor layer, said dielectric layer having an opening on each of said storage-node layers; and a field insulation film underlying said semiconductor layer.

24. The device according to claim 23, further comprising:

another epitaxial semiconductor layer on said substrate, said field insulation film being arranged on said another epitaxial layer.

* * * * *